United States Patent [19]
Aoyama et al.

[11] Patent Number: 5,592,024
[45] Date of Patent: Jan. 7, 1997

[54] SEMICONDUCTOR DEVICE HAVING A WIRING LAYER WITH A BARRIER LAYER

[75] Inventors: Hisako Aoyama, Kawasaki; Kyoichi Suguro, Yokohama; Hiromi Niiyama, Yokohama; Hitoshi Tamura, Yokohama; Hisataka Hayashi, Yokohama; Tomonori Aoyama; Gaku Minamihaba, both of Kawasaki; Tadashi Iijima, Yokohama, all of Japan

[73] Assignee: Kabushiki Kaisha Toshiba, Kawasaki, Japan

[21] Appl. No.: 330,998

[22] Filed: Oct. 28, 1994

[30] Foreign Application Priority Data

Oct. 29, 1993 [JP] Japan .................................. 5-272784
Mar. 15, 1994 [JP] Japan .................................. 6-070156
Sep. 19, 1994 [JP] Japan .................................. 6-249984

[51] Int. Cl.⁶ .................... H01L 23/535; H01L 29/41; H01L 29/43
[52] U.S. Cl. .................... 257/751; 257/752; 257/760; 257/763; 257/764; 257/762; 257/915
[58] Field of Search .................... 257/750–753, 257/759, 760, 762, 773, 763, 764, 915

[56] References Cited

U.S. PATENT DOCUMENTS

| 4,091,406 | 5/1978 | Lewis ........................... 257/760 |
| 4,789,648 | 12/1988 | Chow et al. .................. 437/225 |
| 5,300,813 | 4/1994 | Joshi et al. .................. 257/752 |

FOREIGN PATENT DOCUMENTS

| 0040745 | 12/1970 | Japan . |
| 0040515 | 10/1972 | Japan . |
| 0242331 | 10/1987 | Japan .................................. 257/760 |
| 0082653 | 3/1989 | Japan .................................. 257/760 |
| 2-78769 | 11/1990 | Japan .................................. 257/760 |
| 0270256 | 12/1991 | Japan .................................. 257/760 |
| 0343541 | 12/1993 | Japan .................................. 257/760 |

OTHER PUBLICATIONS

IBMTDB, Lithographic Patterns With a Barrier Liner, vol. 32, No. 103, Mar. 1990, pp. 114–115.
IBMTDB, Copper Multilevel Interconnections, vol. 33, No. 11, Apr. 1991, pp. 299–300.
IBMTDB, AG Metallurgy System for Integrated Circuit Devices vol. 13, No. 2, Jul. 1970, pp. 511–512.

Primary Examiner—Peter Toby Brown
Attorney, Agent, or Firm—Oblon, Spivak, McClelland, Maier & Neustadt, P.C.

[57] ABSTRACT

A semiconductor device comprises a semiconductor substrate in which a semiconductor element is formed, an interlayer insulating film formed on the semiconductor substrate, an insulating barrier layer, formed on the interlayer insulating film by plasma nitriding, for preventing diffusion of a metal constituting a wiring layer, a conductive barrier layer, formed on the insulating barrier layer, for preventing diffusion of the metal, and a wiring layer formed of the metal on the conductive barrier layer. A bottom portion of the wiring layer is protected by the conductive barrier layer and the insulating barrier layer. Therefore, the diffusion of the metal constituting the wiring layer can be surely prevented.

5 Claims, 35 Drawing Sheets

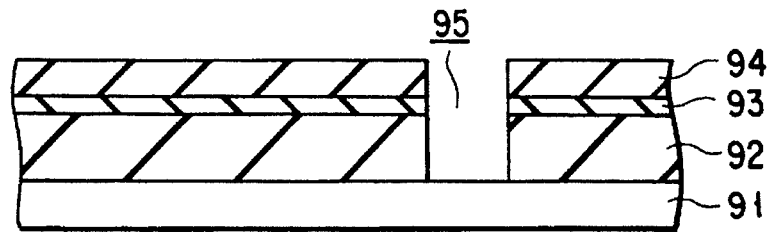
F I G. 23A
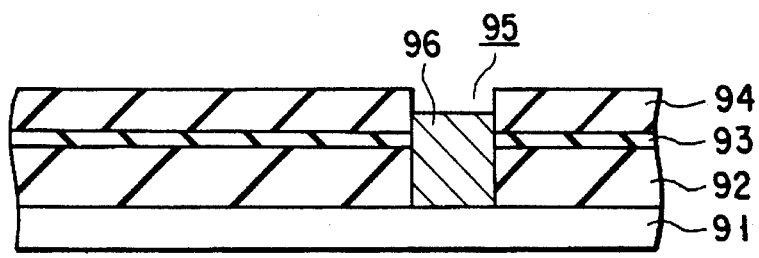
F I G. 23B
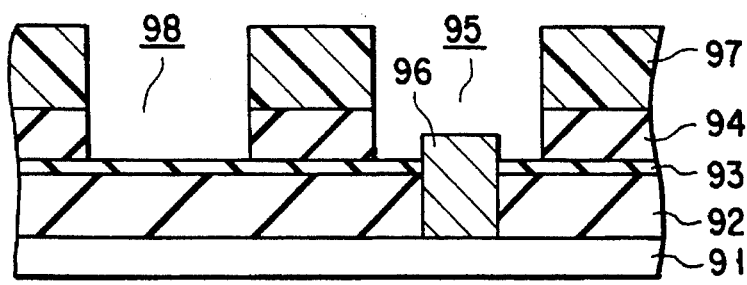
F I G. 23C
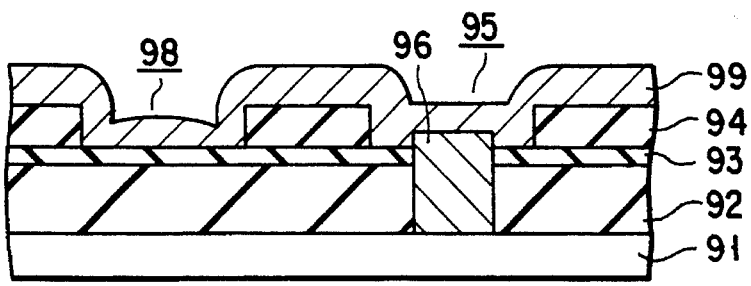
F I G. 23D
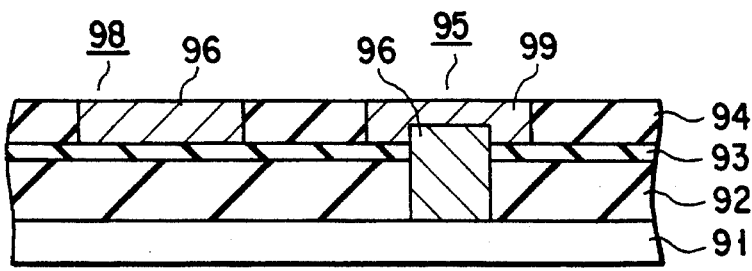
F I G. 23E

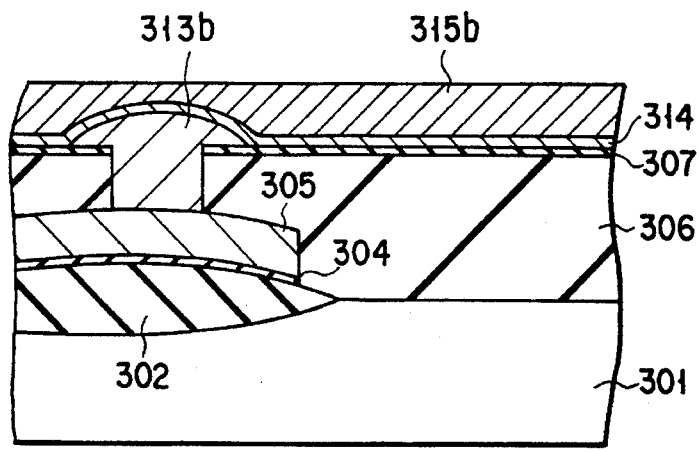
F I G. 28
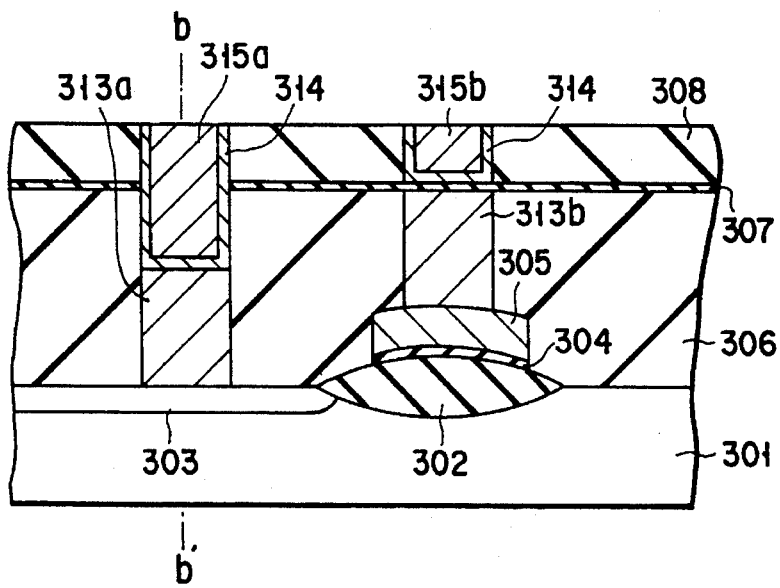
F I G. 29A
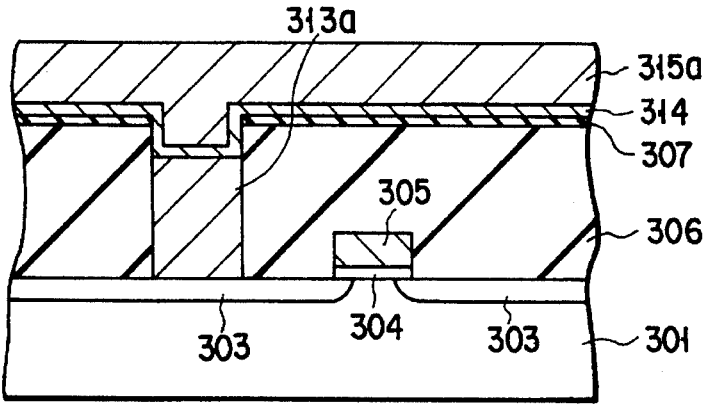
F I G. 29B

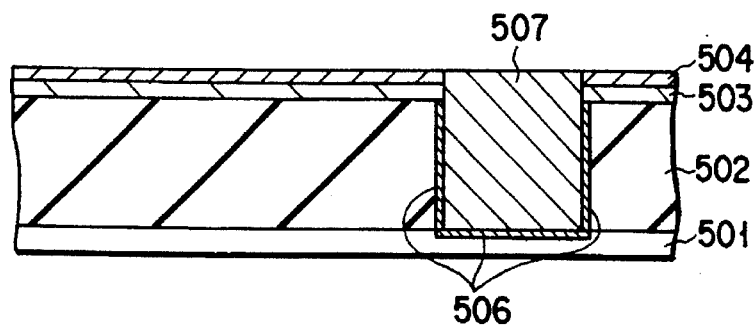
F I G. 31E
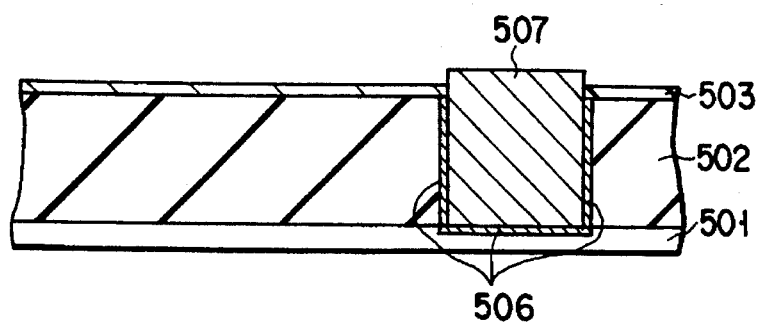
F I G. 31F
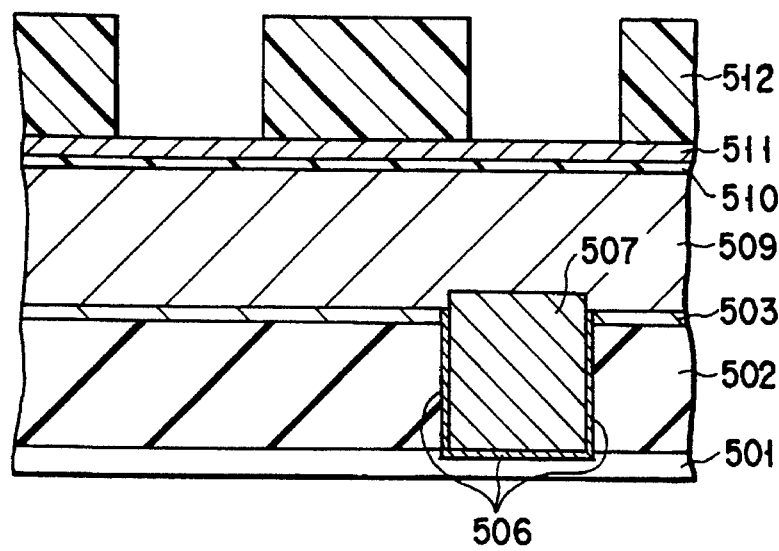
F I G. 31G

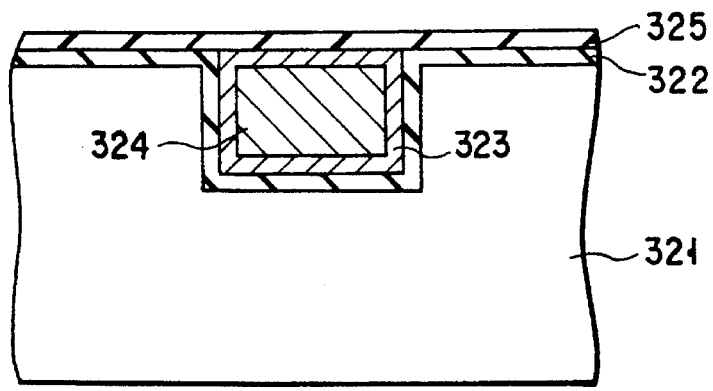
F I G. 30
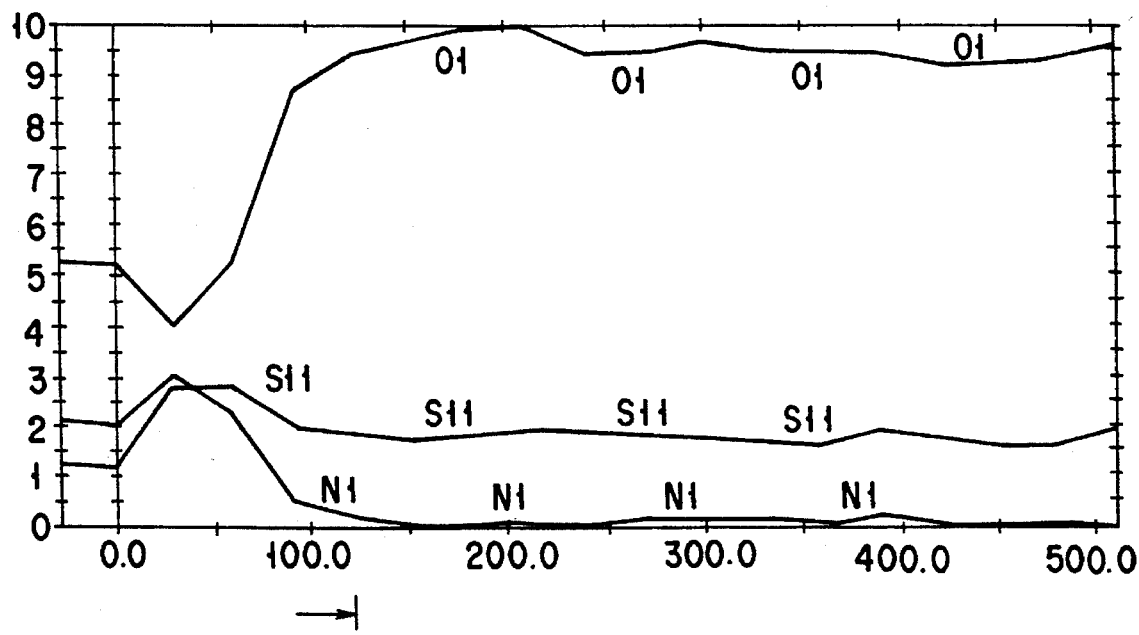
F I G. 32

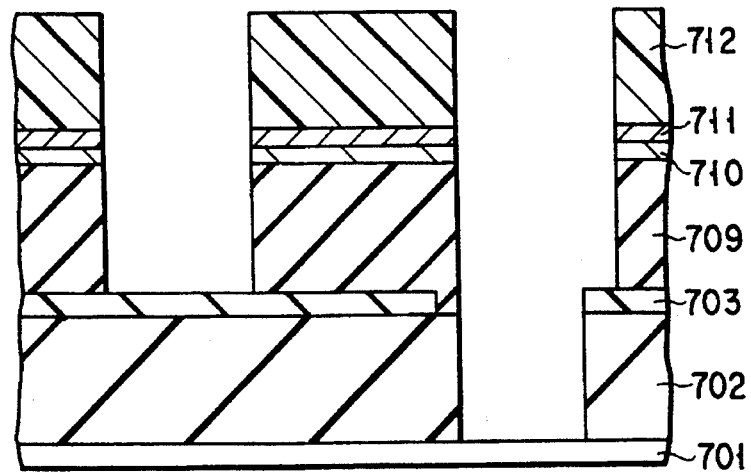
F I G. 34E
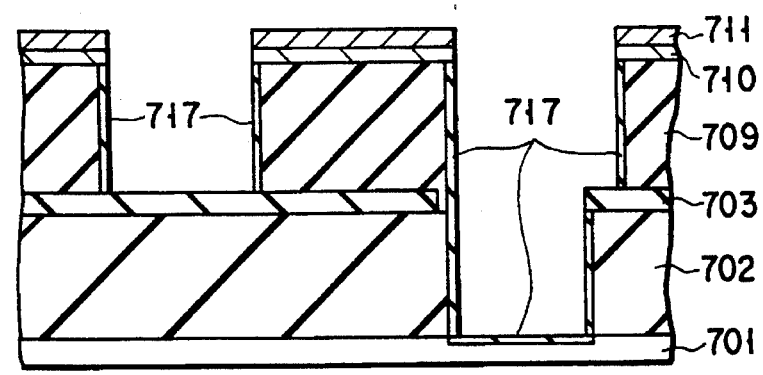
F I G. 34F

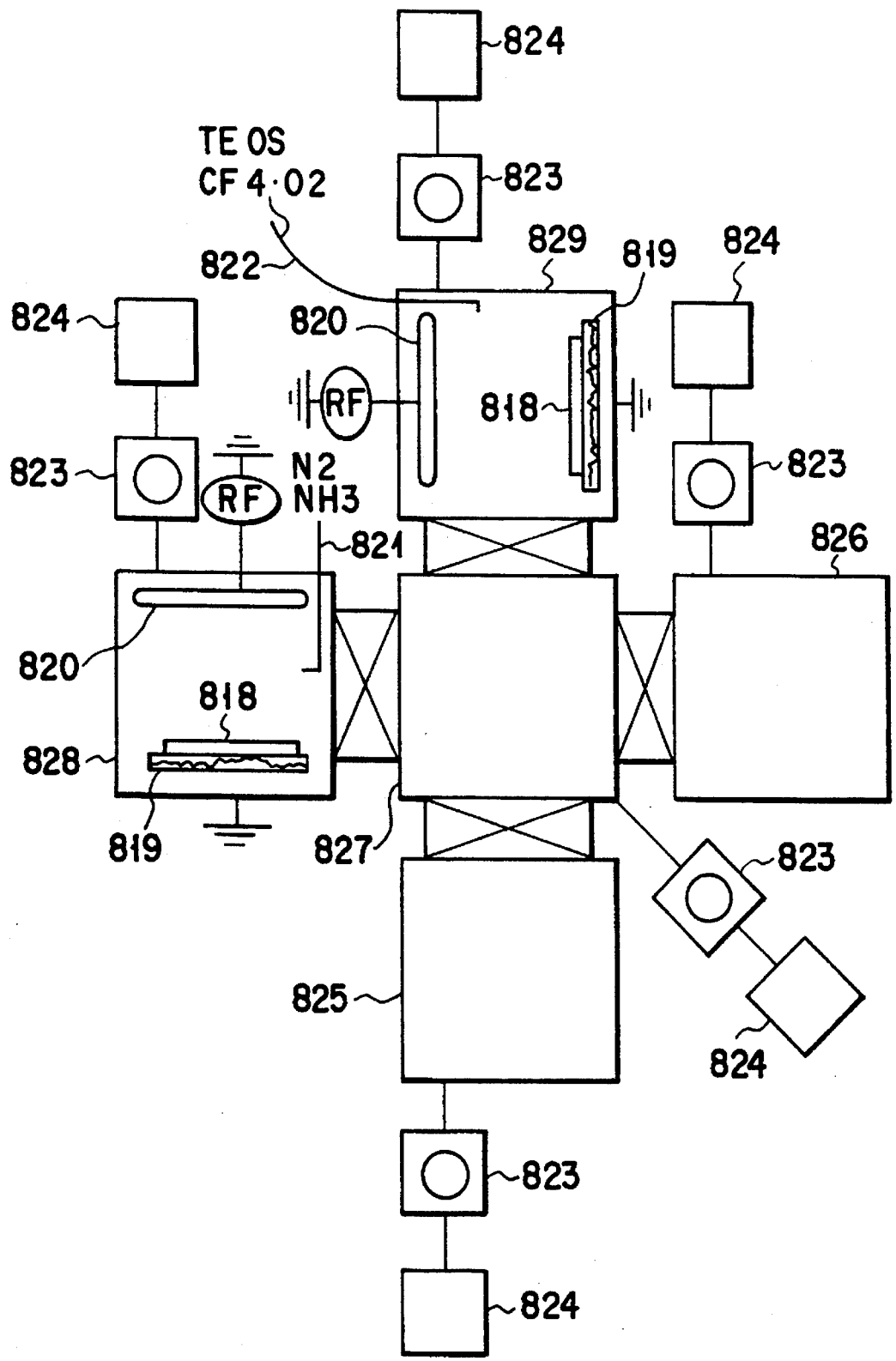
F I G. 35

स,592,024

1

SEMICONDUCTOR DEVICE HAVING A WIRING LAYER WITH A BARRIER LAYER

BACKGROUND OF THE INVENTION

1. Field of the Invention

The present invention relates to techniques of buried wiring in semiconductor technology.

2. Description of the Related Art

With higher operation speed and higher integration density, wiring has become thinner and more multilayered. Since thinning of wiring results in an increase in resistance and a decrease in reliability, it is required to use low-resistance, high-reliability wiring materials such as Au, Ag, and Cu.

Such materials, however, have problems with respect to adhesion to an interlayer insulating film, diffusion into the interlayer insulating film, oxidation and agglomeration, as compared to conventional Al-based materials.

In order to solve these problems, when this kind of material is used, the periphery of wiring is coated with a film of a material different from the material of the wiring. This kind of wiring is formed, for example, by a process illustrated in FIGS. 1A to 1D.

As is shown in FIG. 1A, at first, a semiconductor substrate 201, on the surface of which an interlayer insulating film 202 is formed, is prepared. A barrier metal layer 203, having effects in preventing diffusion of material wiring and enhancing adhesion, is formed on the interlayer insulating film 202 by means of vapor deposition or sputtering. A conductor 204, which will become wiring, is formed on the barrier metal layer 203. A barrier metal layer 205 having the same effects as the barrier metal layer 203 is formed on the conductor film 204. A resist is coated on the barrier metal layer 205, exposed, and developed, thereby forming a resist pattern 206 for forming wiring.

Then, as shown in FIG. 1B, with the resist pattern 206 used as a mask, the barrier metal layer 205, conductor film 204 and barrier metal layer 203 are etched in a shape of wiring.

Subsequently, as shown in FIG. 1C, a barrier metal layer 207, which is different from the wiring 204 and has the same effects as the barrier metal layer 203, is formed on the entire resultant structure, thereby covering side walls of the wiring portion.

Lastly, as shown in FIG. 1D, the barrier metal layer 207 is anisotropically etched, thereby selectively leaving the barrier metal layer 207 on the side walls of the wiring portion.

According to this process, since the wiring structure wherein the outer surfaces of the conductor film 204 or wiring body is coated with barrier metal layers 203, 205 and 207 is obtained, oxidation and diffusion of the wiring material can be prevented.

This process, however, has the following problems: the number of steps is large, and the insulating film provided on the wiring must be flattened, and thus this process is not suitable for multilayer structure.

If the wiring portion obtained in the step shown in FIG. 1B is formed in a tapered shape, the barrier metal layer 207 may not be formed on the side walls of the wiring portion, as shown in FIG. 2A, or the conductor film 207 on the side walls of the wiring portion may be etched at the time of the anisotropic etching, as shown in FIG. 2B, and, as a result, the side walls of the wiring portion are not coated with the barrier metal layer 207. Thus, the oxidation and diffusion of the wiring material cannot be prevented.

FIGS. 3A and 3B are cross-sectional views showing steps of another conventional wiring forming process.

At first, as shown in FIG. 3A, wiring 208 made of an alloy of a wiring material and a material tending to be oxidized or nitrided more easily than the wiring material is formed on a semiconductor substrate 201 on which an interlayer insulating film 202 is provided.

Then, the structure shown in FIG. 3A is annealed in an atmosphere including a slight quantity of oxygen or nitrogen. As a result, as shown in FIG. 3B, the above-mentioned material tending to be oxidized or nitrided more easily is diffused to the surfaces of the wiring 208, and an oxide film or a nitride film 209 is formed on the entire periphery of the wiring 208. Since the oxide film or nitride film 209 is formed, the impurity concentration in the wiring 208 decreases and the interior of the wiring 208 has properties similar to a pure metal.

This process, however, has the following problems. High-temperature heat treatment is required to form the oxide film or nitride film 209. Because of this, transistor characteristics are adversely effected. For example, the depth of a junction increases. Moreover, since an intergranular diffusion is dominant with respect to the diffusion, it is difficult to coat the wiring 208 uniformly with the oxide film or nitride film 209. These problems lead to degradation in reliability.

FIGS. 4A to 4D are cross-sectional views showing steps of another conventional wiring forming process.

As is shown in FIG. 4A, an interlayer insulating film 202 having a wiring groove in a surface portion thereof is formed on a semiconductor substrate 201.

A diffusion prevention layer 210 is formed on the entire structure, as shown in FIG. 4B, thereby to prevent a wiring material from diffusing into the interlayer insulating film 202. Subsequently, a conductor layer 211 which will become a buried wiring portion is formed on the entire structure. The material of the diffusion prevention film 210 is, for example, a material tending to be oxidized or nitrided more easily than the wiring material.

Then, as shown in FIG. 4C, the entire surface of the resultant structure is etched so as to leave the conductor film 211 only in the wiring groove, thus forming the buried wiring portion 211.

Lastly, as shown in FIG. 4D, the resultant structure is annealed in an atmosphere including a slight amount of oxygen or nitrogen, and diffusion is effected in a region from the diffusion prevention film 210 up to the surface of the buried wiring portion 211. Thus, an oxide film or nitride film 212 is formed in a surface portion of the buried wiring 211.

According to this method, since the surface of the wiring 211 can be coated with the oxide film or nitride film 212 in a self-alignment manner, the number of steps is not increased.

However, since the intergranular diffusion is dominant with respect to the diffusion, the oxide film or nitride film 212 is not formed uniformly although the conductor film 211 is not alloyed. Therefore, there is a problem in reliability.

In addition, like the process illustrated in FIGS. 3A and 3B, high-temperature heat treatment is required to form the oxide film or nitride film 212. The high-temperature heat treatment adversely affects transistor characteristics and requires completeness of the diffusion prevention film 210.

Furthermore, since the width of the wiring 211 is decreased by the degree corresponding to the presence of the diffusion prevention film 210, the wiring resistance increases. If the width of the wiring groove is enlarged, the problem of wiring resistance does not occur. However, because of the increase in width of the wiring groove, the wiring cannot be thinned effectively.

FIGS. 5A to 5D are cross-sectional views showing steps of a process for forming a through-hole in buried wiring. A wiring groove and a through-hole are formed in this order. In this invention, "through-hole" refers to a via hole for connection between wiring layers or a contact hole for connection between a wiring layer and a semiconductor substrate.

At first, as shown in FIG. 5A, a first interlayer insulating film 221 and a second interlayer insulating film 222 are formed on the semiconductor substrate 220 in this order. Then, a wiring groove 223 is formed in the second interlayer insulating film 222.

Subsequently, as shown in FIG. 5B, a resist pattern 224 for forming the through-hole is provided. In this case, the resist pattern 224 is displaced to the right owing to misalignment.

With the resist pattern 224 used as a mask, the first interlayer insulating film 221 is etched to form a through-hole 225, as shown in FIG. 5C.

Since the resist pattern 224 is displaced a predetermined portion of the first interlayer insulating film 221 remains unetched while a non-predetermined portion of the second interlayer insulating film 222 is etched.

Thus, as shown in FIG. 5D, a contact area of the through-hole 225 decreases by a degree corresponding to displacement of the resist pattern 224, and the width of the wiring groove 223 increases at the through-hole 225.

The decrease in contact area of the through-hole 225 leads to an increase in contact resistance and a degradation in shape of a contact electrode at the through-hole, resulting in degradation in reliability. On the other hand, the increase in width of the wiring prevents an increase in integration density.

FIGS. 6A to 6D are cross-sectional views showing steps of another process for forming a through-hole in buried wiring. In this process, a through-hole is formed prior to a wiring groove.

At first, as shown in FIG. 6A, a first interlayer insulating film 221 and a second interlayer insulating layer 222 are formed in this order on a semiconductor substrate 220, and that portion of the second interlayer insulating film 222, where the through-hole will be formed, is etched.

A resist pattern 226 for forming a wiring groove is provided on the entire structure, as shown in FIG. 6B. In this case, the resist pattern 226 is displaced to the right owing to misalignment.

With the resist pattern 226 used as a mask, the first and second interlayer insulating films 221 and 222 are etched. Thereby, a wiring groove 223 and a through-hole 225 are simultaneously formed.

Since the resist pattern 226 is displaced, that portion of the first interlayer insulating film 221, at which the through-hole should be formed, is not etched.

Like the preceding process, the contact area of the through-hole 225 decreases, as shown in FIG. 6D, and the width of the wiring groove 223 increases at the through-hole 225. Consequently, the same problem as mentioned above occurs.

FIGS. 7A to 7F are cross-sectional views showing steps of a conventional wiring forming process in the case where an underlayer includes a stepped portion.

At first, as is shown in FIG. 7A, a field oxide film 402 is formed on a semiconductor substrate 401. Then, a gate oxide film 404, a gate electrode 405 and a diffusion layer 403 are formed. Thereafter, an interlayer insulating film 406 is formed on the entire structure.

By means of a CMP method or an etch-back method, the surface of the interlayer insulating film 406 is flattened.

Subsequently, as shown in FIG. 7C, through-holes 407a and 407b are formed by means of photolithography. In this case, the depth of the through-hole 407b formed in the region of the gate electrode 405 is less than the through-hole 407a formed in the region of the diffusion layer 403 by a degree corresponding to the total thickness of the field oxide film 402, gate oxide film 404 and gate electrode 405.

In the next step shown in FIG. 7D, contact layers 408a and 408b made of a metal such as W are selectively formed in the through-holes by means of selective CVD method so that the deeper through-hole may be filled with the contact layer 408a. In this case, the contact layer 408b formed in the shallower through-hole is overfilled from the through-hole.

The contact layer 408b overfilled from the through-hole is etched away, as shown in FIG. 7E, thereby flattening the contact layer 408b.

Lastly, as shown in FIG. 7F, wirings 409a and 409b are formed on the contact layers 408a and 408b.

This wiring forming process, however, as the problem.

Since the contact layers buried in the through-holes differ in thickness, the contact layers in the through-holes differ in resistance and reliability. Moreover, a stepped portion is created by the wirings 409a and 409b and the flatness of the surface is not obtained.

If the contact layers 408a and 408b are formed so that the shallower through-hole may be filled with the contact layer 408b, as shown in FIG. 8A, a stepped portion is created in the deeper through-hole. If wiring is formed in this state, unevenness appears in the surface of the wiring formed in the deeper through-hole, as shown in FIG. 8B.

Whether the contact layers are formed so that the deeper through-hole may be filled or the shallower through-hole may be filled, surface unevenness occurs and it becomes difficult to flatten an interlayer insulating film to be formed in a later step.

FIGS. 9A to 9D are cross-sectional views showing steps of another conventional wiring forming process in the case where an underlayer includes a stepped portion.

At first, as is shown in FIG. 9A, a field oxide film 402 is formed on a semiconductor substrate 401. Then, a diffusion layer 403, a gate oxide film 404, a gate electrode 405 and an interlayer insulating film 406 are formed.

In the next step shown in FIG. 9B, through-holes 407a and 407b are formed on the diffusion layer 403 and gate electrode 405. In this case, since the interlayer insulating film 406 is not flattened, the two through-holes 407a and 407b are equal in size.

As is shown in FIG. 9C, a metal is selectively deposited in the through-holes, for example, by selective CVD, thereby forming contact layers 408a and 408b.

Wiring portions 409a and 409b are formed on the contact layers 408a and 408b, as shown in FIG. 9D.

According to this process, since the through-holes 407a and 407b are equal in depth, the contact layers in the through-holes are equal in resistance and reliability at any portions.

However, since the interlayer insulating film 406 is not flattened, a focus error, etc. occurs at the time of forming a resist pattern for forming the wiring portions 409a and 409b. It is thus difficult to form wirings 409a and 409b of desired dimensions.

Furthermore, since the wiring portions 409a and 409b are formed on the non-flat interlayer insulating film 406, it becomes more difficult to flatten an interlayer insulating film to be formed in a later step.

In the meantime, in order to reduce a parasitic capacitance due to an interlayer insulating film, it is conventionally adopted to dope the interlayer insulating film with a dopant such as fluorine.

Such an interlayer insulating film, however, has the problems: high water absorption properties, a film quality tending to deteriorate easily, and a tendency of outward diffusion of a dopant in the interlayer insulating film.

To solve these problems, it is necessary to coat the entire periphery of this kind of interlayer insulating film with a film of a material different from the material of the interlayer insulating film. Such an interlayer insulating film can be formed by the following process.

At first, as shown in FIG. 10A, a first non-doped interlayer insulating film 412 is deposited on a semiconductor substrate 411, and a doping interlayer insulating film 413 of a low dielectric constant, in which fluorine is doped, is deposited on the first non-doped interlayer insulating film 412. Subsequently, a second non-doped interlayer insulating film 414 is deposited on the doping interlayer insulating film 413.

According to the thus obtained interlayer insulating film of the sandwich structure, water absorption and outward diffusion of fluorine in the doping interlayer insulating film 413 can be prevented by the first and second non-doped interlayer insulating films 412 and 414.

The interlayer insulating film of the sandwich structure, however, has the following problems.

Even if the doping interlayer insulating film 413 of a low dielectric constant is formed, the film 413 is sandwiched by the non-doped interlayer insulating films 412 and 414 of relatively high dielectric constants. Thus, the capacitance of the entire insulating films is relatively large, which influences the operation speed of the device.

As is shown in FIG. 10B, if a through-hole is formed in the interlayer insulating films, the side surfaces of the doping interlayer insulating film 413 are exposed. In particular, water is absorbed from the exposed side surfaces and the reliability is degraded. In order to solve these problems, it may be considered to evaporate water by annealing. In this case, however, the number of steps increases.

As described above, when a low-resistance, high-reliability wiring material such as Au, Ag or Cu is used, the entire periphery of the wiring needs to be coated with a film of a material different from the material of the wiring, thereby to prevent diffusion into the interlayer insulating film and oxidation.

In order to form a wiring structure wherein a wiring portion is coated with a film of a material different from the material of the wiring, there have been proposed a method in which the top and bottom of wiring are sandwiched by films of a material different from the wiring material and then films of the different material is left on the side walls of the wiring, and a method in which diffusion from a film of a different material to the surface of the wiring is utilized.

In the case of the former, however, the number of steps increases, the wiring may not be coated in a predetermined manner, or a multilayer structure is not advantageously obtained, resulting in low reliability.

On the other hand, in the case of the latter, since the wiring can be coated in a self-alignment manner, the number of steps does not increase. However, high-temperature heat treatment is required for diffusion. The high-temperature heat treatment adversely affects transistor characteristics and degrades the reliability.

The conventional process of forming the through-hole in the buried wiring has the following problem: since the misalignment of the resist pattern for forming the wiring groove and through-hole cannot be corrected completely, the contact area of the through-hole decreases, resulting in an increase in contact resistance, degradation in shape of a contact electrode, and degradation in reliability.

In the case where the underlayer has a stepped portion, as mentioned above, the interlayer insulating film with a stepped portion on its surface is formed.

If the interlayer insulating film is flattened and contact holes are formed on regions at different levels, the through-holes differ in depth from each other. It is thus difficult to form a good contact layer.

On the other hand, if through-holes are formed without flattening the interlayer insulating film, the through-holes are equal in depth. However, the flatness of the interlayer insulating film is not good, it becomes very difficult to flatten another interlayer insulating film formed in a later step.

Besides, as described above, a dopant such as fluorine is conventionally doped in the interlayer insulating film in order to reduce a parasitic capacitance of the interlayer insulating film. This kind of doping interlayer insulating film, however, tends to absorb water easily. To solve this problem, the top and bottom of the doping interlayer insulating film are sandwiched by non-doped interlayer insulating films and thus an interlayer insulating film of a sandwich structure is used.

In the interlayer insulating film of the sandwich structure, however, the dielectric constant of the insulating film between the non-doped interlayer insulating films is low, but the capacitance of the entire interlayer insulating films is relatively great, which influences the operation speed of the device.

If the through-hole is formed in the interlayer insulating films, the side surfaces of the doping interlayer insulating film are exposed. Water is absorbed from the side surfaces and the reliability deteriorates. In order to solve this problem, it may be considered to evaporate water by annealing. In this case, however, the number of steps increases.

SUMMARY OF THE INVENTION

An object of the present invention is to provide a semiconductor device wherein diffusion of a wiring material into an interlayer insulating film is prevented, thereby enhancing reliability.

Another object of the invention is to provide a process of fabricating a semiconductor device wherein diffusion of a wiring material into an interlayer insulating film is prevented, thereby enhancing reliability.

Still another object of the invention is to provide a semiconductor device wherein an increase in a parasitic capacitance and water absorption of an insulating film in which a wiring groove is formed is prevented, thereby enhancing reliability.

Still another object of the invention is to provide a process of fabricating a semiconductor device wherein an increase in a parasitic capacitance and water absorption of an insulating film in which a wiring groove is formed is prevented, thereby enhancing reliability.

According to the present invention, there is provided a semiconductor device comprising: a semiconductor substrate in which a semiconductor element is formed; an interlayer insulating film formed on the semiconductor substrate; an insulating barrier layer, formed on the interlayer insulating film, for preventing diffusion of a metal contained in a wiring layer; a conductive barrier layer, formed on the insulating barrier layer, for preventing diffusion of the metal; and a wiring layer containing the metal on the conductive barrier layer.

Further, according to this invention, there is provided a process of fabricating a semiconductor device, comprising the steps of: forming a semiconductor element in a semiconductor substrate; forming an interlayer insulating film on the semiconductor substrate; denaturing a surface of the interlayer insulating film by plasma-nitriding the interlayer insulating film, thereby forming an insulating barrier layer for preventing diffusion of a metal contained in a wiring layer; forming a conductive barrier layer, on the insulating barrier layer, for preventing diffusion of the metal; and forming a wiring layer containing the metal on the conductive barrier layer.

Further, according to this invention, there is provided a semiconductor device comprising: an insulating film formed on a semiconductor substrate and having a wiring groove; a denatured layer formed by plasma nitriding treatment on an inner surface of the wiring groove; and a wiring layer formed in the wiring groove in which the denatured layer is formed.

Further, according to this invention, there is provided a process of fabricating a semiconductor device, comprising the steps of: forming an insulating film on a semiconductor substrate; forming a wiring groove in the insulating film; forming a denatured layer on an inner surface of the wiring groove by plasma-nitriding a surface of the insulating film; and forming a wiring layer in the wiring groove in which the denatured layer is formed.

Further, according to this invention, there is provided a semiconductor device comprising: an insulating film formed on a semiconductor substrate; a denatured layer formed by plasma nitriding treatment on the insulating film; and a wiring layer formed on the denatured layer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 23A to 23E are cross-sectional views showing steps of a buried wiring forming process according to an eleventh embodiment of the present invention;

FIG. 28 is a cross-sectional view taken along line a–a' in FIG. 27I;

FIGS. 29A and 29B are cross-sectional views showing steps according to a modification of the 15th embodiment of the invention;

FIG. 30 is a cross-sectional view showing schematically the structure of a main portion of a semiconductor device according to a 16th embodiment of the invention;

FIGS. 31A to 31M are cross-sectional views showing steps of a buried wiring forming process according to a 17th embodiment of the present invention;

FIG. 32 is a graph showing an analysis result in the case where the surface of a silicon oxide film was subjected to nitrogen plasma treatment;

FIGS. 34A to 34F are cross-sectional views showing steps of a buried wiring forming process according to a 19th embodiment of the present invention;

FIG. 35 shows a semiconductor device fabricating apparatus for use in the process of the present invention;

DETAILED DESCRIPTION OF THE PREFERRED EMBODIMENTS

Figure 1A:
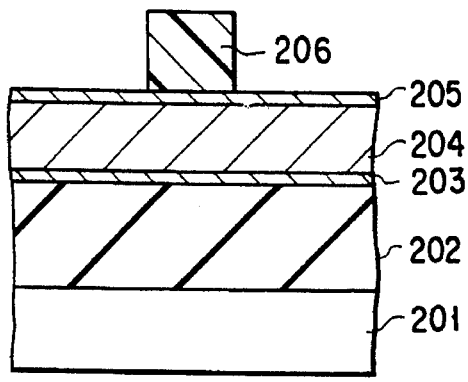
FIGS. 1A to 1D are cross-sectional views showing steps of a conventional wiring forming process.
Figure 2A:
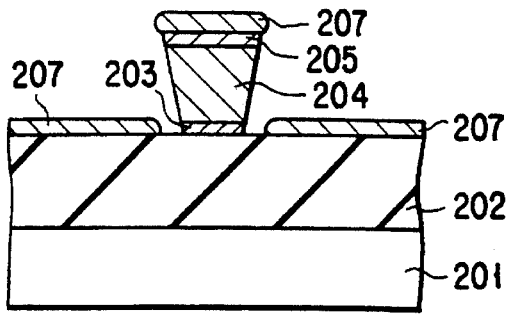
FIGS. 2A and 2B are cross-sectional views for explaining problems of the wiring forming process shown in FIGS. 1A to 1D.
Figure 1B:
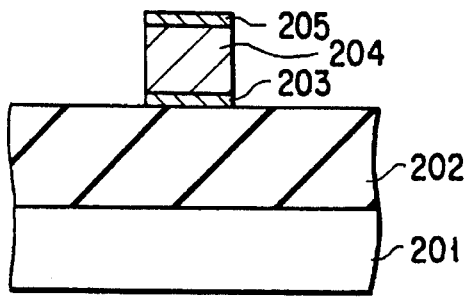
Figure 2B:
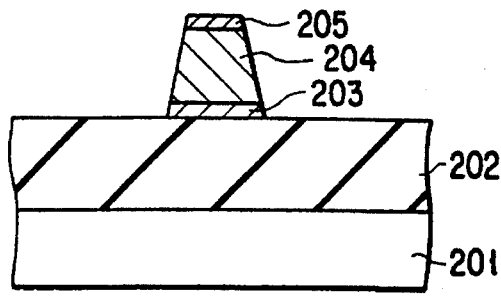
Figure 1C:
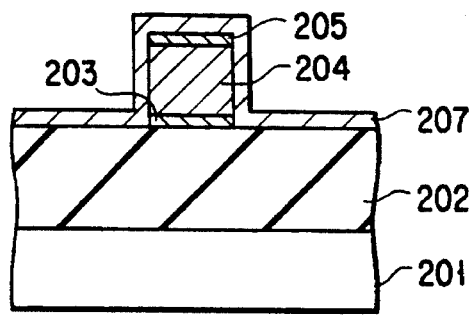
Figure 3A:
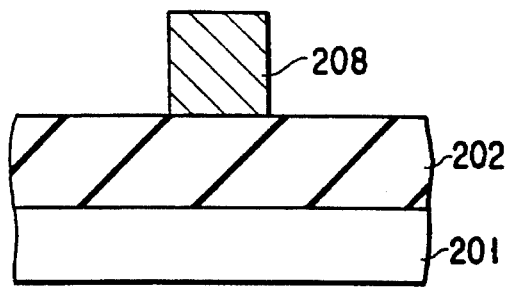
FIGS. 3A and 3B are cross-sectional views showing steps of another conventional wiring forming process.
Figure 1D:
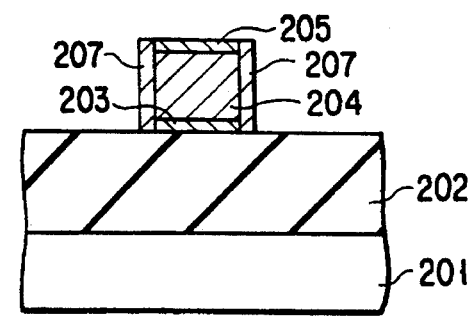
Figure 3B:
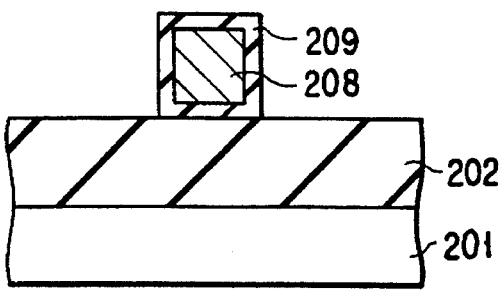
Figure 4A:
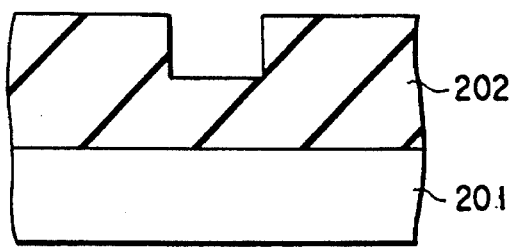
FIGS. 4A to 4D are cross-sectional views showing steps of another conventional wiring forming process.
Figure 5A:
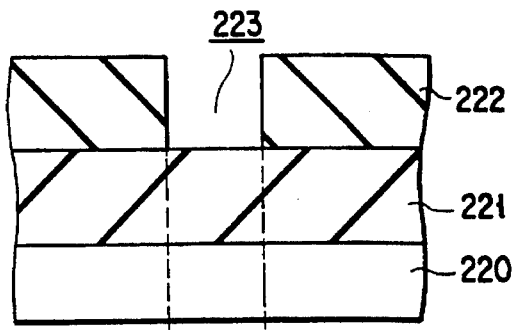
FIGS. 5A to 5D are cross-sectional views showing steps of a conventional process for forming a through-hole in buried wiring.
Figure 4B:
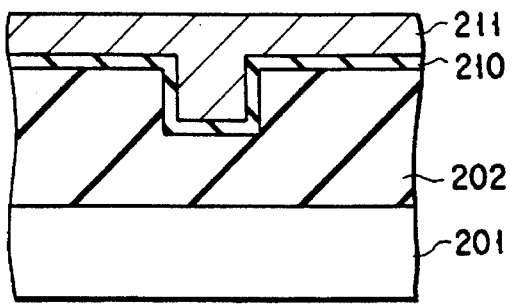
Figure 5B:
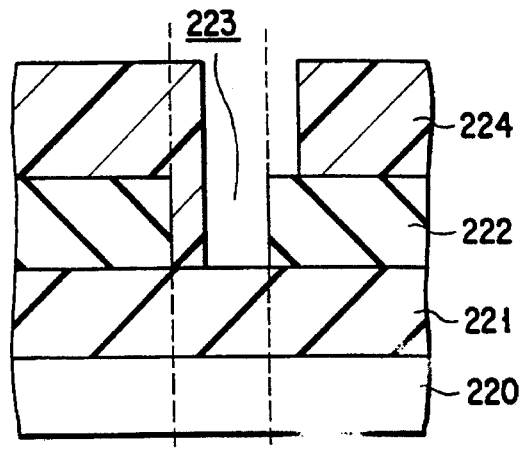
Figure 4C:
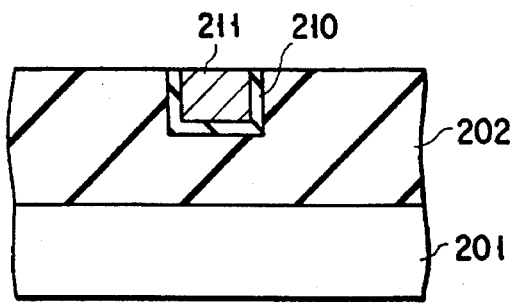
Figure 5C:
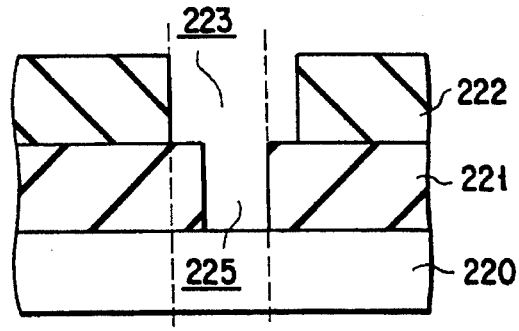
Figure 4D:
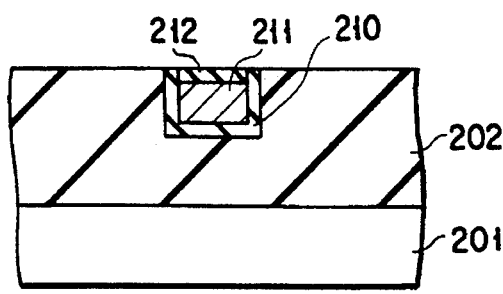
Figure 5D:
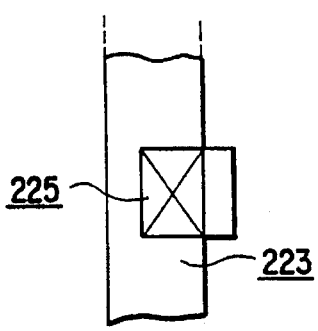
Figure 6A:
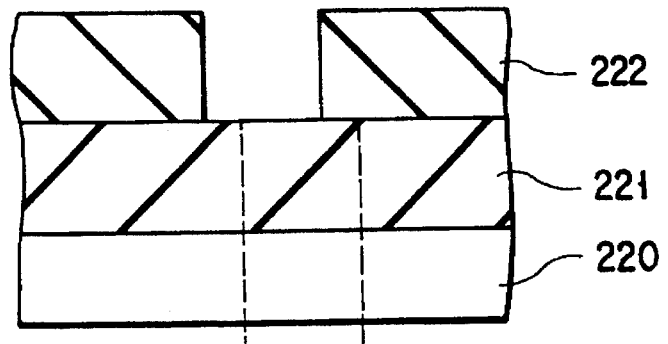
FIGS. 6A to 6D are cross-sectional views showing steps of another conventional process for forming a through-hole in buried wiring.
Figure 6B:
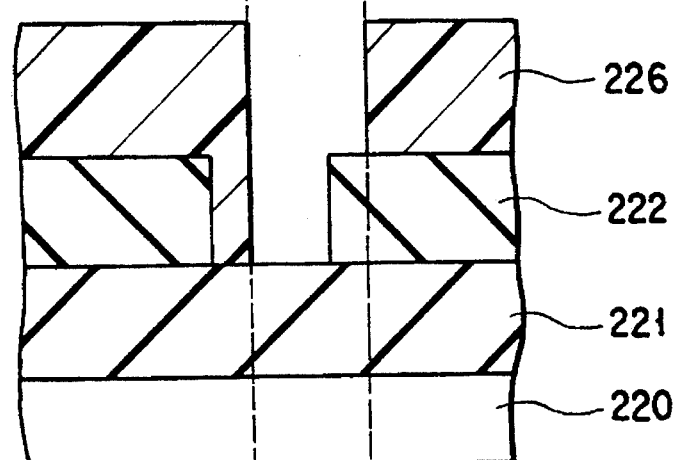
Figure 6C:
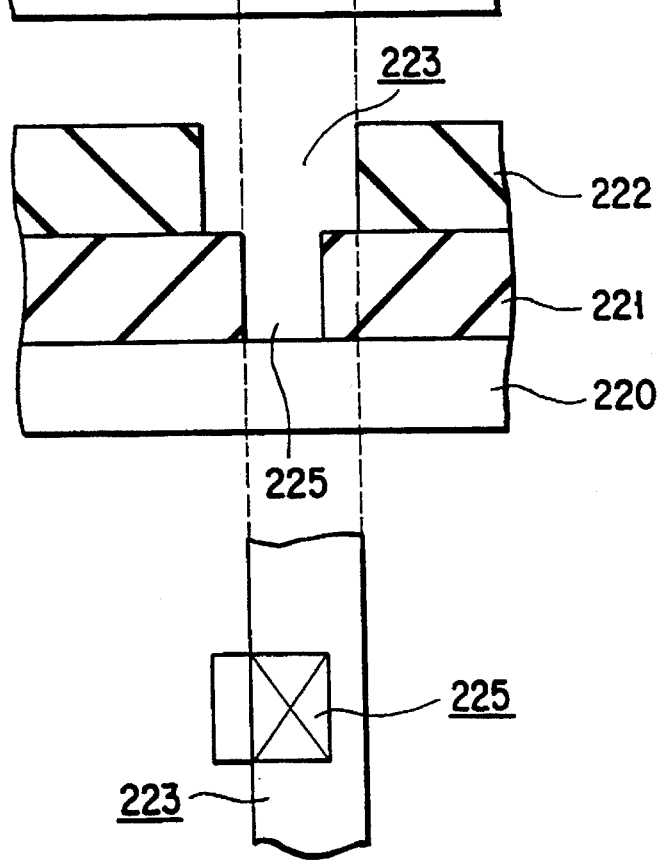
Figure 6D:
Figure 7A:
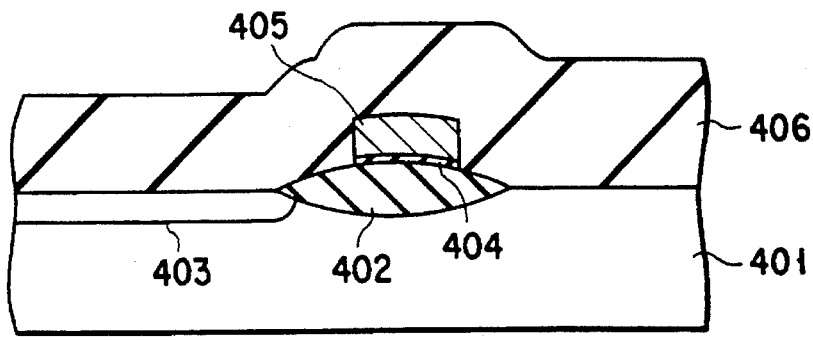
FIGS. 7A to 7F are cross-sectional views showing steps of a conventional semiconductor device fabricating process.
Figure 7B:
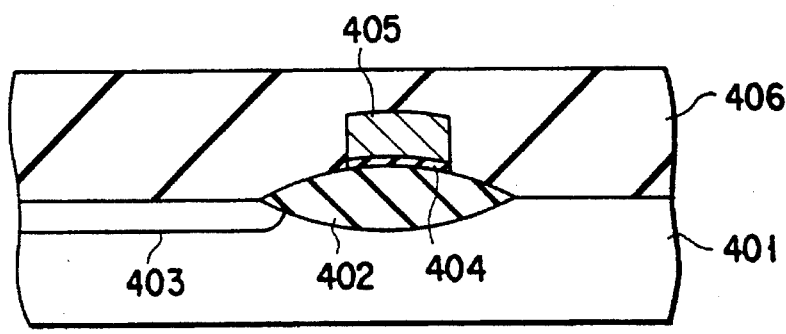
Figure 7C:
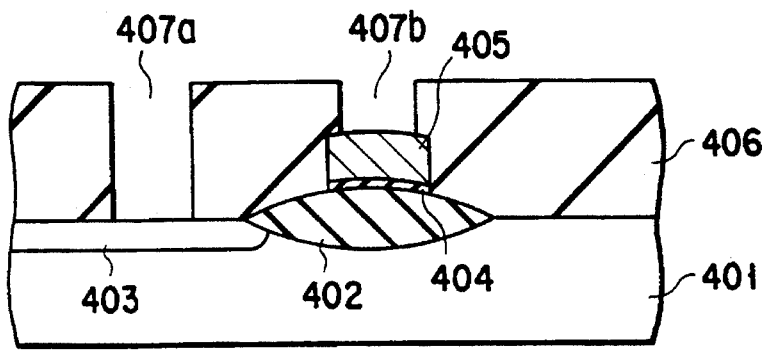
Figure 7D:
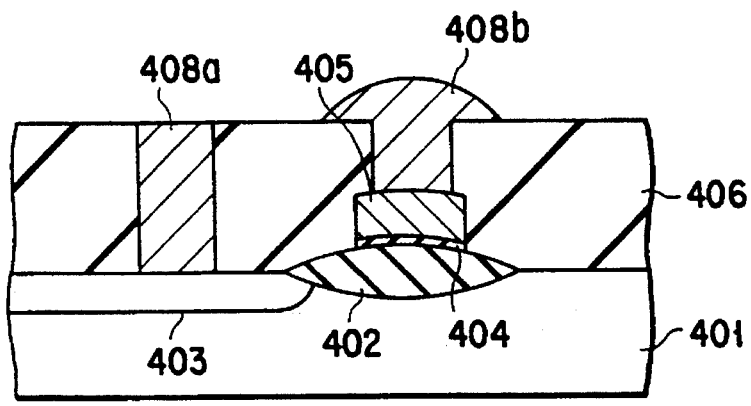
Figure 7E:
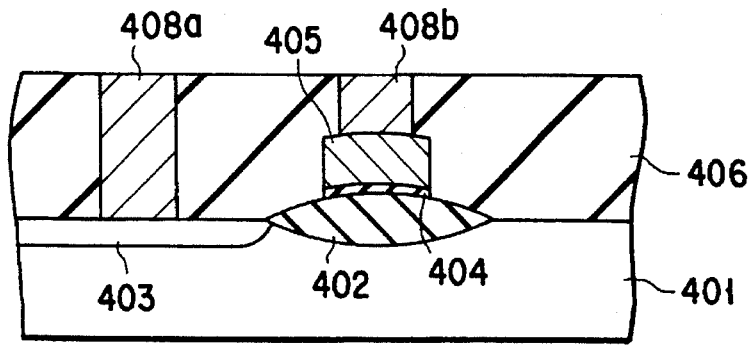
Figure 7F:
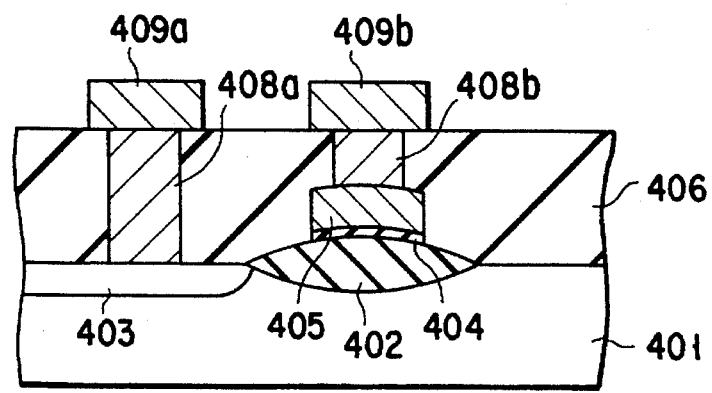
Figure 8A:
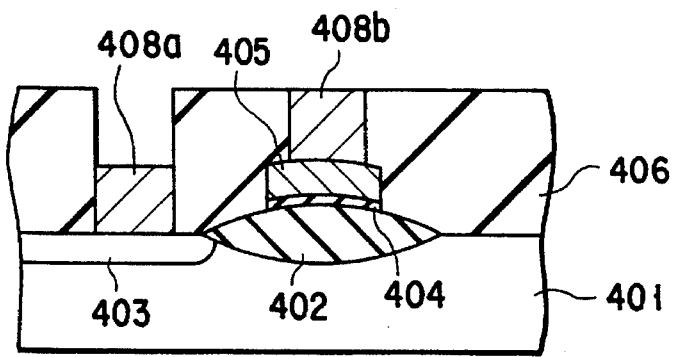
FIGS. 8A and 8B are cross-sectional views showing steps of another conventional semiconductor device fabricating process.
Figure 8B:
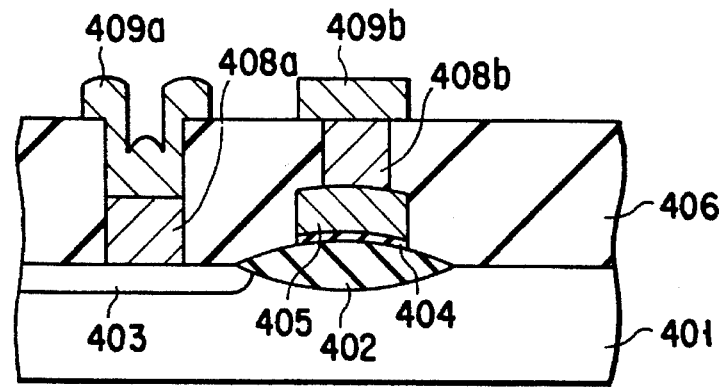
Figure 9A:
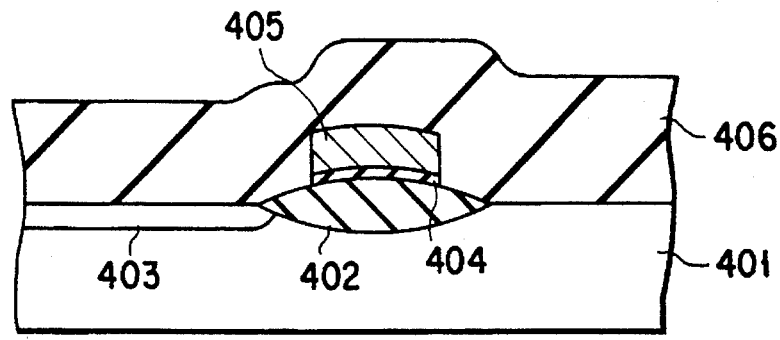
FIGS. 9A to 9D are cross-sectional views showing steps of still another conventional semiconductor device fabricating process.
Figure 9B:
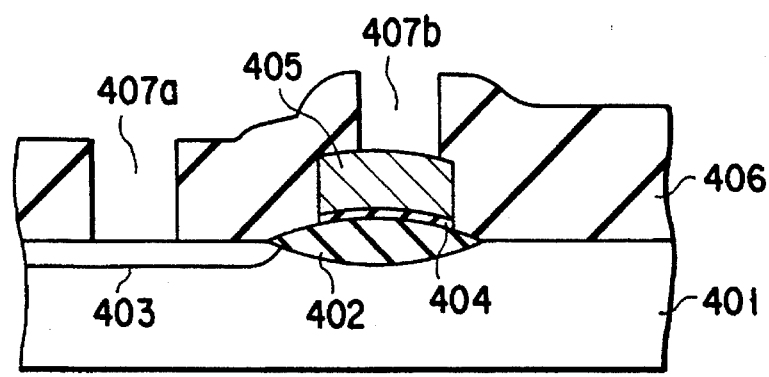
Figure 9C:
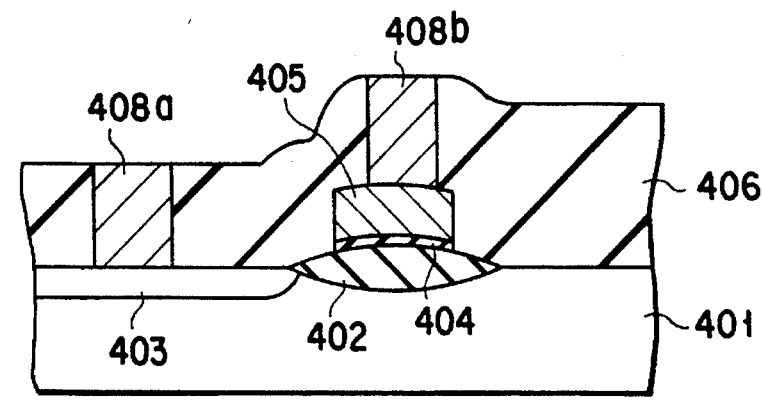
Figure 9D:
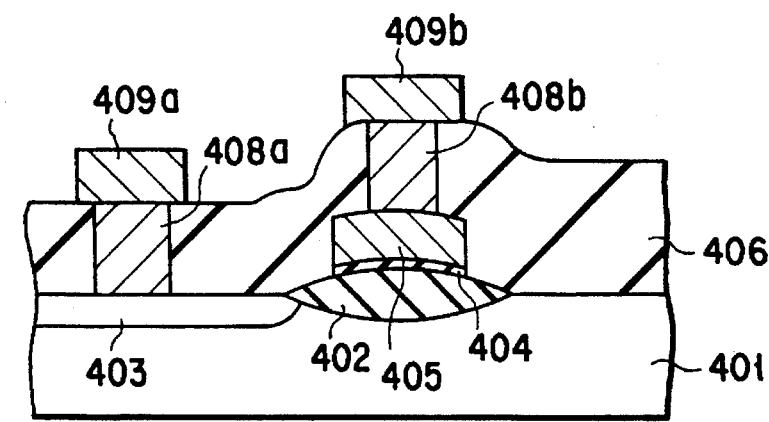
Figure 10A:
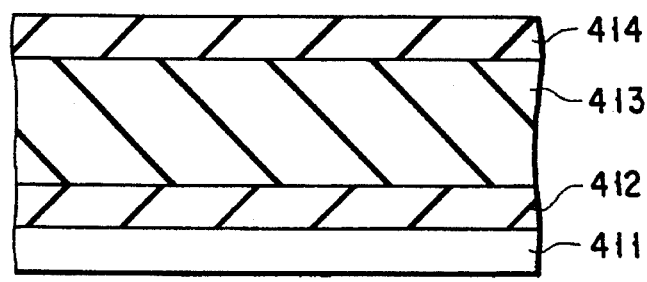
FIGS. 10A and 10B are cross-sectional views showing steps of a conventional buried wiring forming process.
Figure 10B:
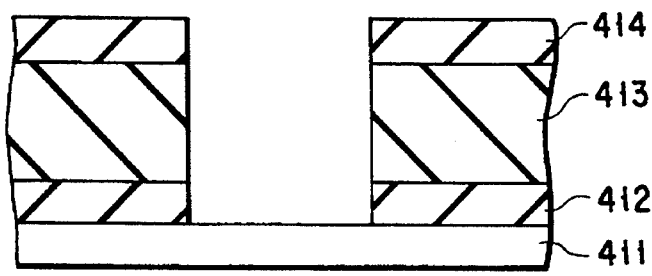

In a semiconductor device according to a first aspect of the present invention, a bottom portion of wiring is protected by a double-layer barrier consisting of a conductive barrier layer made of an electrically conductive material and an insulating barrier layer made of an insulating material.

The insulating barrier layer may preferably be a denatured layer obtained by plasma-nitriding a surface of an interlayer insulating film in an atmosphere containing nitrogen. The denatured layer may be of $Si_xN_yO_z$ (each of x, y and z is a positive number). The thickness of the insulating barrier layer may preferably be 1 to 100 nm, and more preferably, 1 to 10 nm.

The conductive barrier layer may be formed of Al, Ti, TiN, Nb, W, a laminated body of two or more layers of these elements, or a metal selected from the group consisting of alloys of two or more of these elements. The thickness of the conductive barrier layer may preferably be several nm to several tens nm.

It is desirable that not only a bottom portion but also a side surface and a top surface of the wiring layer be provided with another conductive barrier for preventing diffusion of the metal, and another insulating barrier layer for preventing diffusion of the metal be provided on this other conductive barrier layer.

The material of the wiring layer may preferably be Au, Ag, Cu or an alloy including any of these elements.

According to the semiconductor device of the first aspect of the invention, since the bottom portion of the wiring layer is doubly protected by the conductive barrier layer and the insulating barrier layer, the diffusion of the metal constituting the wiring layer into the interlayer insulating film can be surely prevented. As a result, a highly reliable semiconductor device can be obtained.

The semiconductor device of the first aspect can be fabricated by a process comprising the steps of: forming a semiconductor element on a semiconductor substrate; forming an interlayer insulating film on said semiconductor substrate; denaturing a surface of the interlayer insulating film by plasma-nitriding the interlayer insulating film, thereby forming an insulating barrier layer for preventing diffusion of a metal constituting a wiring layer; forming a conductive barrier layer, on said insulating barrier layer, for preventing diffusion of said metal; and forming a wiring layer of said metal on said conductive barrier layer.

In a semiconductor device according to a second aspect of the invention, a denatured layer is formed by plasma nitriding treatment on an inner surface of a wiring groove made in an insulating film. A wiring layer is formed in the wiring groove provided with this denatured layer.

The material and thickness of the denatured layer are the same as in the first mode.

In the second aspect, like the first aspect, a conductive barrier layer for preventing diffusion of the metal constituting the wiring layer may be provided between the denatured layer and the wiring layer. The material of the conductive barrier layer is the same as in the first aspect.

According to the semiconductor device of the second aspect of the invention, since the denatured layer is formed by plasma nitriding treatment plasma treatment in an atmosphere containing nitrogen on the surfaces of the bottom and side are the wiring groove, the denatured layer prevents the interlayer insulating film from absorbing water. The inventors of the present invention have first discovered the fact that such a denatured layer can prevent an interlayer insulating film from absorbing water. In the second aspect of the present invention, this discovered fact is positively applied.

Unlike a nitride film formed by using a CVD method or a sputtering method, the denatured layer formed by the plasma nitriding treatment does not narrow the wiring groove. Moreover, in the second aspect, as mentioned above, the denatured layer prevents the interlayer insulating film from absorbing water, and therefore there is no need to adopt a conventional "sandwich" structure using non-doped insulating films. Accordingly, the capacitance of the entire interlayer insulating films does not increase.

According to the second aspect of the invention, the capacitance does not increase and the water absorption of the insulating film can be prevented, thereby enhancing reliability. According to the inventors' study, an insulating film including nitrogen can function as a diffusion barrier. Therefore, in the present invention, constituent atoms of the wiring layer can be prevented from diffusing into the insulating film.

The semiconductor device according to the second aspect can be fabricated by a process comprising the steps of: forming an insulating film on a semiconductor substrate; forming a wiring groove in said insulating film; forming a denatured layer on an inner surface of said wiring groove by plasma-nitriding a surface of said insulating film; and forming a wiring layer in said wiring groove in which said denatured layer is formed.

The wiring layer can be formed in the wiring groove in the following manner. A conductive material is deposited by an anisotropic deposition method on an insulating film including a wiring groove to a thickness less than the depth of the wiring groove. Thereby, the conductive material layer formed in the wiring groove is separated at a stepped portion from the conductive material layer formed on the insulating film excluding the wiring groove. Subsequently, the conductive material layer formed on the insulating film excluding the wiring groove is selectively removed.

Various embodiments of the present invention will now be described with reference to the accompanying drawings.

EXAMPLE 1

FIGS. 11A to 11G are cross-sectional views showing steps of a buried wiring forming process according to a first embodiment of the present invention.

Figure 11A:
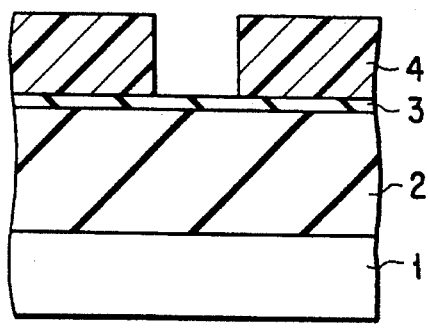
FIGS. 11A to 11G are cross-sectional views showing steps of a buried wiring forming process according to a first embodiment of the present invention.

At first, as shown in FIG. 11A, an interlayer insulating film 2 is formed on a semiconductor substrate 1 made of, e.g. silicon. It is preferable to provide a stopper film (etching-proof film) 3 on the interlayer insulating film 2. The stopper film 3 prevents the interlayer insulating film 2 from being thinned when a wiring material film is removed by means of CMP, etc. in a subsequent step. However, the stopper film 3 is not necessary if an adequate etching selection ratio is obtained between the wiring material film and the interlayer insulating film 2. Thereafter, a resist pattern 4 for forming a wiring groove is formed on the stopper film 3.

The interlayer insulating film 2 may be, for example, an $SiO_2$ film formed by CVD, an $SiO_2$ film including impurities of B or P formed by CVD, an $SiO_2$ film formed by plasma CVD, or an $SiO_2$ film formed with use of a TEOS-based gas as a source gas. For example, a carbon thin film may be used as stopper film 3.

Figure 11E:
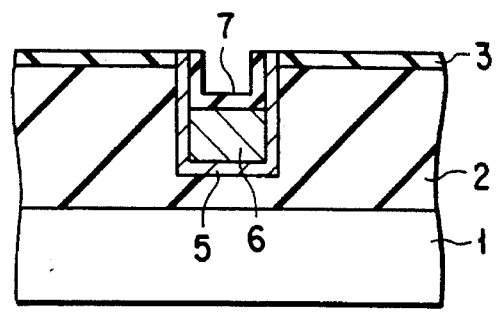
Figure 11B:
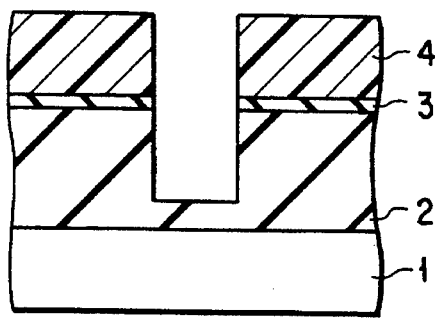

Subsequently, as shown in FIG. 11B, with the resist pattern 4 used as a mask, the stopper film 3 and interlayer insulating film 2 are anisotropically etched to form a wiring groove in the interlayer insulating film 2. At this time, the anisotropic etching of the stopper film 3 and interlayer insulating film 2 may be continuously performed by using a fluorocarbon-based gas or may not be continuously done. The depth of the wiring groove is greater than that of the thickness of a wiring layer which will become wiring.

Figure 11F:
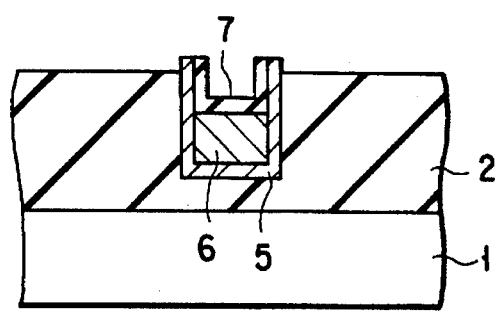
Figure 11C:
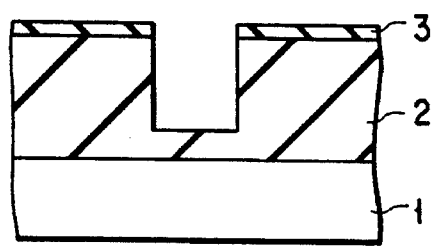

In the next step shown in FIG. 11C, the resist pattern 4 is removed. The resist pattern 4 may be removed by ashing using $O_2$. However, if a carbon thin film is used as stopper film 3, it is better to remove the resist pattern 4 by wet etching with use of a mixed solution of sulfuric acid and aqueous hydrogen peroxide (the ratio of the former to the latter is about 3:2). Moreover, if a metal film is exposed on the underlayer, down-flow ashing may be adopted. The down-flow ashing is performed by using $O_2$ gas or a mixture gas of $O_2$ and $CF_4$, under the conditions: the temperature in a chamber being 100° C. or below, and the pressure being several mTorr (at which a plasma can be created). Thereafter, in order to remove adhered matter such as F, baking may be performed at about 100° to 300° C. in a vacuum or an $N_2$ atmosphere, or ultrasonic rinsing using pure water may be performed.

Figure 11D:
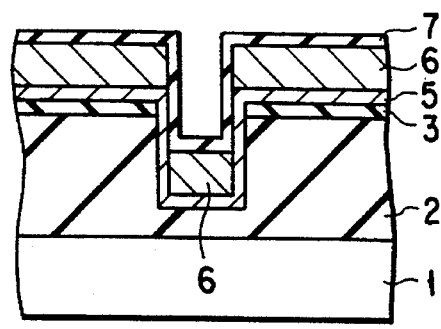

Thereafter, a barrier layer 5 formed of Al, Ti, TiN, Nb, W, a laminated body of two or more layers of these elements, or a metal selected from the group consisting of alloys of two or more of these elements is formed on the entire surface of the resultant structure, as shown in FIG. 11D. It is desirable that the thickness of the barrier layer 5 be several to several-ten nm so as not to lose the resistance of the material mainly constituting the wiring.

Then, a wiring material film 6, which is made of, e.g. Au, Ag, Cu or an alloy of these elements and will become wiring, is deposited by an anisotropic deposition method. The wiring material film 6 is completely separated between the portion in the wiring groove and the portion outside the wiring groove. The wiring material film 6 is formed, for example, in two methods: 1) a collimator is interposed between a target and the substrate, and the wiring material layer is formed by sputtering such that only atoms travelling vertically to the substrate are directed to the substrate, or 2) sputtering with directivity is performed in an inert gas atmosphere of $10^5$ to $10^{-4}$ Torr with a distance of 10 cm or more between the target and the substrate. Thereby, the formation of the wiring material film 6 on the side walls of the wiring groove is prevented. Alternatively, metal or particles of the wiring material are ionized and deposited on a substrate to which a bias is applied. Thereafter, a surface protection film 7 is formed on the entire structure such that the total thickness of the barrier layer 5, wiring material film 6 and surface protection film 7 is set at a desired value. The surface protection film 7 is formed of an insulating film $Si_xN_y$, $Si_xN_yO_z$, $Al_2O_3$, MgO, $ZrO_2$, BeO, CaO, etc.

Furthermore, as shown in FIG. 11E, the barrier layer 5, wiring layer 6 and surface protection film 7, which are located outside the wiring groove, are removed by a CMP method, an etch-back method, etc. Subsequently, as shown in FIG. 11F, the stopper film 3 is removed. In this state, microscopically, there remains a stepped portion corresponding to the thickness of the stopper film 3.

Figure 11G:
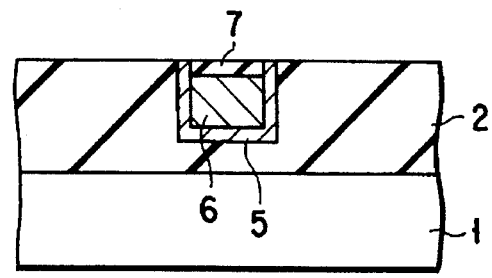

Lastly, as shown in FIG. 11G, in order to remove the stepped portion, the surface of the structure is polished by, e.g. a CMP method, and buried wiring with a flat surface is obtained.

As has been described above, in the present embodiment, the depth of the wiring groove is greater than the thickness of the wiring film and the wiring material film 6 is formed by anisotropic deposition. Thereby, the wiring material film 6 is completely separated between the portion inside the wiring groove and the portion outside the wiring groove. Then, the surface protection film 7 is deposited on the entire surface of the resultant structure, and the wiring structure wherein the inside of the wiring groove is coated with the surface protection film 7 is obtained.

Accordingly, without high-temperature heat treatment, the wiring material film 6 coated with the surface protection film 7 only in the wiring groove can be formed by a single removing step. Thus, the buried wiring with a surface coating structure is obtained with a small number of steps, and the lowering of the reliability is prevented. Furthermore, since the wiring is buried in the interlayer insulating film 2, a stepped portion due to wiring is not formed and a multilayer structure can be advantageously obtained.

Figure 12:
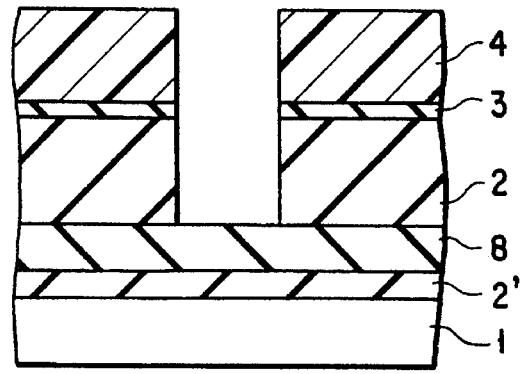
FIG. 12 is a cross-sectional view showing a modification of the first embodiment of the invention.

FIG. 12 shows a modification of the first embodiment, wherein the depth of the wiring groove is made uniform. After a first interlayer insulating film 2' is formed on a semiconductor substrate 1, etching is effected by using a material different from the material of the interlayer insulating film 2 in which the wiring groove is formed, e.g. a fluorocarbon-based gas. In this case, a second interlayer insulating film 8 made of SiN with an etching rate lower than $SiO_2$, of which the interlayer insulating film 2 is made, may be formed on the first interlayer insulating film 2'. Thereby, the thickness of the interlayer insulating film 2 may be chosen in accordance with the depth of the wiring groove, and a wiring groove with a predetermined depth can be obtained.

EXAMPLE 2

FIGS. 13A to 13E are cross-sectional views showing steps of a buried wiring forming process according to a second embodiment of the present invention.

Figure 13A:
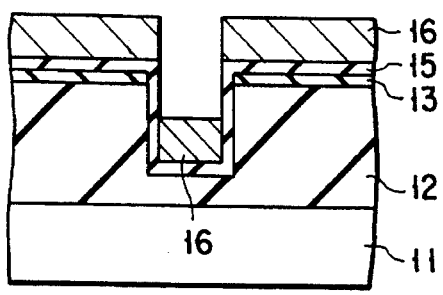
FIGS. 13A to 13E are cross-sectional views showing steps of a buried wiring forming process according to a second embodiment of the present invention.

At first, in a process similar to the first embodiment, an interlayer insulating film 12 with a wiring groove, a stopper film 13, a barrier layer 15 and a wiring material film 16 are formed on a semiconductor substrate 16, as shown in FIG. 13A. The total thickness of the barrier layer 15 and wiring material film 16 is set at a desired value.

Figure 13B:
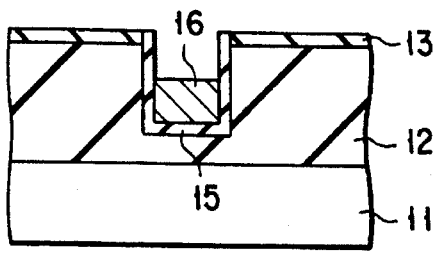
Figure 13C:
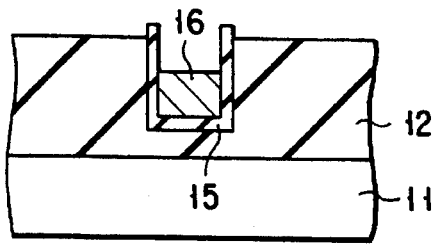
Figure 13D:
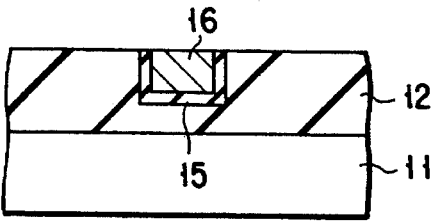

Then, as shown in FIG. 13B, the barrier layer 15 and wiring material layer 16, provided outside the wiring groove, are etched away. In the next step shown in FIG. 13C, the stopper film 13 is removed. In this state, a stepped portion corresponding to the thickness of the stopper film 13 remains between the interlayer insulating film 12 and the barrier layer 15. Thereafter, as shown in FIG. 13D, the surface of the resultant structure is polished, for example, by means of CMP, thereby removing the stepped portion. Thus, buried wiring with a flat surface is obtained.

Figure 13E:
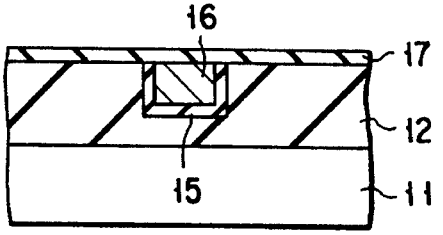

Lastly, as shown in FIG. 13E, a surface protection film 17 formed of an insulating film of $Si_xN_y$, $Si_xN_yO_z$, $Al_2O_3$, MgO, $ZrO_2$, BeO, CaO, etc. is formed on the entire surface of the resultant structure.

The surface protection film 17 functions as an etching stopper film for the interlayer insulating film 12 when a through-hole for the thus formed buried wiring is formed in a second interlayer insulating film to be formed on the surface protection film 17. Thus, even if the resist pattern is misaligned, the interlayer insulating film 12 is not thinned by etching. In this case, the buried wiring may be formed in the following manner. The depth of the wiring groove is set to be equal to a predetermined wiring thickness, the barrier layer is formed, and the wiring material is formed by thermal sputtering or sputtering. Then, heat treatment or laser radiation is performed to reflow the wiring material to fill the wiring groove with the wiring material. The barrier layer and wiring material, provided outside the wiring groove, are removed, thus forming the buried wiring.

EXAMPLE 3

Figure 14A:
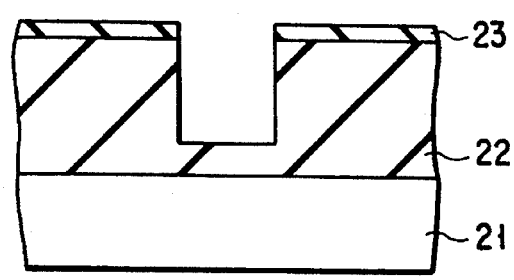
FIGS. 14A and 14B are cross-sectional views showing steps of a buried wiring forming process according to a third embodiment of the present invention.
Figure 14B:
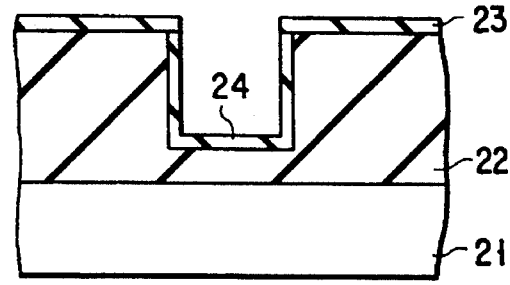

FIGS. 14A and 14B are cross-sectional views showing steps of a buried wiring forming process according to a third embodiment of the present invention.

At first, as is shown in FIG. 14A, an interlayer insulating film 22 of $SiO_2$ is formed on a semiconductor substrate 21 in a process similar to the first embodiment. Then, a stopper film 23 is formed, and a wiring groove is formed. Subsequently, the entire surface of the wafer is plasma-treated in an $N_2$ atmosphere and, as shown in FIG. 14B, exposed surfaces of the interlayer insulating film 22 at the side and bottom portions of the wiring groove are nitrided to form a barrier layer 24.

The $N_2$ plasma treatment is carried out, for example, for 3 to 60 minutes in a nitrogen plasma at a pressure of $10^{-3}$ to 10 Torr at a chamber temperature of 350° to 450° C. Thus, an SiON layer, or the like is formed. The SiON layer should preferably be several to 10 nm thick so as not to increase the dielectric constant (the same applies to plasma nitride films mentioned below). Thereafter, buried wiring is completed through the same steps as shown in FIGS. 11D to 11G.

According to the present embodiment, the barrier layer 24 is formed by nitriding the side walls and bottom of the wiring groove. Compared to the formation of the film by CVD or sputtering, the wiring groove is not narrowed with a high-resistance material. Therefore, the inherent resistance of the wiring material can be maintained.

A modification of the present embodiment will now be described. At first, in the same process as in Example 1, the structure as shown in FIG. 11C is prepared. An $SiO_2$ film is used as interlayer insulating film 2. Then, the entire surface of the structure is plasma-treated and the exposed surfaces of the interlayer insulating film 2 at the side walls and bottom of the wiring groove are nitrided. Thereby, a denatured layer of SiON is formed on the side walls and bottom of the wiring groove.

Lastly, a diffusion prevention film and a wiring material film are successively formed on the entire surface of the structure. The barrier layer and wiring material film outside the wiring groove are etched away. Thus, buried wiring is completed.

It is desirable that the top portion of the wiring be protected, as in the first embodiment.

According to this modification, the denatured film of SiON is combined with the barrier layer of Al, Ti, TiN, Nb, W, a laminated body of these, or an alloy of these. Therefore, prevention of diffusion of the wiring material can be doubly ensured.

EXAMPLE 4

Figure 15A:
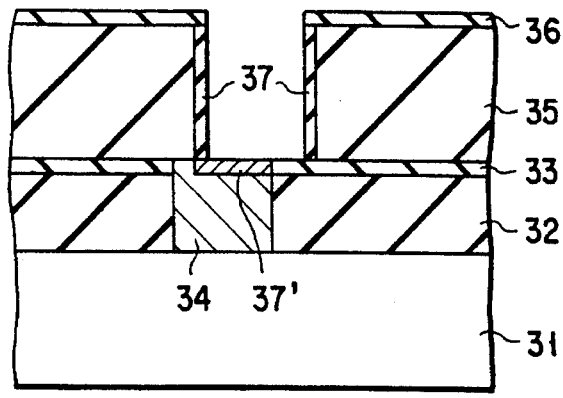
FIGS. 15A to 15C are cross-sectional views showing steps of a buried wiring forming process according to a fourth embodiment of the present invention.
Figure 15B:
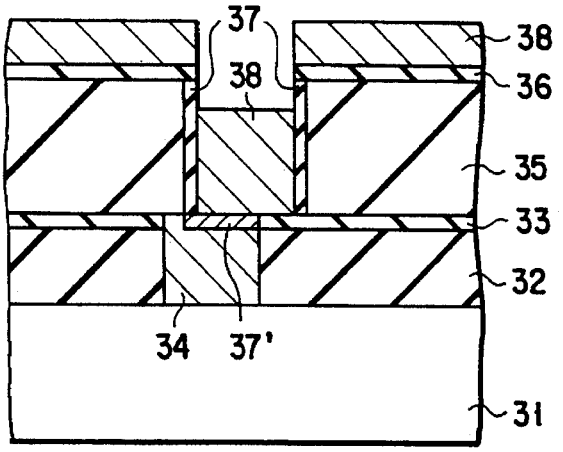
Figure 15C:
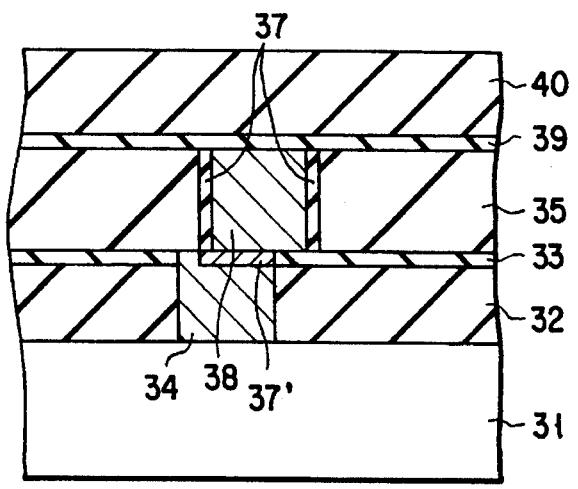

FIGS. 15A to 15C are cross-sectional views showing steps of a buried wiring forming process according to a fourth embodiment of the present invention. In the fourth embodiment, the preceding third embodiment is applied.

At first, as shown in FIG. 15A, a first interlayer insulating film 32 and a stopper film 33 formed of an insulating film are successively provided on a semiconductor substrate 31. The first interlayer insulating film 32 and stopper film 33 are etched to form a through-hole. A metal material such as W is buried in the through-hole, thus forming a metal film 34.

Then, a second interlayer insulating film 35 and a metal CMP stopper film 36 are formed on the entire surface of the structure, and a wiring groove is formed. Like the third embodiment, the obtained structure is subjected to plasma treatment in an $N_2$ atmosphere. As a result, the side portion of the wiring groove and the exposed portion of the metal film 34 buried in the through-hole are nitrided by the plasma treatment. Thus, a barrier layer 37 of SiON is formed on the side walls of the wiring groove, and a metal nitride layer 37' is formed on the surface of the metal film 34 buried in the through-hole.

If the metal material buried in the through-hole is, e.g. W, the conductivity of the metal material is still high even if it is nitrided. Thus, conductance between the metal in the through-hole and the wiring is not lost. In addition, by the heat treatment in a non-oxidizing atmosphere of nitrogen, hydrogen, etc., the metal nitride layer 37' can be reduced to a metal film.

Subsequently, as shown in FIG. 15B, a wiring material is deposited by an anisotropic deposition method to form a wiring material film 38. Lastly, as shown in FIG. 15C, the wiring material film 38 outside the wiring groove is removed and buried wiring with a flat surface is formed. Thereafter, a surface protection film 39 formed of an insulating film is provided on the entire surface of the structure, and a third interlayer insulating film 40 is formed.

EXAMPLE 5

Figure 16:
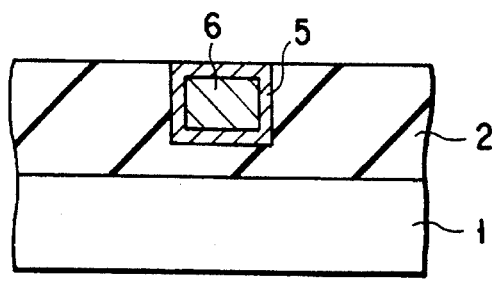
FIG. 16 is a cross-sectional view showing a step of a buried wiring forming process according to a fifth embodiment of the present invention.

FIG. 16 is a cross-sectional view showing a step of a buried wiring forming process according to a fifth embodiment of the present invention. The fifth embodiment is a modification of the first embodiment as shown in FIGS. 11A to 11G. The structural parts already shown in FIGS. 11A to 11G are denoted by like reference numerals and a detailed description thereof is omitted.

The fifth embodiment differs from the first embodiment in that a metal constituting a compound stable with the wiring material layer is used as material of the barrier layer or oxidation prevention film 5 for preventing diffusion/oxidation of the wiring material.

Specifically, when Cu is used as wiring material and Al is used as barrier layer or oxidation prevention film 5, an Al alloy such as $Al_2Cu$ is produced by heat treatment. The Al alloy is thermally stable in general and there is no problem with respect to adhesion. Thus, the Al alloy does not lose the function of the barrier layer film or oxidation prevention film.

EXAMPLE 6

Figure 17:
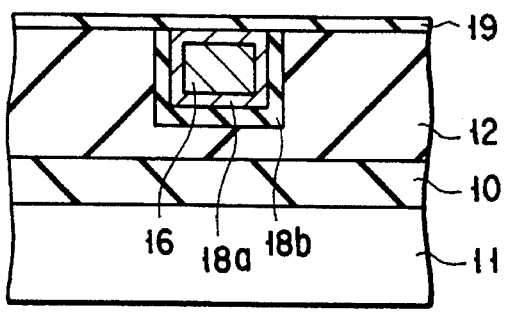
FIG. 17 is a cross-sectional view showing a step of a buried wiring forming process according to a sixth embodiment of the present invention.

FIG. 17 is a cross-sectional view showing a step of a buried wiring forming process according to a sixth embodiment of the present invention. The sixth embodiment is a modification of the second embodiment. The structural parts already shown in FIG. 13E are denoted by like reference numerals and a detailed description thereof is omitted.

The sixth embodiment differs from the second embodiment in that diffusion of the wiring material is prevented by a plurality of barrier layers.

Specifically, a gettering layer 10, e.g. a BPSG layer, for gettering diffused atoms from a wiring material layer 16 is formed on a semiconductor substrate 11. An interlayer insulating film 12 having a wiring groove is formed on the gettering layer 10. A wiring material film 16 coated with a metal barrier layer 18a and insulating barrier layers 18b and 19 is formed in the wiring groove. The metal barrier layer 18a is formed on the basis of the first embodiment or fifth embodiment, and the insulating barrier layers 18b and 19 are formed on the basis of the second and third embodiments.

EXAMPLE 7

Figure 18A:
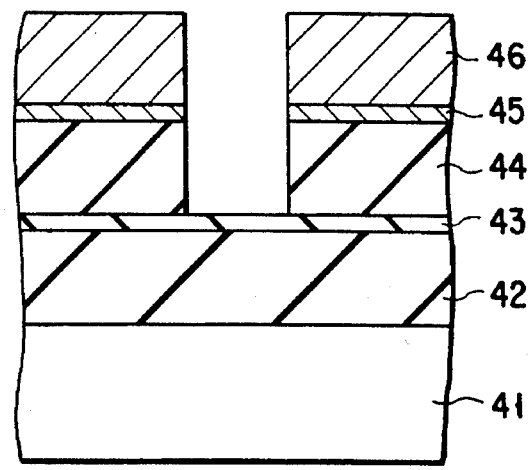
FIGS. 18A to 18C are cross-sectional views showing steps of a process for forming a through-hole in buried wiring according to a seventh embodiment of the present invention.
Figure 18B:
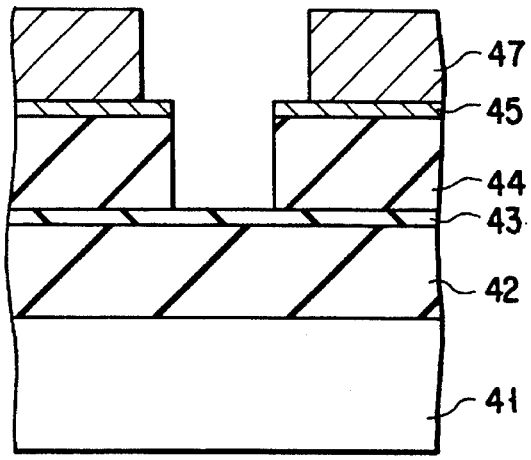
Figure 18C:
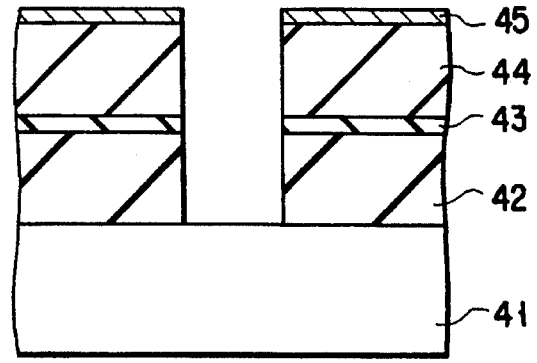

FIGS. 18A to 18C are cross-sectional views showing steps of a process for forming a through-hole in buried wiring according to a seventh embodiment of the present invention.

At first, a semiconductor substrate 41 on which a device (not shown) is formed is prepared, as shown in FIG. 18A. A first interlayer insulating film 42 made of $SiO_2$ or $SiO_2$ containing impurities is formed on the semiconductor substrate 41. A first stopper film 43, which is made of a material different from the material of the interlayer insulating film 42, e.g. SiN and serves as an etching stopper at the time of forming a wiring groove, is formed on the first interlayer insulating film 42. Then, a second interlayer insulating film 44 and a second stopper film 45 made of, e.g. carbon and functioning as an etching stopper at the time of etching a wiring material are successively formed.

Subsequently, a resist pattern 46 for forming a wiring groove is provided on the second stopper film 45. With the resist pattern 46 used as a mask, the second stopper film 45 and second interlayer insulating film 44 are etched to form the wiring groove. At this time, the first interlayer insulating film 42 is not etched by virtue of the first stopper film 43.

Figures 19A, 19B:
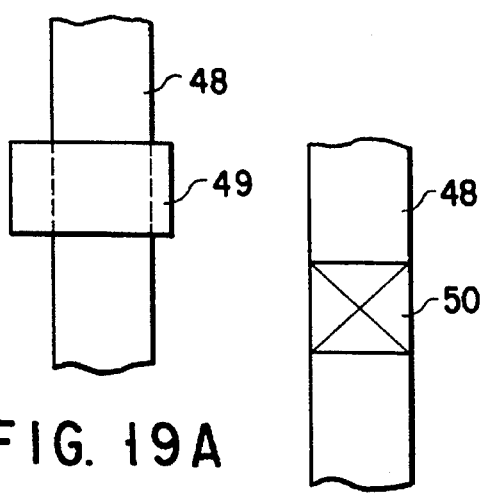
FIGS. 19A and 19B are plan views showing the process for forming the through-hole in the buried wiring according to the seventh embodiment of the present invention.

In the next step as shown in FIG. 18B, the resist pattern 46 is removed, and a resist pattern 47 for forming a through-hole wider than the wiring is provided. FIG. 19A is a plan view illustrating this state. Reference numeral 48 denotes a wiring groove and 49 an opening in the resist pattern 47 for the through-hole.

Thereafter, as shown in FIG. 18C, with the resist pattern 47 used as a mask, the second etching stopper film 43 and first interlayer insulating film 42 are etched to form the through-hole. At this time, the second interlayer insulating film 44 below the stopper film 45 is not etched by virtue of the second stopper film 45. Accordingly, as shown in FIG. 19B, a through-hole 50 having the same width as the wiring groove 48 can be formed.

According to the present embodiment, the width of the wiring groove 48 can be made equal to that of the through-hole 50, and a maximum through-hole size can be maintained with respect to the width of the wiring groove 48. A conductor material is buried simultaneously in the thus formed wiring groove and through-hole by the same method as in the first embodiment. The simultaneous burying of the conductor material can reduce the number of manufacturing steps. In addition, in the case where a C film is adopted as the second stopper film 45, it is possible to form W in the through-hole by selectively growing W in advance and then to form wiring by the same method as in the first embodiment.

EXAMPLE 8

FIGS. 20A to 20D are cross-sectional views showing steps of a buried wiring forming process according to an eighth embodiment of the present invention.

Figure 20A:
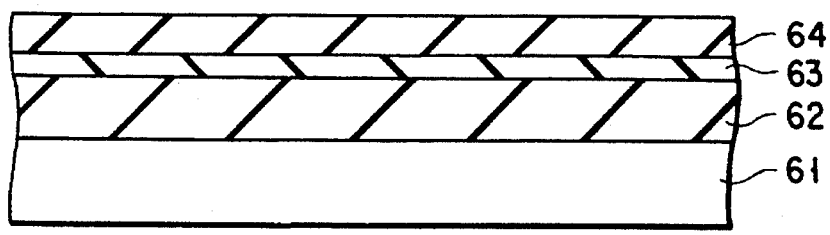
FIGS. 20A to 20D are cross-sectional views showing steps of a buried wiring forming process according to an eighth embodiment of the present invention.

At first, as shown in FIG. 20A, a PSG film 62 having a thickness of 0.8µ is formed by CVD as an interlayer insulating film on a single crystal silicon substrate 61 with direction (100) of plane. An $Si_3N_4$ film 63 having a thickness of 0.1 µm is formed by CVD as an etching stopper film on the PSG film 62. Although the thickness of the $Si_3N_4$ film 63 is set at 0.1 µm, it may be less than 0.1 µm if etching selectivity for an upper film is obtained. Thereafter, an $SiO_2$ film 64 having the same thickness (0.3 µm) as a wiring layer is formed on the resultant laminated structure by normal-pressure CVD.

Figure 20B:
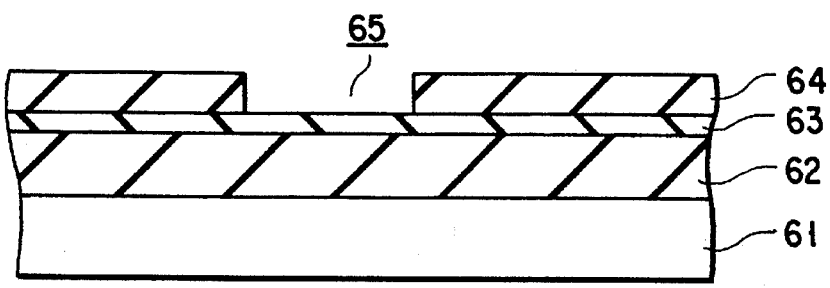

Subsequently, as shown in FIG. 20B, a wiring groove 65 is formed above the silicon substrate 61 by means of lithography and reactive ion etching. The gas used at this time should be a gas capable of obtaining selectivity between the $SiO_2$ film 64 and the $Si_3N_4$ film 63, e.g. a mixture gas of fluorocarbon gas and CO gas. Thereafter, a resist pattern used in the above-mentioned lithography is ashed in an oxygen plasma and removed and washed in a mixture liquid of sulfuric acid and aqueous hydrogen peroxide.

Figure 20C:
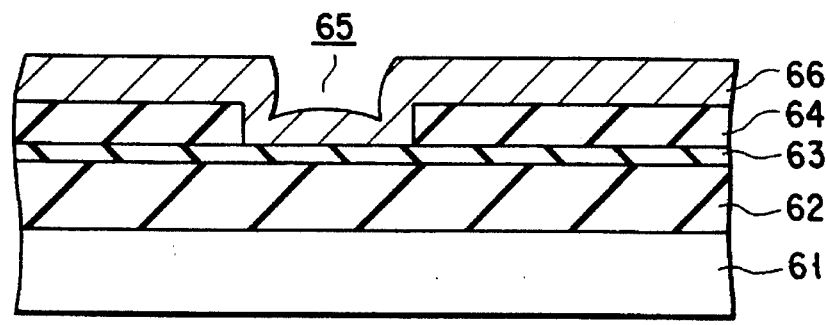

In the next step as shown in FIG. 20C, an Al thin film 66 which will become wiring is formed by a DC magnetron sputtering method without heating. The thickness of the Al thin film 66 is equal to the depth of the groove and is 0.3 µm. Following this, heat treatment is performed on the bottom surface of the substrate in the same vacuum as used for the sputtering, while controlling formation of a natural oxide film by use of a halogen lamp or the like. Thus, the Al thin film 66 is buried in the wiring groove 65.

Figure 20D:
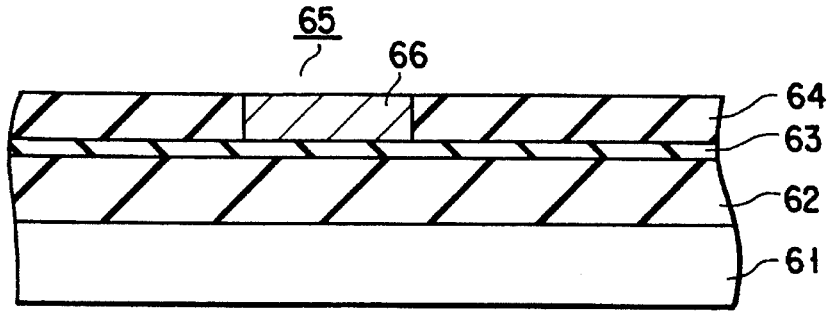

Lastly, as shown in FIG. 20D, the Al thin film 66 remaining on a broad area outside the wiring region is removed by a CMP method.

According to the present embodiment, since the etching stopper ($Si_3N_4$ film 63) is used, the interlayer insulating film (PSG film 62) is not etched at the time of etching the $SiO_2$ film 64. Thus, a trench phenomenon or a decrease in reliability of wiring due to non-uniform etching can be prevented.

In the present embodiment, the $Si_3N_4$ film 63 formed by the CVD method is used as the etching stopper film. The same result, however, is obtainable even if the etching stopper film is formed by a process of directly nitriding the interlayer insulating film, e.g. by direct nitriding in an $NH_4F$ or $N_2$ atmosphere.

In addition, the same result can be obtained by a process wherein a polysilicon film is substituted for the $Si_3N_4$ film 63, a recess of a predetermined pattern is formed and an exposed portion of the polysilicon film is oxidized to form an $SiO_2$ film, or by a process of removing by etching.

EXAMPLE 9

FIGS. 21A to 21E are cross-sectional views showing steps of a buried wiring forming process according to a ninth embodiment of the present invention.

Figure 21A:
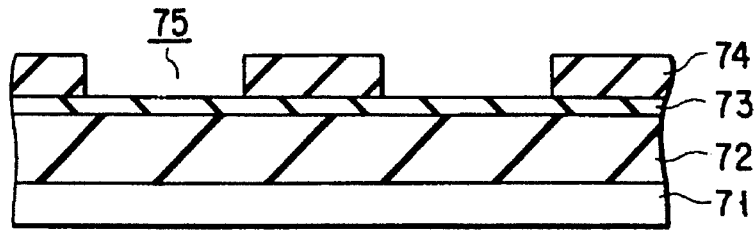
FIGS. 21A to 21E are cross-sectional views showing steps of a buried wiring forming process according to a ninth embodiment of the present invention.

As is shown in FIG. 21A, a PSG film 72 is formed by CVD as an interlayer insulating film on a single-crystal silicon substrate 71 with direction (100) of plane. The thickness of the PSG film 72 is, e.g. 0.8 μm. An $Si_3N_4$ film 73 is formed by CVD as an etching stopper film on the PSG film 72.

Subsequently, an $SiO_2$ film 74 having the same thickness (0.3 μm) as a wiring layer is formed on the $Si_3N_4$ film 73 by normal-pressure CVD. Then, a resist pattern is formed. With the resist pattern used as a mask, the $SiO_2$ film 74 is etched to form a wiring groove 75. The gas used at this time should be a gas capable of obtaining selectivity between $SiO_2$ and $SiN_3$, e.g. a mixture gas of fluorocarbon and CO. Thereafter, a resist pattern used in the above-mentioned lithography is ashed in an oxygen plasma and removed and washed in a mixture liquid of sulfuric acid and aqueous hydrogen peroxide.

Figure 21B:
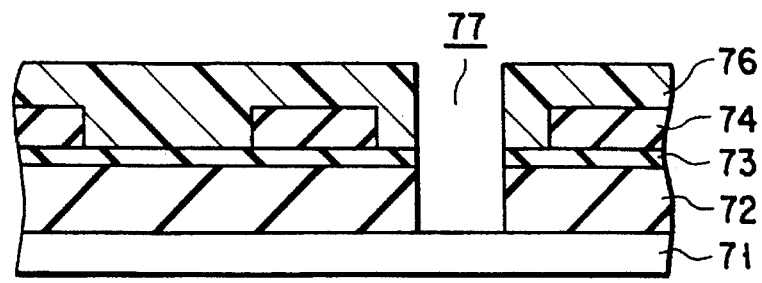
Figure 21C:
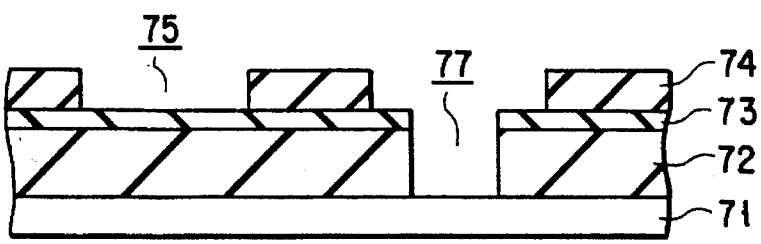

In the next step shown in FIG. 21B, a resist pattern 76 is formed. With the resist pattern 76 used as a mask, the PSG film 72 is etched by reactive ion etching to form a contact hole 77. Thereafter, as shown in FIG. 21C, the resist pattern 76 is ashed in an oxygen atmosphere and removed and washed in a mixture liquid of sulfuric acid and aqueous hydrogen peroxide.

Figure 21D:
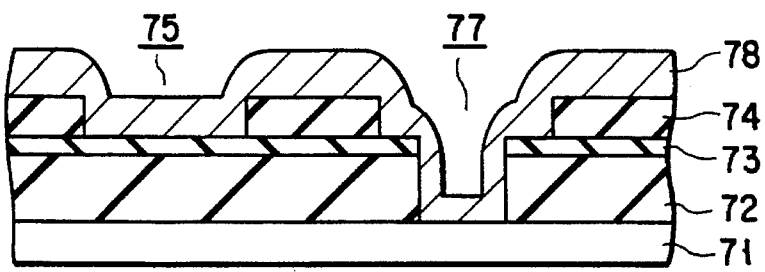

In the next step as shown in FIG. 21D, an Al thin film 78 which will become buried wiring and contact wiring is formed by a DC magnetron sputtering method without heating. The thickness of the Al thin film 78 is equal to the depth of the groove and is 0.3 μm. Following this, heat treatment is performed on the bottom surface of the substrate in the same vacuum as used for the sputtering, while controlling formation of a natural oxide film by use of a halogen lamp or the like. Thus, the Al thin film 78 is buried in the wiring groove 75 and the contact hole 77.

Figure 21E:
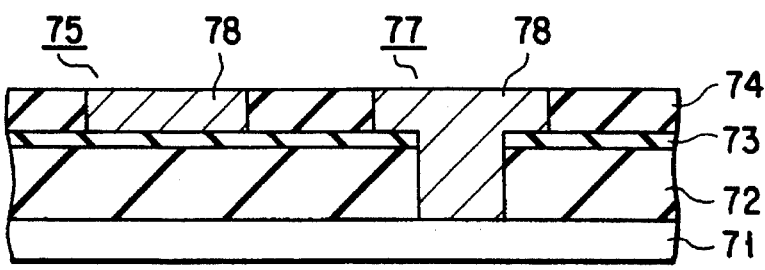

Lastly, as shown in FIG. 21E, the Al thin film 78 remaining on a broad area outside the wiring region is removed by a CMP method. Thus, the buried wiring and contact wiring are simultaneously completed.

EXAMPLE 10

FIGS. 22A to 22E are cross-sectional views showing steps of a buried wiring forming process according to a tenth embodiment of the present invention. In the tenth embodiment, a wiring groove is formed after a contact hole is formed.

Figure 22A:
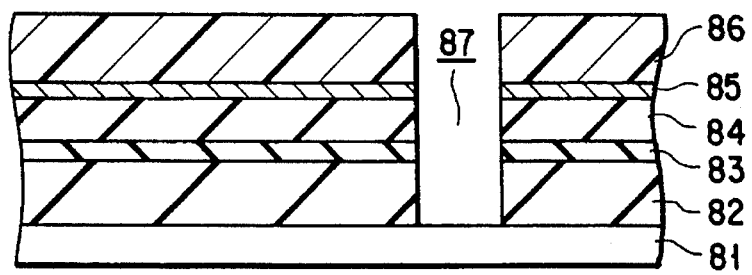
FIGS. 22A to 22E are cross-sectional views showing steps of a buried wiring forming process according to a tenth embodiment of the present invention.

As is shown in FIG. 22A, a PSG film 82 is formed by CVD as an interlayer insulating film on a single-crystal silicon substrate 81 with direction (100) of plane. The thickness of the PSG film 82 is, e.g. 0.8 μm. An $Si_3N_4$ film 83 is formed by CVD as an etching stopper film on the PSG film 82. Subsequently, an $SiO_2$ film 84 having the same thickness (0.3 μm) as a wiring layer is formed on the $Si_3N_4$ film 83 by normal-pressure CVD.

Then, in order to improve wettability of the surface of the $SiO_2$ film 84 serving as a stopper for the CMP, a carbon film 85 is formed on the $SiO_2$ film 84 by a DC magnetron sputtering method. After a resist pattern 86 is formed, a contact hole 87 is formed by reactive ion etching. The gas used for the etching is a gas having no selectivity for the $Si_3N_4$ film 83. Thereafter, the resist pattern 86 is ashed by a down-flow ashing and removed.

Figure 22B:
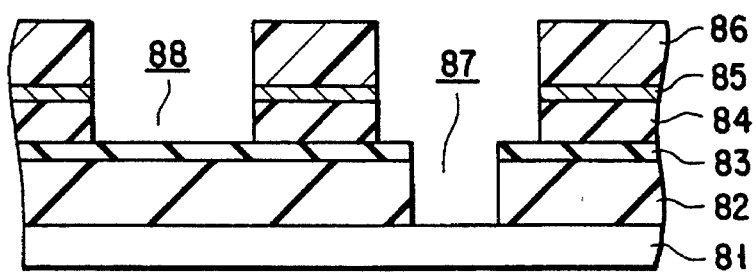
Figure 22C:
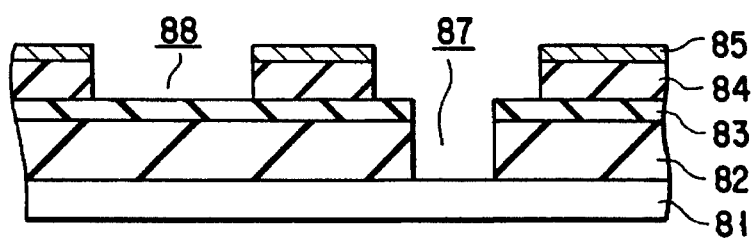

Following this step, as shown in FIG. 22B, a resist pattern 86a is formed and a wiring groove 88 is formed by reactive ion etching. The gas used for the etching should be a gas capable of obtaining selectivity between the $SiO_2$ film 84 and the $Si_3N_4$ 83, e.g. a mixture gas of fluorocarbon and CO. Further, as shown in FIG. 22C, only the resist pattern 86a is ashed by the down-flow ashing method and removed and washed in a mixture liquid of sulfuric acid and aqueous hydrogen peroxide.

Figure 22D:
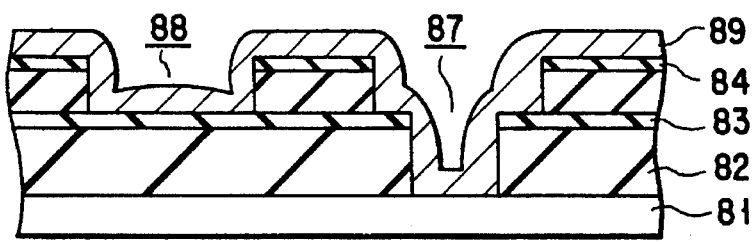

In the next step shown in FIG. 22D, an Al thin film 89 is formed by a DC magnetron sputtering method without heating. The thickness of the Al thin film 89 is equal to the depth of the groove and is 0.3 μm. Following this, heat treatment is performed on the bottom surface of the substrate in the same vacuum as used for the sputtering, while controlling formation of a natural oxide film by use of a halogen lamp or the like. Thus, the Al thin film 79 is buried.

Figure 22E:
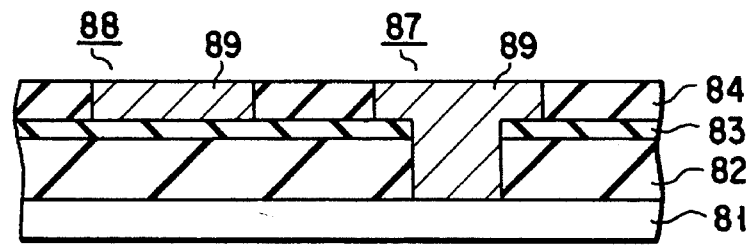

Lastly, as shown in FIG. 22E, the Al thin film 89 remaining on a broad area outside the wiring region is removed by a CMP method. After the buried wiring and contact wiring are formed, the C film 85 or the CMP stopper is ashed in an oxygen plasma and removed.

In the present embodiment, the CMP method is adopted to remove the unnecessary Al thin film 89. However, the CMP method may be replaced with a resist etch-back method, a mechanical polish method or a chemical polish method. It is desirable that the lower interlayer insulating film be flattened by a melt reflow method or a polish method. Furthermore, the C film 85 may be formed not only by the DC magnetron sputtering method but also by a CVD method.

EXAMPLE 11

FIGS. 23A to 23E are cross-sectional views showing steps of a buried wiring forming process according to an eleventh embodiment of the present invention. In this embodiment, after a contact hole is formed, a conductive film of, e.g. W is buried therein to form buried wiring.

As is shown in FIG. 23A, a PSG film 92 is formed by CVD as an interlayer insulating film on a single-crystal silicon substrate 91 with direction (100) of plane. The thickness of the PSG film 92 is, e.g. 0.8 μm. An $Si_3N_4$ film 93 having a thickness of 0.1 μm is formed by CVD as an etching stopper film on the PSG film 92. Although the thickness of the $Si_3N_4$ film 63 is set at 0.1 μm, it may be less than 0.1 μm if etching selectivity for an upper film is obtained.

Subsequently, an SiO$_2$ film 94 having the same thickness (0.3 μm) as a wiring layer is formed on the Si$_3$N$_4$ film 93 by normal-pressure CVD. A contact hole 95 is formed by means of lithography and reactive ion etching. As is shown in FIG. 23B, W is selectively buried in the contact hole 95 to form a W film 96. In the present embodiment, in order to reduce the contact resistance, W is buried up to a higher level than the Si$_3$N$_4$ film 93. However, W may be on the same level or lower than the Si$_3$N$_4$ film 93.

Thereafter, as shown in FIG. 23C, a resist pattern 97 is formed and the SiO$_2$ film 94 is etched by reactive ion etching to form a wiring groove 98. The gas used for the etching should be a gas capable of obtaining selectivity between the SiO$_2$ film 94 and the Si$_3$N$_4$ 93, e.g. a mixture gas of fluorocarbon and CO.

Further, as shown in FIG. 23D, the resist pattern 97 is ashed in an oxygen plasma and removed, following which an Al thin film 99 is formed by a DC magnetron sputtering method without heating. Thereafter, heat treatment is performed on the bottom surface of the substrate in the same vacuum as used for the sputtering, while controlling formation of a natural oxide film by use of a halogen lamp or the like. Thus, the Al thin film 99 is buried.

Lastly, as shown in FIG. 23E, the Al thin film 99 located outside the wiring region is removed by a chemical mechanical polishing (CMK) method.

In the present embodiment, W is used as material buried in the contact hole. However, another kind of conductive film, e.g. a polysilicon film, may be substituted. The W material may be buried in the contact hole after the PSG film 92, contact hole 95, Si$_3$N$_4$ film 93, SiO$_2$ film 94 and wiring groove 98 are formed in this order. Moreover, a silicide film such as TiSi$_2$ film may be formed on the surface of the substrate.

A device is formed below the interlayer insulating film, although this is not mentioned in the eighth embodiment to the present embodiment.

In the eighth embodiment to the present embodiment, the PSG film is used as a lower interlayer insulating film, the Si$_3$N$_4$ film is used as a stopper, and the SiO$_2$ film is used as an upper interlayer insulating film. However, any combination of other insulating films such as a BPSG film, a silicon oxide film, a BN film, a polyimide film, a plasma oxide film and a plasma nitride film may be used if such a combination permits selective etching.

Besides, if three or four wiring layers are laminated, interlayer insulating films, etc. are formed at temperatures below a melting point of formed wiring. For example, multilayer wiring can be obtained by using a plasma TEOS film as a lower interlayer insulating film, using a plasma nitride film as a stopper and using a plasma TEOS film as an upper interlayer insulating film.

Furthermore, the eighth embodiment to the present embodiment relate to the case where Al is used as wiring material. However, other metals such as an Al alloy, Cu, Ag, Au and Pt may be used.

EXAMPLE 12

FIGS. 24A to 24E are cross-sectional views showing steps of a buried wiring forming process according to a twelfth embodiment of the present invention. In this embodiment, a material, such as Cu, tending to easily diffuse into a silicon oxide film, is used as wiring material. The diffusion is prevented by using a barrier metal such as Nb.

Figure 24A:
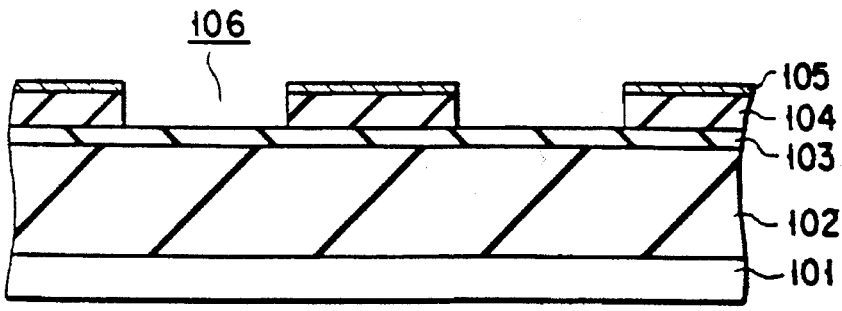
FIGS. 24A to 24E are cross-sectional views showing steps of a buried wiring forming process according to a twelfth embodiment of the present invention.

As is shown in FIG. 24A, a plasma TEOS (hereinafter "P-TEOS") film 102 is formed by CVD as an interlayer insulating film on a single-crystal silicon substrate 101 with direction (100) of plane. The thickness of the P-TEOS film 102 is, e.g. 0.3 μm. A plasma Si$_3$N$_4$ (hereinafter "P-Si$_3$N$_4$) film 103 having a thickness of 0.1 μm is formed by CVD as an etching stopper film on the P-TEOS film 102. A plasma TEOS (hereinafter "P-TEOS") film 104 having a thickness of 3 μm is formed on the P-Si$_3$N$_4$ film 103.

After a carbon film 105 is formed as a stopper for CMP by sputtering, a wiring groove 106 is formed by means of lithography and reactive ion etching (RIE). The etching gas used at this time is a gas capable of obtaining selectivity between the P-TEOS film and P-SiN$_3$ film, e.g. a mixture gas of fluorocarbon and CO. Thereafter, the resist pattern formed by the lithography is ashed by a down-flow ashing method.

Figure 24B:
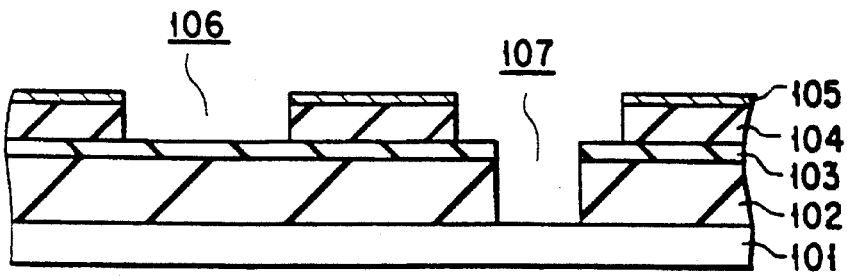

Following this, as shown in FIG. 24B, a contact hole 107 is formed by means of lithography and RIE.

Figure 24C:
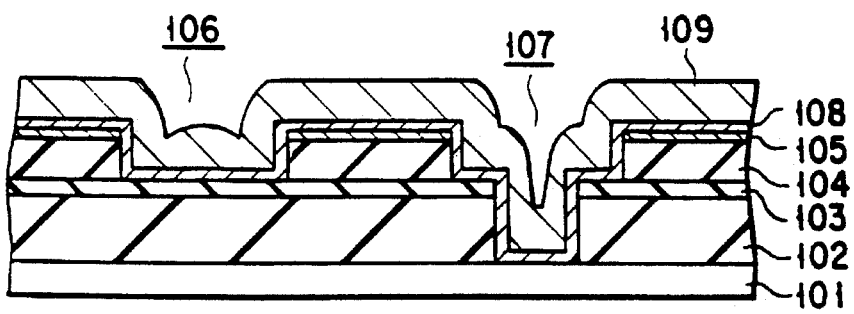

Thereafter, as shown in FIG. 24C, an Nb film 108 which will become a barrier metal film is formed by a DC magnetron sputtering method without heating. Then, a Cu film 109 which will become wiring is formed. In the present embodiment, the Cu film 109 is formed by sputtering, but it is better to adopt a collimation method. Thereafter, heat treatment is performed on the bottom surface of the substrate in the same vacuum as used for the sputtering, while controlling formation of a natural oxide film on the Cu surface by use of a halogen lamp or the like. Thus, the Cu film 109 is buried.

Figure 24D:
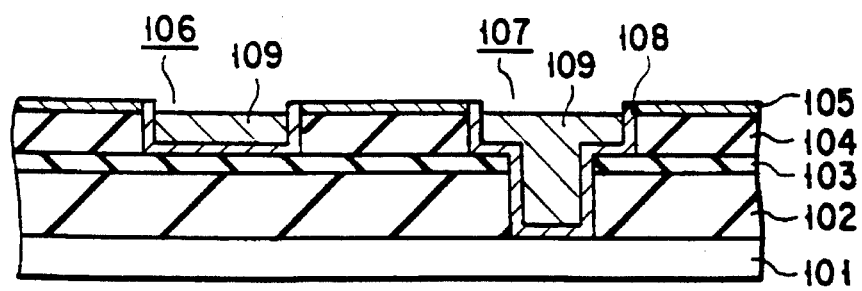
Figure 24E:
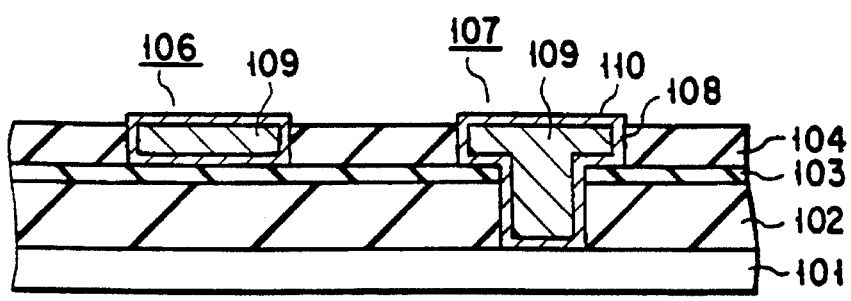

Furthermore, as shown in FIG. 24D, the Cu film 109 and Nb film 108 located outside the wiring region are removed by CMP. In the next step shown in FIG. 24E, a Nb film 110 functioning as a barrier metal is formed on the surface of the Cu film 109 by a DC magnetron sputtering method in order to prevent diffusion of Cu. Then, the unnecessary Nb film 110 on the carbon film 105 is removed by CMP. Lastly, the carbon film 105 used as stopper for CMP is removed by an oxygen ashing method or oxygen ion etching method. Thus, the buried wiring and contact wiring are completed.

In the case where wiring layers are laminated, the process from the formation of the interlayer insulating film 104 to the formation of the groove wiring is repeated.

In this embodiment, Nb is used as a barrier metal, but any material having a barrier function and improving wettability with wiring may be used.

EXAMPLE 13

FIGS. 25A to 25E are cross-sectional views showing steps of a buried wiring forming process according to a 13th embodiment of the present invention. In this embodiment, buried wiring is formed after W is selected buried in a contact hole.

Figure 25A:
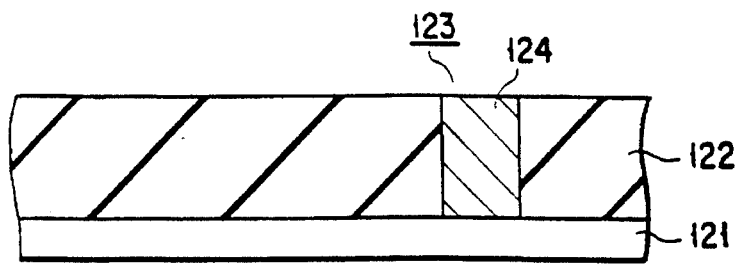
FIGS. 25A to 25E are cross-sectional views showing steps of a buried wiring forming process according to a 13th embodiment of the present invention.

As is shown in FIG. 25A, a P-TEOS film 122 is formed by CVD as an interlayer insulating film on a silicon substrate 121. The thickness of the P-TEOS film 122 is, for example, 0.3 μm. Then, a contact hole 123 is formed by means of lithography and RIE, and W is selectively buried in the contact hole 123. Thus, a W film 124 is formed.

Figure 25B:
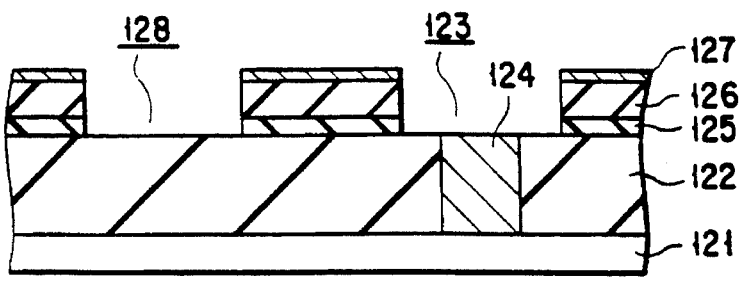

After a P-Si$_3$N$_4$ film 125 having a thickness of 0.1 μm is formed by CVD, as shown in FIG. 25B, a P-TEOS film 126 having the same thickness (0.3 μm) as a wiring layer is formed. Following this, a carbon film 127 used as a stopper for CMP is formed and a wiring groove 128 is formed by lithography and RIE. The gas used for the etching is a gas capable of obtaining selectivity between the P-TEOS film 122 and P-SiN$_3$ film 125, e.g. a mixture gas of fluorocarbon and CO. Thereafter, the resist pattern formed by the lithography is ashed by a down-flow ashing method.

Figure 25C:
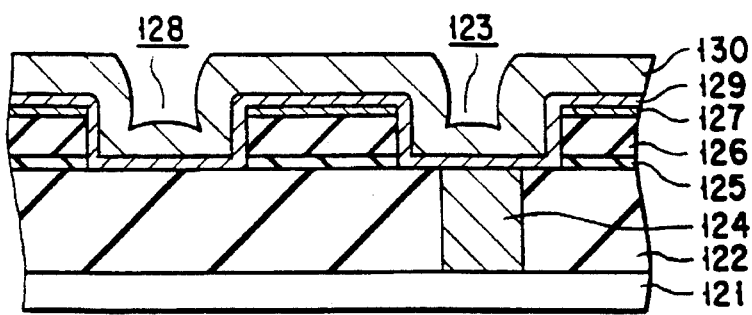

In the next step as shown in FIG. 25C, an Nb film 129 which will become a barrier metal film is formed by a DC magnetron sputtering method without heating. Then, a Cu film 130 which will become wiring is formed. In the present embodiment, the Cu film 130 is formed by sputtering, but it is better to adopt a collimation method. Thereafter, heat treatment is performed on the bottom surface of the substrate in the same vacuum as used for the sputtering, while controlling formation of a natural oxide film on the Cu surface by use of a halogen lamp or the like. Thus, the Cu film 130 is buried.

Furthermore, a Nb film 131 functioning as a barrier metal is formed by a DC magnetron sputtering method in order to prevent diffusion of Cu into an insulating film when the insulating film is formed on the surface of the Cu film 130. Then, the unnecessary Nb film 129 on the carbon film 127 is removed by CMP.

Figure 25D:
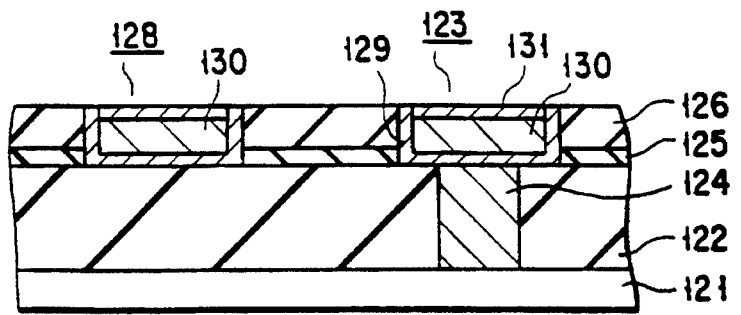

Subsequently, the Cu film 109 outside the wiring region is removed by CMP, and the carbon film 127 used as stopper for the CMP is removed by an oxygen ashing method. Thus, buried wiring as shown in FIG. 25D is completed.

Figure 25E:
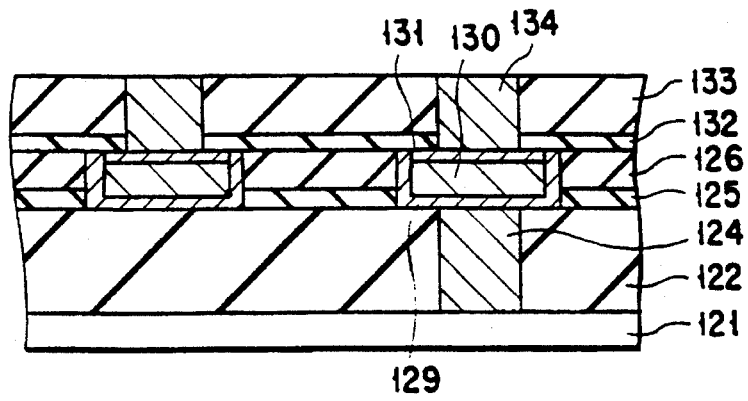

In the case where wiring layers are laminated, an etching stopper film 132 and an interlayer insulating film 133 such as a P-TEOS film are formed, as shown in FIG. 25E, and then a contact hole is formed by means of lithography and reactive ion etching (RIE). A conductive film 134 of, e.g. W is buried in the contact hole. This process is repeated.

EXAMPLE 14

FIGS. 26A to 26E are cross-sectional views showing steps of a buried wiring forming process according to a 14th embodiment of the present invention. In this embodiment, two or more buried wiring layers are formed by using a P-TEOS film and a P-Si$_3$N$_4$ film.

Figure 26A:
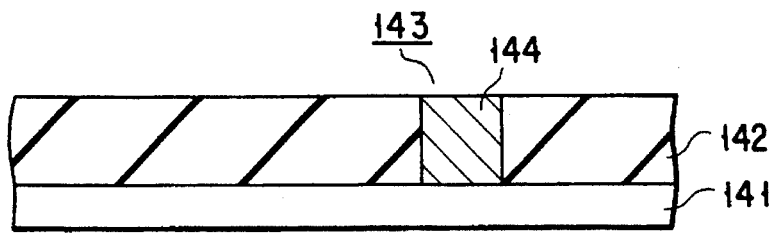
FIGS. 26A to 26E are cross-sectional views showing steps of a buried wiring forming process according to a 14th embodiment of the present invention.

At first, as shown in FIG. 26A, a P-TEOS film 142 having a thickness of 0.3 μm is formed by CVD as an interlayer insulating film on a silicon substrate 141. Then, a contact hole 143 is formed by means of lithography and RIE, and W is selectively buried in the contact hole 143. Thus, a W film 144 is formed.

Figure 26B:
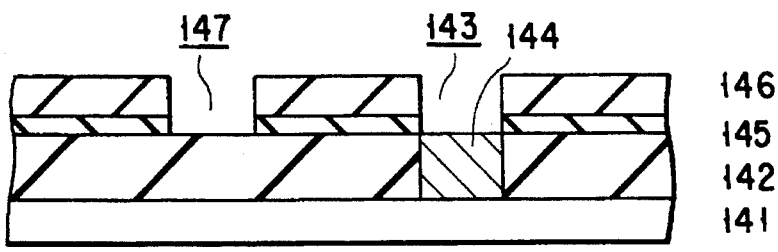

In the next step shown in FIG. 26B, after a P-Si$_3$N$_4$ film 145 having a thickness of 0.1 μm is formed by CVD as a stopper, a P-TEOS film 146 having the same thickness (0.3 μm) as a wiring layer is formed. Following this, a wiring groove 147 is formed by lithography and RIE. The gas used for the etching is a gas capable of obtaining selectivity between the P-TEOS film 142 and P-Si$_3$N$_4$ film 145, e.g. a mixture gas of fluorocarbon and CO. Thereafter, the resist pattern formed by the lithography is ashed by a down-flow ashing method.

Subsequently, an Al film which will become wiring is formed by a DC magnetron sputtering method on the entire surface of the resultant structure. Then, heat treatment is performed on the bottom surface of the substrate in the same vacuum as used for the sputtering, while controlling formation of a natural oxide film on the Al surface by use of a halogen lamp or the like. Thus, the Al film is buried.

Figure 26C:
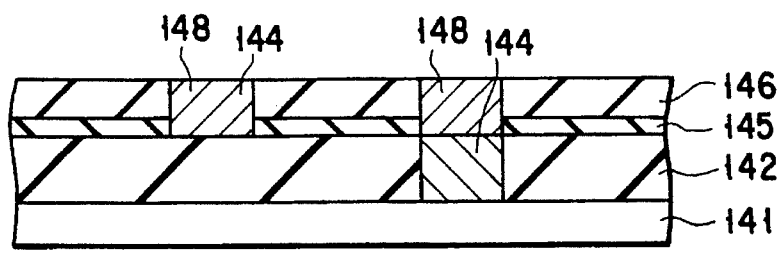
Figure 26D:
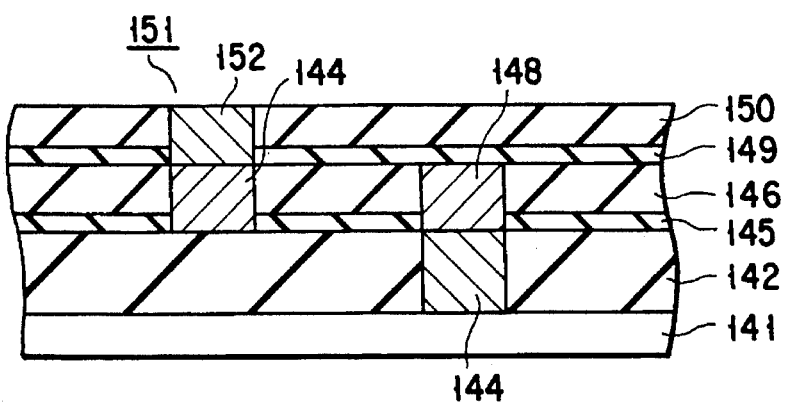

Furthermore, the Al film outside the wiring region is removed by CMP, as shown in FIG. 26C, and a first buried wiring layer 148 is completed. In the next step shown in FIG. 26D, a plasma Si$_3$N$_4$ film 149 and a plasma TEOS film 150 functioning as an interlayer insulating film are successively formed, and a contact hole 151 is formed by means of lithography and RIE. Then, W is selectively buried in the contact hole 151 to form a W film 152.

Figure 26E:
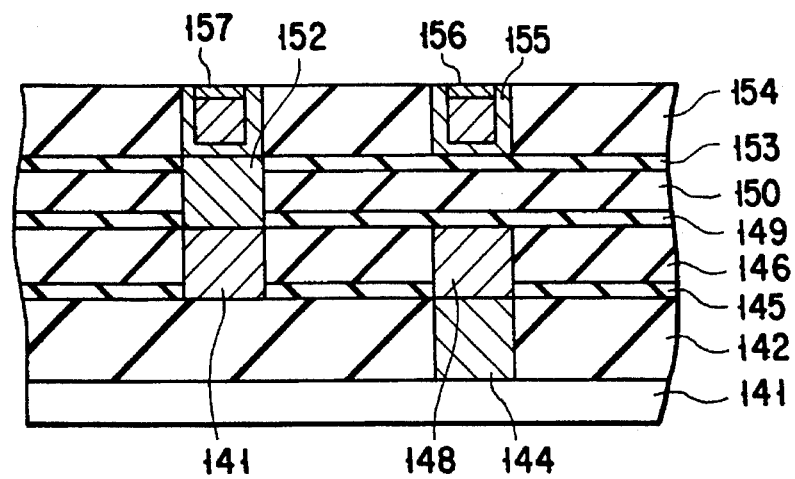

In order to form a second buried wiring layer, a P-Si$_3$N$_4$ film 153 functioning as a stopper and a P-TEOS film 154 are successively formed, as shown in FIG. 26E, and a wiring groove is formed by means of lithography and RIE. Thereafter, the P-Si$_3$N$_4$ film 153 is removed by RIE.

Next, a Nb film 151 functioning as a barrier metal is formed on the entire surface of the resultant body by a DC magnetron sputtering method without heating, and then a Cu film 156 which will become wiring is formed on the entire surface of the resultant body. In the present embodiment, the Cu film 156 is formed by sputtering, but it is better to adopt a collimation method. Thereafter, heat treatment is performed on the bottom surface of the substrate in the same vacuum as used for the sputtering, while controlling formation of a natural oxide film by use of a halogen lamp or the like. Thus, the Cu film 156 is buried in the groove.

After a Nb film 157 functioning as a barrier metal is formed by a DC magnetron sputtering method in order to prevent diffusion of contaminant in the surface of the Cu film 156, unnecessary Nb films 155 and 157 are removed by a CMP method. Finally, the Cu film 156 outside the wiring region is removed by CMP, and a second buried wiring layer is completed. If three or four buried layers are laminated, this process is repeated in a non-specified order.

In the present embodiment, the contact hole (via hole) is formed in the intermediate layer. However, if the intermediate layer is used as wiring, substitution for the contact hole (via hole) is achieved by selectively removing the P-Si$_3$N$_4$ film.

The processes for forming wiring have been described above. Even if a device is formed below the interlayer insulating film, the groove wiring can be formed by the same processes.

EXAMPLE 15

FIGS. 27A to 27G are cross-sectional views showing steps of a semiconductor device fabricating process according to a 15th embodiment of the present invention.

Figure 27A:
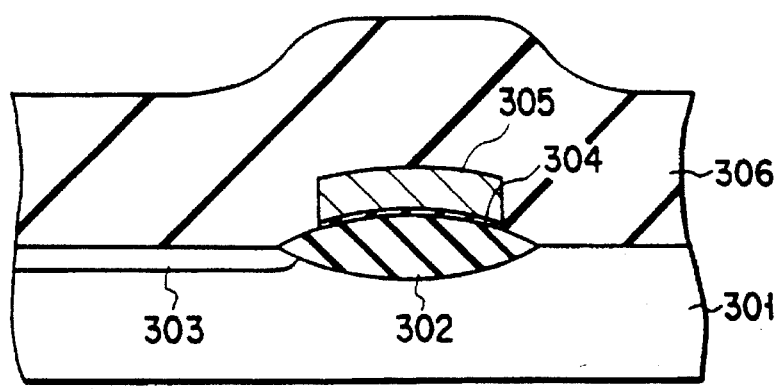
FIGS. 27A to 27I are cross-sectional views showing steps of a semiconductor device fabricating process according to a 15th embodiment of the present invention.

As is shown in FIG. 27A, after a field oxide film 302 is formed on a surface portion of a semiconductor substrate 301, a diffusion layer 303, a gate oxide film 304 and a gate electrode 305 are formed. Then, a first interlayer insulating film 306 is formed on the entire surface of the resultant structure.

The first interlayer insulating film 306 may be, for example, an SiO$_2$ film formed by CVD, an SiO$_2$ film formed by CVD and including impurities such as B or P, an SiO$_2$ film formed by plasma CVD, an SiO$_2$ film formed by plasma CVD with use of a TEOS-based gas as a source gas, an SiO$_2$ film formed by plasma CVD and containing F for reducing a dielectric constant of an insulating film, or a laminated structure of these.

Figure 27B:
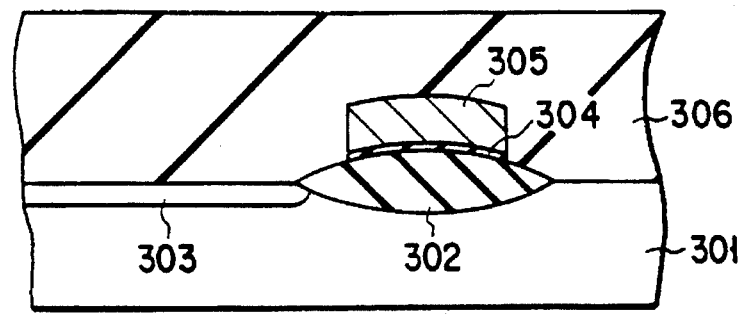
Figure 27C:
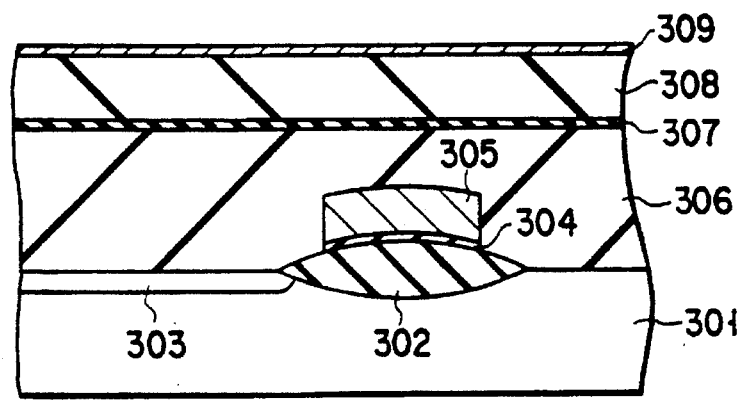

Subsequently, the surface of the first interlayer insulating film 306 is flattened, as shown in FIG. 27B. The method of flattening the film 306 is, for example, a CMP method, a resist etch-back method, etc. Then, as shown in FIG. 27C, the following three films are formed successively: a first etching stopper film 307 formed of an insulating film functioning as an etching stopper at the time of forming a wiring groove, a second interlayer insulating film 308 for providing the wiring groove, and a second etching stopper film 309 functioning as an etching stopper at the time of forming a through-hole in a subsequent step and also functioning as an etching stopper at the time of etching a wiring layer.

The second interlayer insulating film 308 is formed of an SiO$_2$-based material, like the first interlayer insulating film 306. It is necessary that the first etching stopper film 307 be different in material from the first interlayer insulating film 306 and the second interlayer insulating film 308. For example, the first etching stopper film 307 is formed of SiN. The SiN may be produced by plasma CVD.

The material of the second etching stopper film 309 must have such properties as to function as a stopper at the time of forming a through-hole and also such properties as to function as an etching stopper at the time of etching the wiring layer. The material having such properties is, for example, carbon of 100 nm or less. A lamination of SiN and carbon can also be used.

Figure 27D:
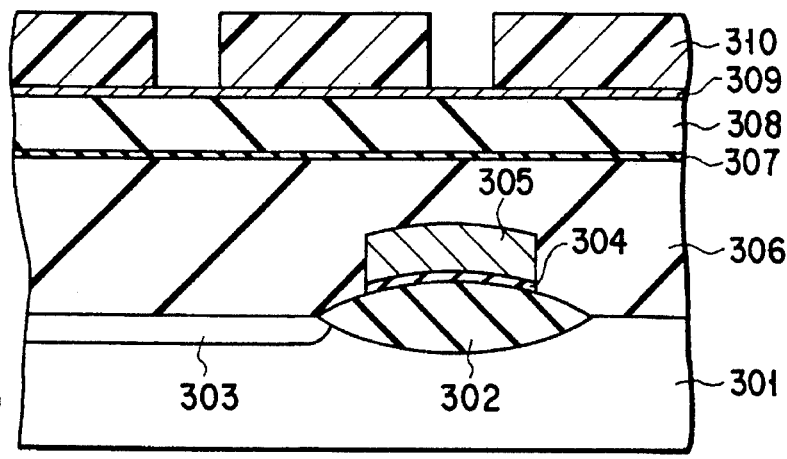
Figure 27E:
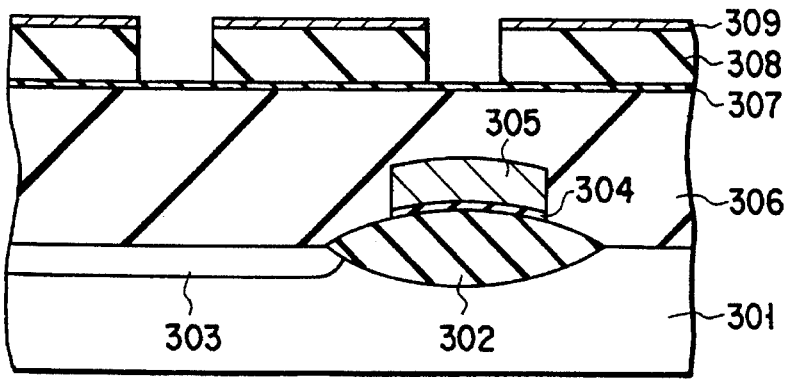

Subsequently, as shown in FIG. 27D, a resist pattern 310 for forming wiring is formed. With the resist pattern 310 used as a mask, the second etching stopper 309 and second interlayer insulating film 308 are etched, as shown in FIG. 27E. Then, the resist pattern 310 is removed. Thus, wiring grooves are formed in the second interlayer insulating film 308. The second etching stopper film 309 and second interlayer insulating film 308 may be etched continuously by using a fluorocarbon-based gas, or may not be etched continuously. The resist pattern 310 is removed by, e.g. O$_2$ ashing. Moreover, when a carbon film is used as second etching stopper film 309, the resist pattern 310 is removed by wet etching using, e.g. a solution of sulfuric acid and aqueous hydrogen peroxide (the ratio of the former to the latter is about 3:2). Furthermore, if a metal film is exposed on the underlayer, down-flow ashing, for example, may be adopted to remove the resist pattern 310.

Figure 27F:
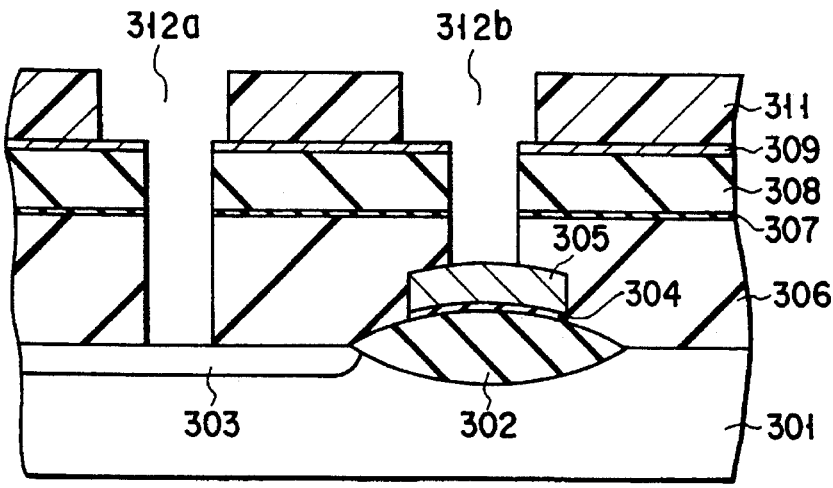

Subsequently, as shown in FIG. 27F, after a resist pattern 311 is formed, the resist pattern 311 is used as a mask to etch the first etching stopper film 307 and first interlayer insulating film 306, thereby forming through-holes 312a and 312b. At this time, owing to a stepped structure of the underlayer, the through-hole 312b on the gate electrode 305 is shallow and the through-hole 312a on the diffusion layer 303 is deep.

If the resist pattern 311 is formed so as not to overlap the wiring grooves, as shown in FIG. 27F, the through-holes 312a and 312b with the same widths as the associated wiring grooves can formed because of the presence of the second etching stopper 309, even if the resist pattern 311 is misaligned in the lateral direction (width direction).

Figure 27G:
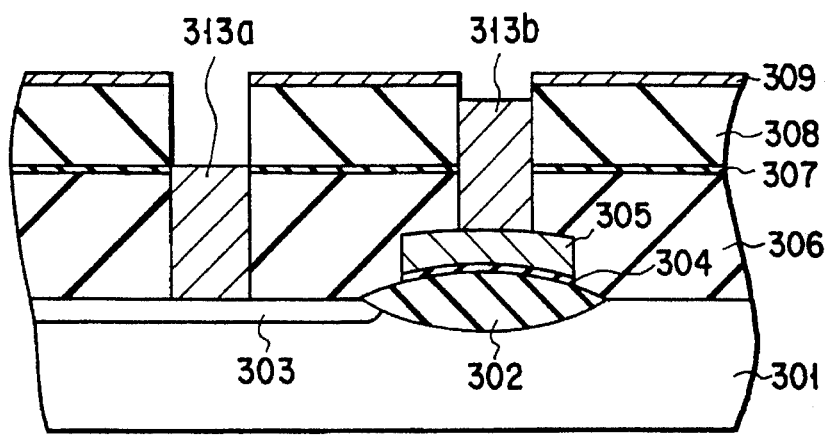

After the resist pattern 311 is removed, as shown in FIG. 27G, contact layers 313a and 313b are formed by a selective growth method such as selective CVD or electroless plating, so that the deeper through-hole may be filled with the material of the contact layers. In this case, the contact layer 313b overflows from the shallower through-hole and buries part of the wiring groove. The height (thickness) of both contact layers 313a and 313b is equal at any portion.

Figure 27H:
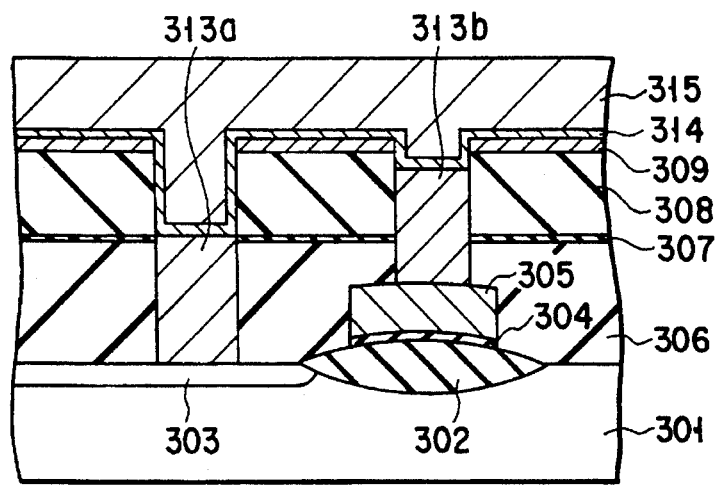

Subsequently, as shown in FIG. 27H, a wiring layer 315 is formed after a diffusion prevention film 314 is formed. The material of the diffusion prevention film 314 may be, e.g. Al, Ti, TiN, Nb, W, a lamination of these, or an alloy of these. On the other hand, the material of the wiring layer 315 may be, e.g. Cu, Ag, Au, or an alloy of these. Specifically, a material having a lower resistance than the contact layers is used.

Figure 27I:
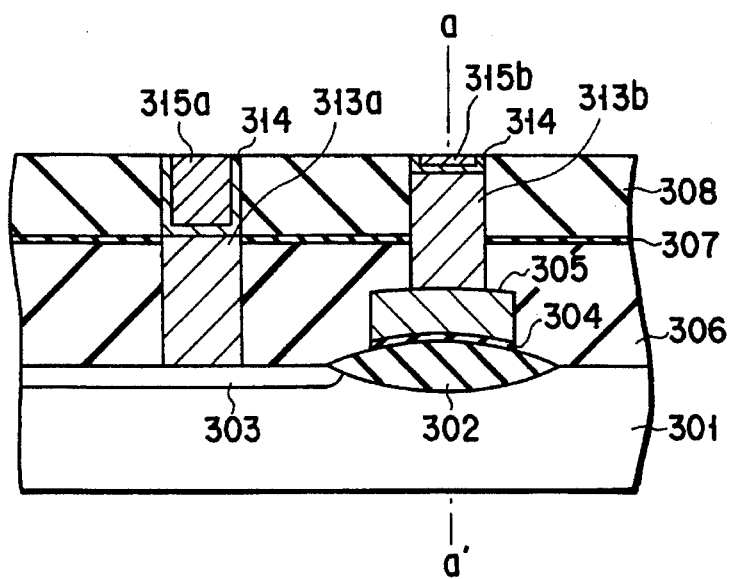

In the next step shown in FIG. 27I, the diffusion prevention layer 314 and wiring layer 315 located outside the wiring grooves are etched away by CMP, etc. Thus, the surface of the resultant structure is flattened, and the wirings 315a and 315b are formed above the contact layers 313a and 313b.

FIG. 28 is a cross-sectional view taken along line a–a' in FIG. 27I. The contact layer 313b overflows from the through-hole. As a result, a contact area between the contact layer 313b and the wiring 315b increases and the contact resistance can be decreased.

According to this embodiment, the contact layers 313a and 313b are formed up to a given level below a maximum level. Then, the wiring layer 315 which will become wirings 315a and 315b is formed on the entire surface of the resultant structure. The entire surface of the wiring layer 315 is etched (or polished) to form flat wirings 315a and 315b. Thus, an interlayer insulating film to be formed in a subsequent step can be flattened easily.

Furthermore, in the present embodiment, the contact layers 313a and 313b have the same thickness and the resistance of the wirings 315a and 315b is lower than that of the contact layers 313a and 313b. Accordingly, the insides of the through-holes and wiring grooves (openings) can have the same resistance and reliability.

FIGS. 29A and 29B are cross-sectional views showing modifications of the 15th embodiment. In these modifications, the contact layers 313a and 313b are formed so that the shallower through-hole may be filled with the contact layer. FIG. 29A is a cross-sectional view corresponding to FIG. 27I, and FIG. 29B is a cross-sectional view corresponding to FIG. 28 as well as a cross-sectional view taken along line b–b' in FIG. 29A.

EXAMPLE 16

FIG. 30 is a cross-sectional view showing schematically the structure of a main portion of a semiconductor device according to a 16th embodiment of the invention.

In the process of fabricating this semiconductor device, at first, a wiring groove is formed in a surface portion of an SiO$_2$-based interlayer insulating film 321. The interlayer insulating film 321 may be, for example, an SiO$_2$ film formed by CVD, an SiO$_2$ film formed by CVD and including impurities such as B or P, an SiO$_2$ film formed by plasma CVD, an SiO$_2$ film formed by plasma CVD with use of a TEOS-based gas as a source gas, or an SiO$_2$ film formed by plasma CVD and containing F at a concentration of 0.1 to 10%.

Subsequently, those portions of the interlayer insulating film 321 at the side and bottom portions of the wiring groove are nitrided by N$_2$ plasma treatment, thereby forming a diffusion prevention film 322 of SiO$_x$N$_z$. Since the diffusion prevention film 322 is formed by nitriding, the manufacturing steps can be simplified, as compared to other processes. Moreover, since a high-resistance material does not enter the wiring groove, an increase in resistance can be prevented.

Following this, wiring surrounded with a diffusion prevention film 323 made of a conductive material is formed. Thereafter, in order to perfectly prevent diffusion from the wiring surface, a diffusion prevention film 325 of an insulating material is formed on the entire surface of the laminated body. The diffusion prevention film 325 will serve as a stopper film at the time of forming a through-hole in a subsequent step.

According to the present embodiment, since the wiring 324 is covered with the three diffusion prevention films 322, 323 and 325, diffusion of the constituent substance of the wiring 324 can be prevented perfectly.

EXAMPLE 17

FIGS. 31A to 31M are cross-sectional views showing steps of a buried wiring forming process according to a 17th embodiment of the present invention.

Figure 31A:
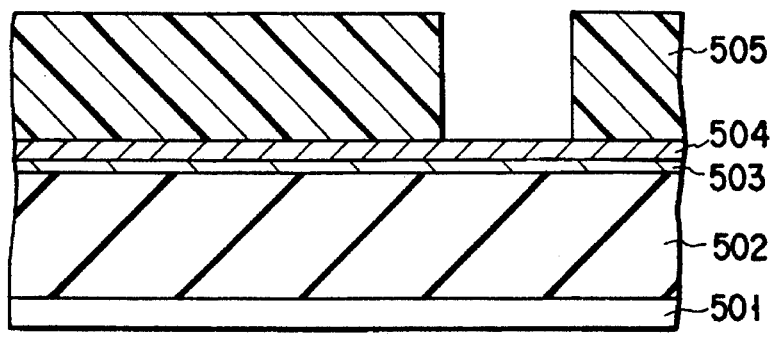

At first, as is shown in FIG. 31A, an interlayer insulating film 502 is formed on a semiconductor substrate 501 such as an Si substrate on which a desired device (not shown) is formed. The interlayer insulating film 502 may be, for example, an undoped $SiO_2$ film formed by CVD, an $SiO_2$ film containing impurities such as B or P, an $SiO_2$ film formed by plasma CVD, or an $SiO_2$ film formed with use of a TEOS-based gas as a source gas. Alternatively, the interlayer insulating film 502 may be doped with fluorine in order to decrease a dielectric constant thereof.

Then, the surface of the interlayer insulating film 502 is plasma-nitrided to form a plasma nitride layer 503 on the film 502. In a process of forming the plasma nitride layer 503, for example, the interlayer insulating film 502 is treated for 3 to 60 minutes in a nitrogen plasma at a pressure of $10^{-3}$ to 10 Torr at a chamber temperature of 350° to 450° C. Thus, the layer of $SiO_yN_z$ is formed. In order to prevent the dielectric constant of the interlayer insulating film 502 from increasing, it is desirable that the thickness of the $SiO_yN_z$ layer, etc. be set at several to several-ten nm (the same applies to plasma nitride layers mentioned below).

The plasma nitride layer 503 functions to prevent the interlayer insulating film 502 from absorbing water. In addition, the plasma nitride layer 503 can function to prevent outward diffusion of a dopant if the dopant is contained in the interlayer insulating film 502 in order to reduce a parasitic capacitance.

Subsequently, an etching stopper 504 is formed, which is used as an etching stopper when a metal film having no flatness or selectivity, which will be formed in a later step on the plasma nitride film 503, is removed by resist etch-back, CMP, etc. A resist pattern 505 for forming a contact hole is formed on the stopper film 504.

It is better to use, e.g. a carbon (C) thin film as the stopper film 504. The stopper film 504 also functions to prevent reflection of exposure light at the time of forming a resist pattern in a subsequent step.

Figure 31B:
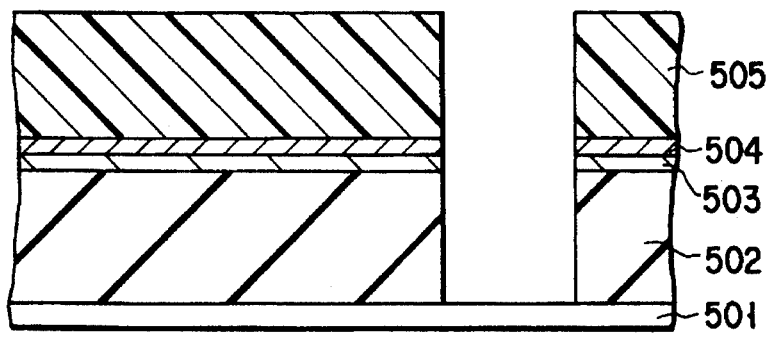

With the resist pattern 505 used as a mask, as shown in FIG. 31B, the stopper film 504, plasma nitride layer 503 and interlayer insulating film 502 are anisotropically etched to form a contact hole. In this case, the stopper film 504, plasma nitride layer 503 and interlayer insulating film 502 are anisotropically etched continuously, and a fluorocarbon-based gas, for example, is used as etching gas. The stopper film 504, plasma nitride layer 503 and interlayer insulating film 502 may be anisotropically etched discontinuously.

Figure 31C:
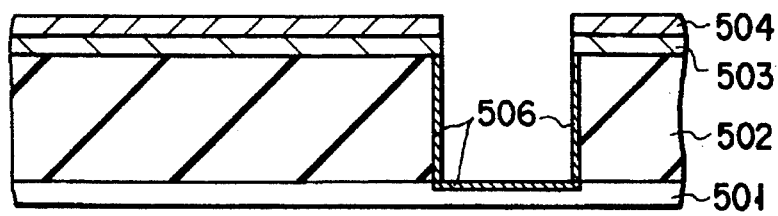

The resist pattern 505 is removed, as shown in FIG. 31C. The resist pattern 505 may be removed by ashing using $O_2$. If a C thin film is used as the stopper film 504, it is better to carry out wet etching using a solution of sulfuric acid and aqueous hydrogen peroxide (the ratio of the former to the latter is about 3:2). Furthermore, if a metal film is exposed on the underlayer, it is better to perform down-flow ashing using excited atoms or molecules taken out of a mixture gas plasma of a gas containing F (e.g. $CF_4$ gas) and a gas containing oxygen.

Subsequently, a plasma nitride layer 506 is formed on the bottom and side portions of the contact hole. Specifically, for example, the entire structure is annealed in an inert gas atmosphere at 100° to 500° C. to adequately evaporate water, and the plasma nitride layer 506 is formed continuously in a process similar to the process of forming the plasma nitride layer 503. It is desirable that the thickness of the plasma nitride layer 506 be small, e.g. several to ten nm, in order to prevent an increase of resistance of a metal film 507 to be buried in the contact hole in a subsequent step. If the bottom surface of the contact hole is made of, e.g. $TiSi_x$, $NiSi_x$, $CoSi_x$, etc., it is better to plasma-nitride this material and transform it to an electrically conductive alloy. Since the surface of the interlayer insulating film 502 at the side portion of the wiring groove is coated with the plasma nitride film 506, water absorption of the interlayer insulating film 502 can be prevented.

Figure 31D:
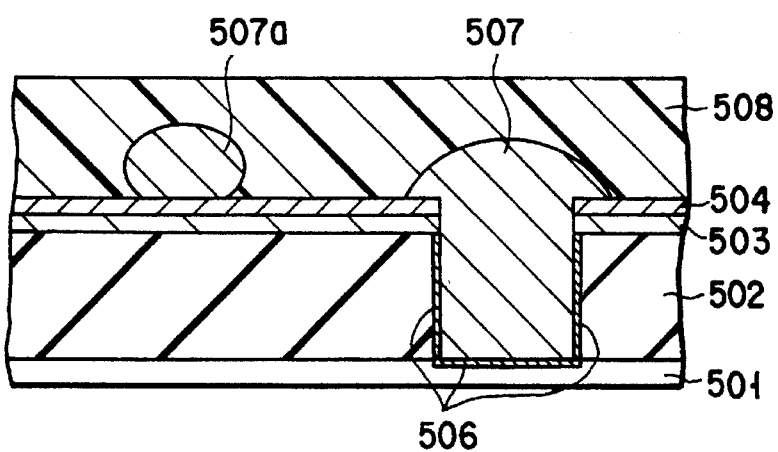

In the next step of FIG. 31D, a metal film 507 of W, Cu, etc. is deposited in the contact hole. In this case, a metal film 507a, which has no flatness or selectivity, is also formed outside the contact hole. In order to remove the metal film having no flatness or selectivity, a resist 508 is provided on the entire surface of the resultant structure. Since the plasma nitride layer 506 is formed on the bottom of the wiring groove, constituent atoms of the metal film 507 can be prevented from diffusing into the semiconductor substrate 501. Specifically, the plasma nitride layer 506 functions as a barrier metal.

Subsequently, in order to remove the metal film 507a with no flatness or selectivity, the resist 508 and metal film 507 are etched back at the same etching rate until the stopper film 504 is exposed. This flattening step may be carried out by means of CMP. Then, as shown in FIG. 31F, the stopper film 504 is removed. If a carbon thin film is used as the stopper film 504, it is better to remove the stopper film 504 by means of reactive ion etching (RIE) using oxygen as etchant or ashing using $O_2$.

After an interlayer insulating film 509 is formed, as shown in FIG. 31G, the surface of the insulating film 509 is plasma-nitrided to form a plasma nitride layer 510. Then, after a stopper film 511 is formed on the plasma nitride layer 510, a resist pattern 512 for forming a wiring groove is provided.

Figure 31H:
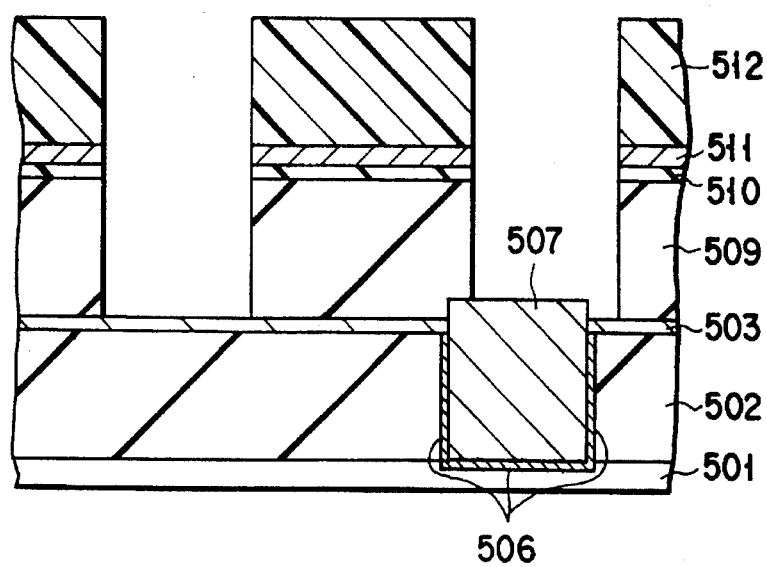

As is shown in FIG. 31H, with the resist pattern 512 used as a mask, the stopper film 511 and plasma nitride layer 510 are etched, and subsequently the interlayer insulating film 509 is etched. The etching of the interlayer insulating film 509 is made to cease at the plasma nitride layer 503 (etching-proof film).

Figure 31I:
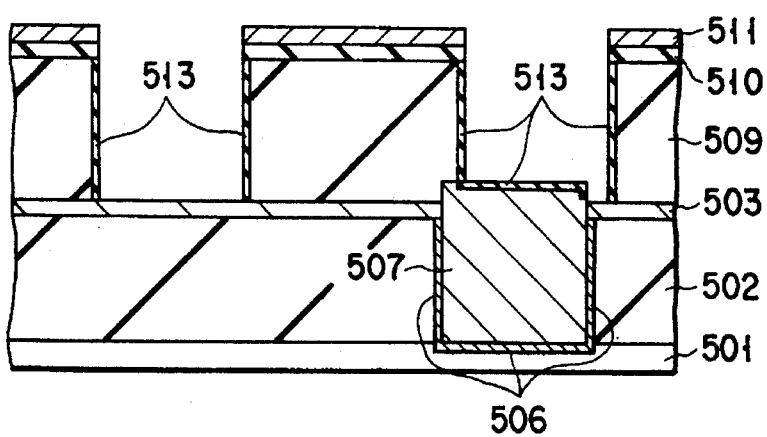

Furthermore, as shown in FIG. 31I, after the resist pattern 512 is removed by down-flow ashing, the surface of the interlayer insulating film 509 at the side surface of the wiring groove is plasma-nitrided, thereby forming a plasma nitride layer 513. By virtue of the plasma nitride layer 513, water absorption of the interlayer insulating film 509 can be prevented. Although the surface of the metal film 507 in the contact hole is nitrided in this step, the conductivity of the metal film 507 is not lost since the plasma nitride layer 513 is an electrically conductive alloy.

Figure 31J:
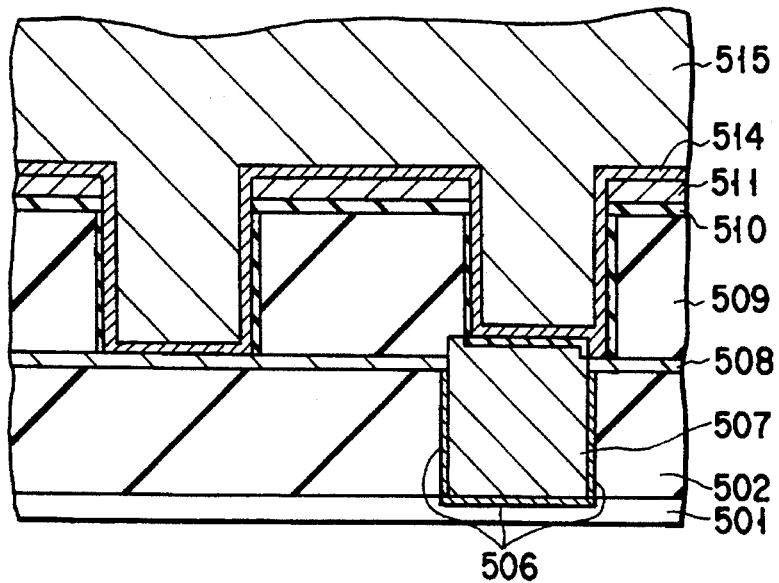

In the next step shown in FIG. 31J, a diffusion prevention film 514 made of, e.g. Nb, V, W, Mo, Al, Ti, TiN, a lamination of these, or an alloy of these is formed on the entire surface of the resultant structure by a DC magnetron sputtering method. It is desirable that the thickness of the diffusion prevention film 514 be about several nm to 30 nm from the standpoint of prevention of an increase in wiring resistance.

Thereafter, a wiring material layer 515 made of, e.g. Au, Ag, Cu or an alloy of these is deposited. Specifically, the wiring material layer 515 may be formed by sputtering, CVD or plating. For example, it is better to sputter a wiring material film by using a collimator, to sputter in an inert gas atmosphere at $10^{-4}$ to $10^{-10}$ Torr at a distance between a target and a substrate, or to ionize a metal or particles of the wiring material and apply a bias to the substrate. By these methods, the wiring material film 515 can be anisotropically deposited. Then, in order to completely bury the wiring material film 515 in the groove, it is possible to reflow the wiring material 515 under the conditions that the wiring material 515 is not oxidized, no diffusion occurs to the peripheral insulating film and no material is sucked up from the groove.

Figure 31K:
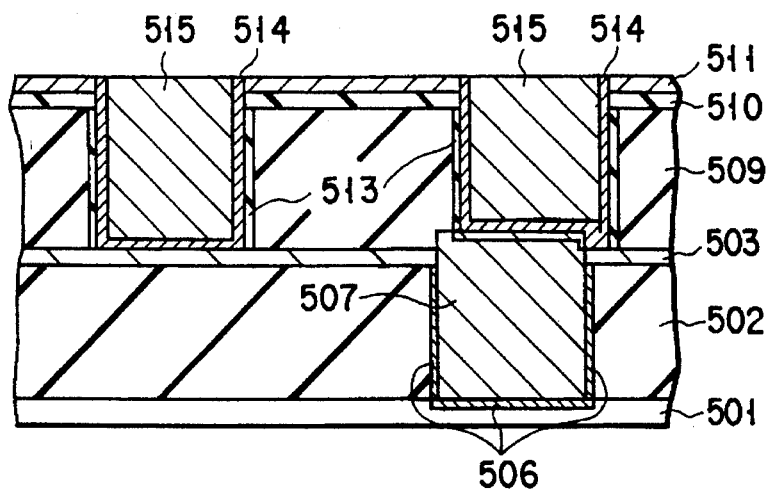
Figure 31L:
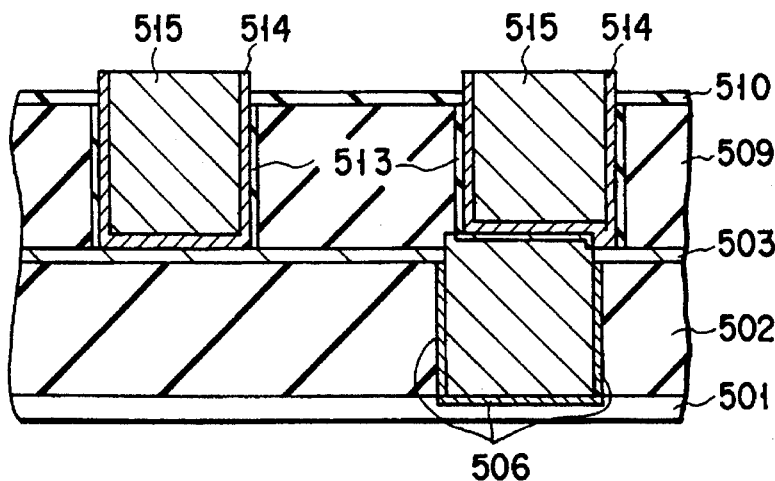

In the next step shown in FIG. 31K, the wiring material film 515 and diffusion prevention film 514 are etched by a flattening technique such as CMP until the stopper film 511 is exposed. The stopper film 511 is then removed, as shown in FIG. 31L. If a carbon thin film is used as the stopper film 511, it is better to remove the carbon thin film by reactive ion etching (RIE) using oxygen.

Figure 31M:
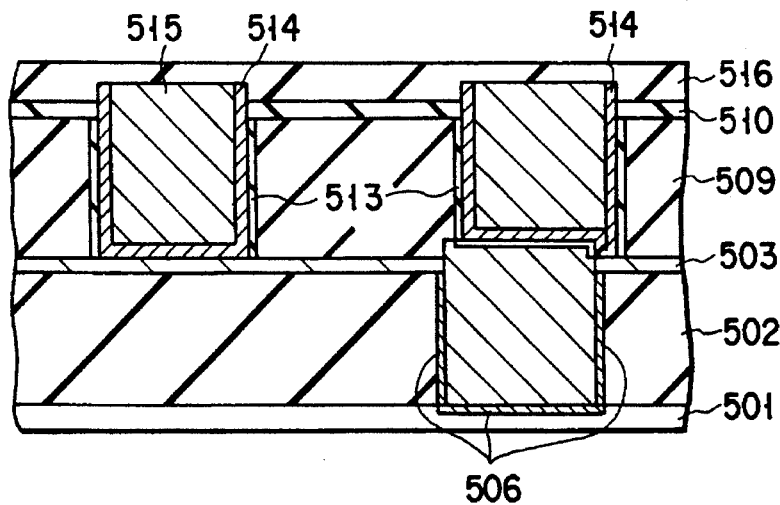

Lastly, as shown in FIG. 31M, a surface protection film 516 formed of an insulating film is provided on the entire surface of the resultant structure. Alternatively, a metal to be alloyed with Cu (i.e. oxidation/diffusion prevention film), such as Al, is formed on the entire surface to a thickness of 1 to 50 nm. The formed metal layer is heated, and a non-reaction portion of Cu and Al (i.e. outside wiring) is selectively removed, and an insulating film may be formed thereon.

If wiring layers are to be laminated, the process from the formation of the interlayer insulating film 502 as shown in FIG. 11A to the formation of the groove wiring is repeated.

As has been described above, according to the present invention, by using the plasma nitride layer, water absorption of the interlayer insulating film and diffusion of constituent atoms of the wiring layer can be prevented without narrowing the wiring groove, and therefore the reliability can be enhanced.

FIG. 32 is a graph showing an analysis result in the case where the surface of a silicon oxide film was subjected to nitrogen plasma treatment. From FIG. 32, it is understood that nitrogen is contained in that portion of the silicon nitride film, which extends from the surface to a depth of 10 nm. Specifically, it was confirmed that a plasma silicon nitride film is formed at a surface portion of the Si insulating film. Such a silicon oxide film having a plasma silicon nitrogen film in a surface portion thereof was examined, and it was confirmed that the plasma silicon nitride film functions as an etching-proof film at the time of etching the silicon oxide film, that the plasma silicon nitride film functions as a diffusion prevention film for preventing diffusion of wiring material, and that the plasma silicon nitride film functions as a water absorption prevention film for a silicon oxide film.

EXAMPLE 18

FIGS. 33A to 33I are cross-sectional views showing steps of a buried wiring forming process according to an 18th embodiment of the present invention.

Figure 33A:
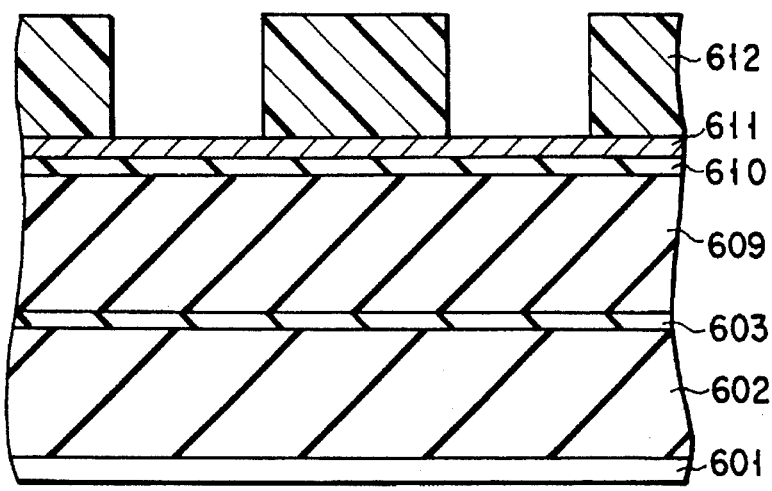
FIGS. 33A to 33I are cross-sectional views showing steps of a buried wiring forming process according to an 18th embodiment of the present invention.

At first, as shown in FIG. 33A, an interlayer insulating film 602 is formed on a semiconductor substrate on which a desired device (not shown) is formed. The surface of the interlayer insulating film 602 is subjected to nitrogen plasma treatment to form a plasma nitride layer 603 such as an SiON film on the insulating film 602. The interlayer insulating film 602 is, for example, an $SiO_2$ film or an $SiO_2$ film containing impurities.

After an interlayer insulating film 609 is formed on the plasma nitride layer 603, a plasma nitride layer 610 is formed on the surface of the interlayer insulating film 609. Then, after a stopper film 611 functioning as an etching-proof film is formed by CMP, a resist pattern 612 for forming a wiring groove is formed. The interlayer insulating film 609 is, for example, an $SiO_2$ film or an $SiO_2$ film containing impurities. The stopper film 611 is, for example, a carbon thin film.

Figure 33B:
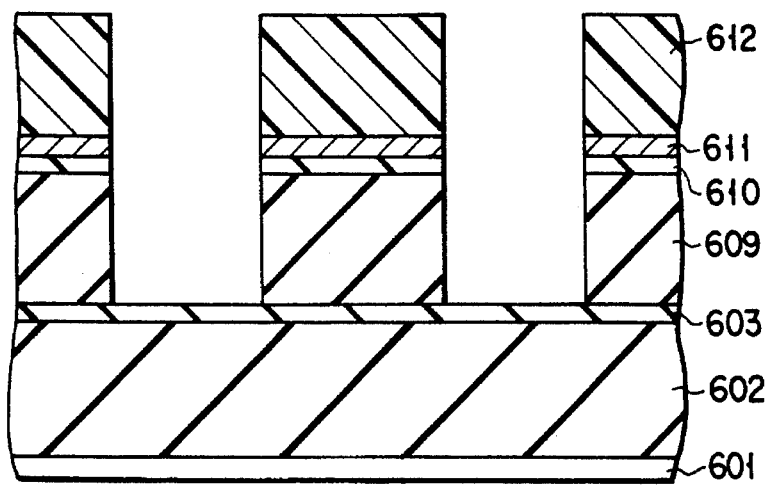

Subsequently, as shown in FIG. 33B, with the resist pattern 612 used as a mask, two-step etching is carried out: the stopper film 611 and plasma nitride layer 610 are etched (a first step) and the interlayer insulating film 609 is etched (a second step). At this time, the interlayer insulating film 602 is not etched by virtue of the plasma nitride layer 603.

Figure 33C:
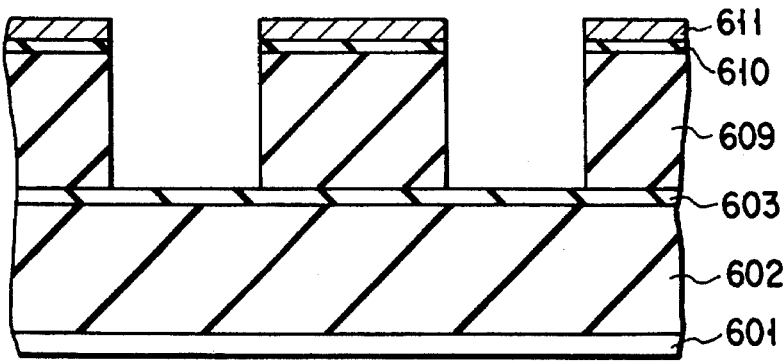
Figure 33D:
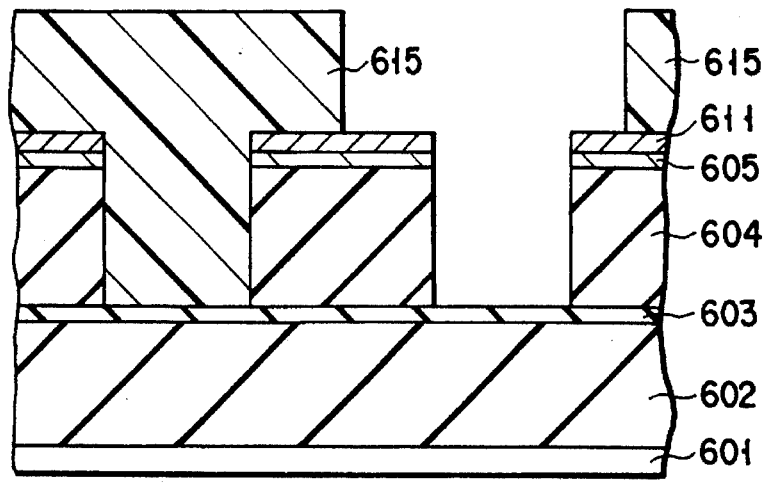

Thereafter, as shown in FIG. 33C, the resist pattern 612 is removed. It is advantageous to remove the resist pattern 612 by means of down-flow ashing or wet etching using a mixture solution of sulfuric acid and aqueous hydrogen peroxide. Then, as shown in FIG. 33D, a resist pattern 615 for forming a through-hole greater than the width of the wiring groove is formed.

Figure 33E:
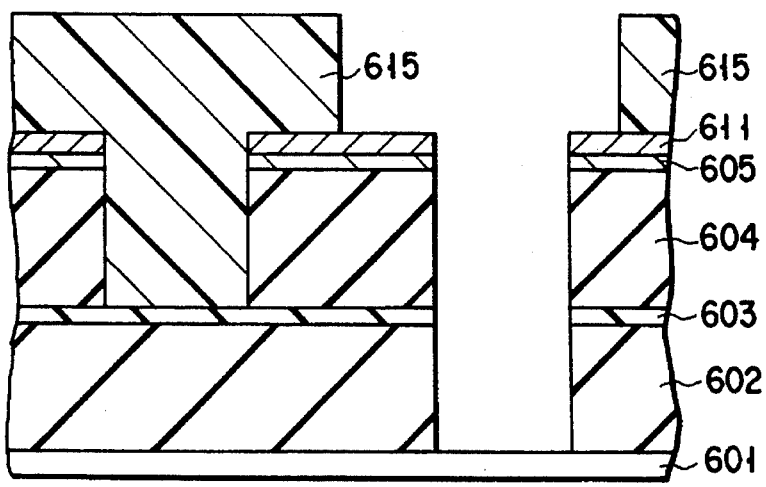
Figure 33F:
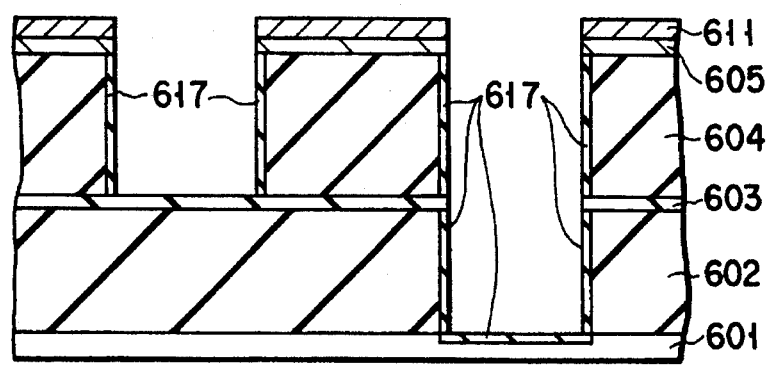

Furthermore, as shown in FIG. 33E, with the resist pattern 615 and stopper film 611 used as masks, the plasma nitride layer 603 and interlayer insulating film 602 are etched. In addition, as shown in FIG. 33F, after the resist pattern 615 is removed by down-flow ashing, etc., the resultant structure is heated to remove water or excess F from the wiring groove and side surface of the contact hole. Then, a plasma nitride layer 617 is formed in the wiring groove by nitrogen plasma treatment.

Figure 33G:
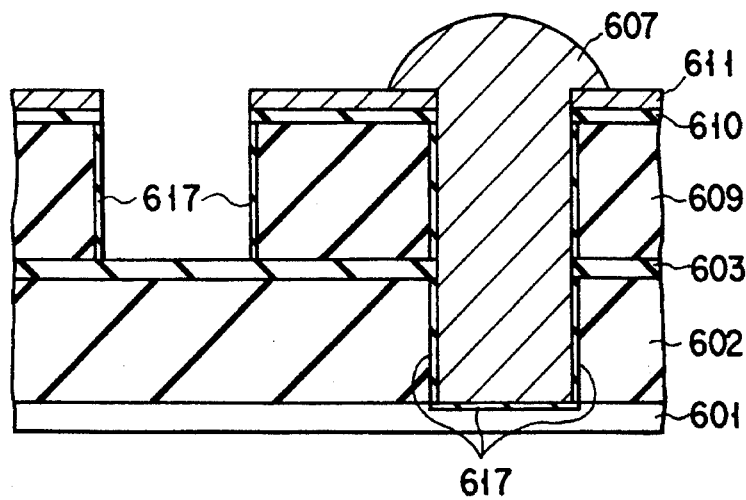

In the next step shown in FIG. 33G, a metal film 607 is selectively formed in the contact hole. An actual LSI includes a shallow contact hole and a deep contact hole. In the present embodiment, the metal film 607 is filled such that it overflows from the deep contact hole. The metal film 607 is, for example, a metal film of W, Cu, Al, Au or Ag. The metal film 607 may be replaced by an electrically conductive film such as a polysilicon film. Any kind of electrically conductive film may be used.

Figure 33H:
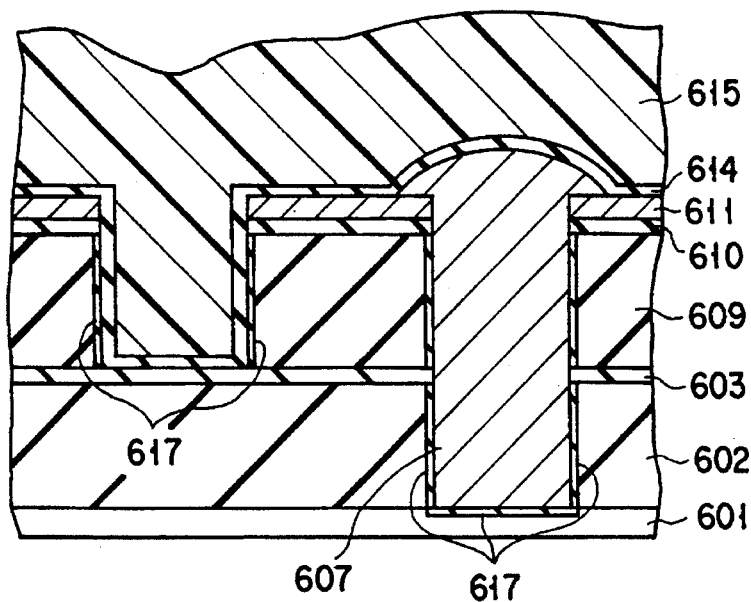
Figure 33I:
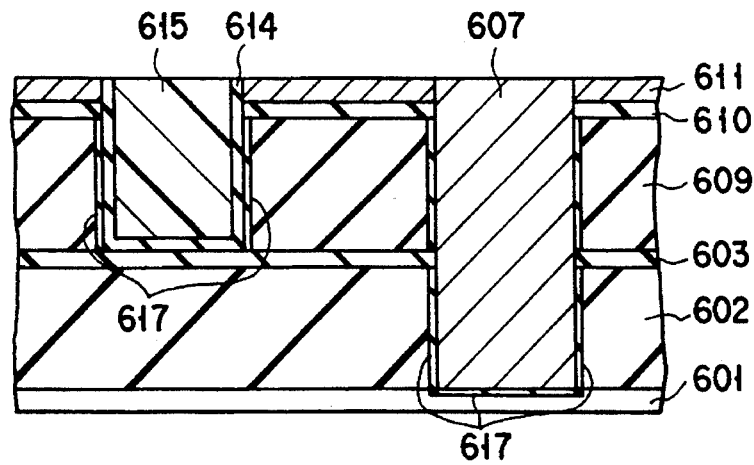

After a diffusion prevention film 614 is formed on the entire surface of the resultant structure, as shown in FIG. 33H, a wiring material film 615 made of, e.g. Au, Ag, Cu or an alloy of these is deposited. Thereafter, as shown in FIG. 33I, the wiring material film 615, diffusion prevention film 614 and the metal film 607, which are located outside the wiring region, are removed.

In the subsequent steps, like the process illustrated in FIG. 31I with respect to the preceding embodiment, the stopper film 611 is removed and a surface protection film 616 made of an insulating film is formed on the entire surface of the resultant structure. When wiring layers are laminated, as with the process of the preceding embodiment described with reference to FIG. 31M, the process from the formation of the insulating film on the Cu thin film is repeated.

EXAMPLE 19

FIGS. 34A to 34F are cross-sectional views showing steps of a buried wiring forming process according to a 19th embodiment of the present invention.

Figure 34A:
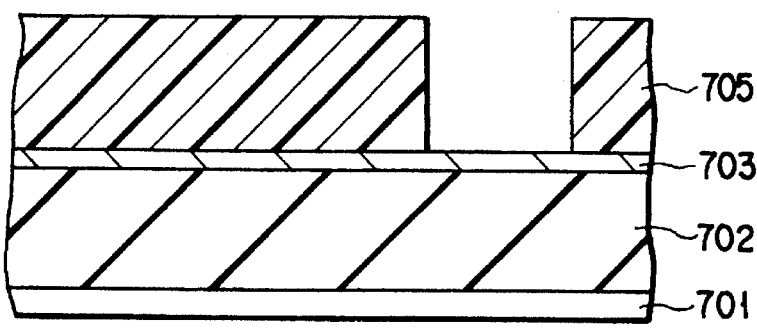

At first, as shown in FIG. 34A, an interlayer insulating film 702 is formed on a semiconductor substrate 701 on which a desired device (not shown) is formed, in the same manner as in the preceding embodiment. A plasma nitride layer 703 is formed on the surface of the interlayer insulating film 702 by nitrogen plasma treatment. Then, a resist pattern 705 for forming a contact hole is formed on the plasma nitride layer 703.

Figure 34B:
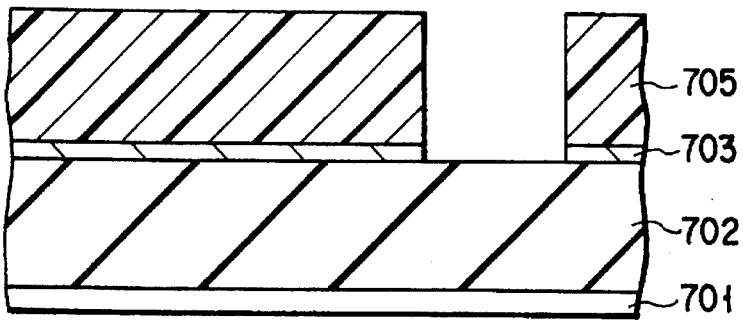
Figure 34C:
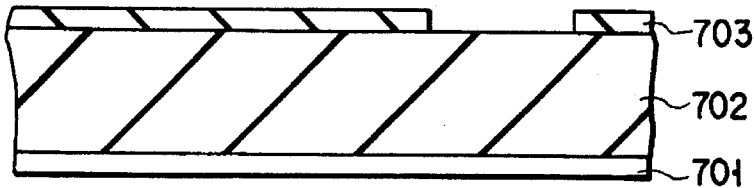
Figure 34D:
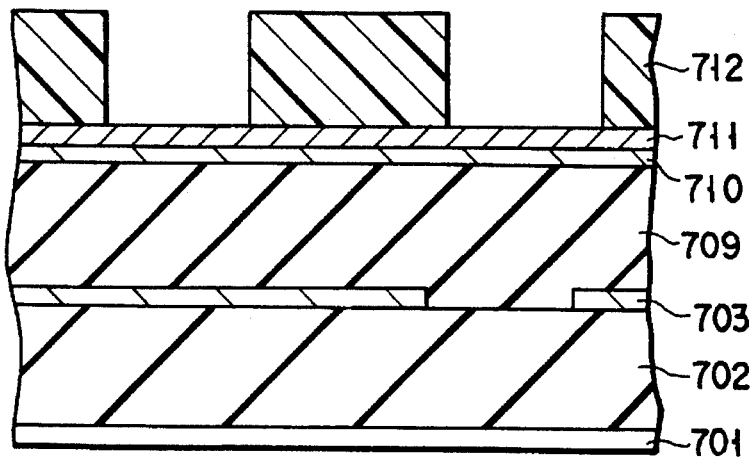

Subsequently, as shown in FIG. 34B, with the resist pattern 705 used as a mask, the plasma nitride layer 703 is etched. The resist pattern 705 is removed by $O_2$ ashing, as shown in FIG. 34C. Furthermore, as shown in FIG. 34D, an interlayer insulating layer 709 is formed on the entire surface of the resultant structure, and a plasma nitride layer 710 is formed on the surface of the interlayer insulating film 709. Then, a stopper film 711 made of, e.g. carbon is formed on the plasma nitride layer 710, and a resist pattern 712 for forming a wiring groove is formed on the stopper film 711.

Thereafter, as shown in FIG. 34E, with the resist pattern 712 used as a mask, two-step etching is carried out: the stopper film 711 and plasma nitride layer 710 are etched (a first step) and the interlayer insulating films 709 and 702 are etched (a second step). In the second-step etching, the plasma nitride layer 703 functions as a mask. At this time, in the wiring groove region, the interlayer insulating film 702 is not etched by virtue of the plasma nitride layer 703.

In the next step shown in FIG. 34F, the resist pattern 712 is removed. The resist pattern 712 is removed by down-flow ashing or wet etching using a mixture solution of sulfuric acid and aqueous hydrogen peroxide. Subsequently, the wiring groove and the side and bottom surfaces of the contact hole are heated to remove water and excess F. Then, a plasma nitride layer 717 is formed by nitrogen plasma treatment. The plasma nitride layer 717 can prevent water absorption of the interlayer insulating films 702 and 709.

The process of formation after this step is the same as the process of the 18th embodiment as illustrated in FIGS. 33G to 33I.

Figure 36:
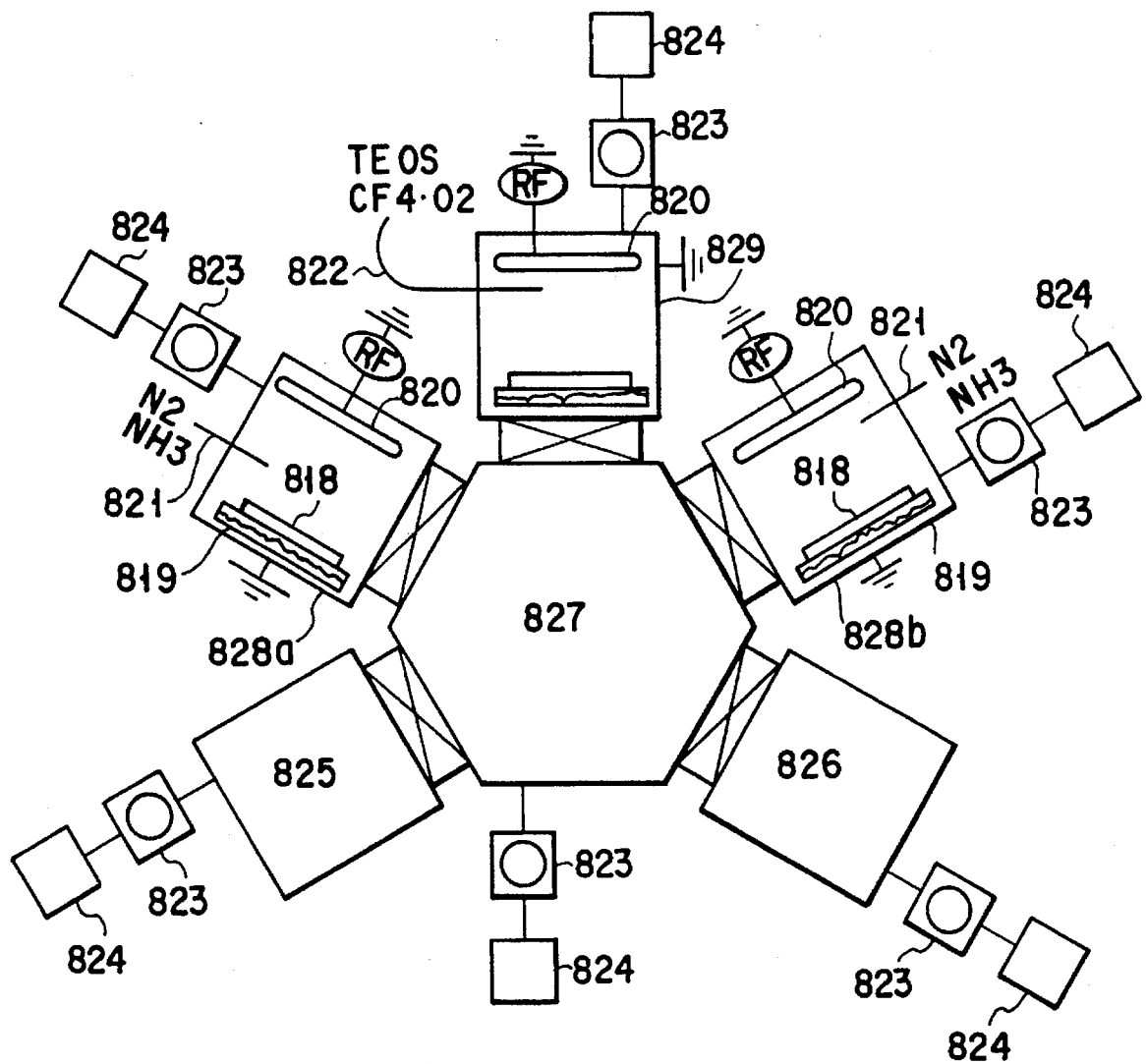
FIG. 36 shows another semiconductor device fabricating apparatus for use in the process of the present invention.

The formation of the insulating films and the nitrogen plasma treatment are advantageously performed with use of semiconductor device fabricating apparatuses as shown in FIGS. 35 and 36.

A semiconductor device fabricating apparatus as shown in FIG. 35 is generally constituted by five vacuum chambers, i.e. a load chamber 825, an unload chamber 826, a transfer chamber 827, a nitrogen plasma treatment chamber 828 and an insulating film forming chamber 829.

The vacuum chambers 825 to 829 are provided with a turbo molecule pump 823 and a dry pump 824. By these pumps, the pressures in the vacuum chambers 825 to 829 can be quickly set to desired degrees of vacuum.

The nitrogen plasma treatment chamber 828 and insulating film forming chamber 829 are provided with a plasma discharge electrode 820 and a susceptor 819 with a heater, respectively. The plasma discharge electrode 820 is connected to an RF power supply. The nitrogen plasma treatment chamber 828 is provided with a gas introducing nozzle 821 for introducing a material gas such as $N_2$ gas or $NH_3$ gas. The insulating film forming chamber 829 is provided with a gas introducing nozzle 822 for introducing a material gas such as TEOS gas, $CF_4$ gas or $O_2$ gas.

According to the semiconductor device fabricating apparatus with the above structure, at first, a wafer 818 is transferred from the load chamber 825 into a insulating film forming chamber 829 by an arm (not shown) provided in the transfer chamber 827. In the insulating film forming chamber 829, an insulating film is formed on the wafer 818.

Subsequently, the wafer 818 is transferred into the nitrogen plasma treatment chamber 828 by the arm (not shown) provided in the transfer chamber 827. In the nitrogen plasma treatment chamber 828, the surface of the insulating film formed on the wafer 818 is subjected to nitrogen plasma treatment and a plasma nitride layer is formed. Then, the wafer 818 is transferred into the unload chamber by the arm (not shown) provided in the transfer chamber 827. Thereafter, a new wafer is fed into the load chamber 825 and is subjected to the same treatment as described above.

By using the above semiconductor device fabricating apparatus, various films can be continuously formed without exposing the wafers to the outside atmosphere. In this example, after the insulating film is formed, the plasma nitride layer is formed. However, by using this semiconductor device fabricating apparatus, an insulating film of a sandwich structure can be formed.

A semiconductor device fabricating apparatus as shown in FIG. 36 differs from that shown in FIG. 35 in that two nitrogen plasma treatment chambers 828a and 828b are provided. With this structure, a higher through-put can be obtained than the apparatus shown in FIG. 35.

EXAMPLE 20

The method of preventing diffusion of wiring material by a plurality of barrier layers is applicable to a wiring structure having a projection on an upper part thereof. This embodiment (20th embodiment of the invention) will now be described with reference to FIGS. 37A to 37D or cross-sectional views showing steps of a process of fabricating this wiring structure.

Figure 37A:
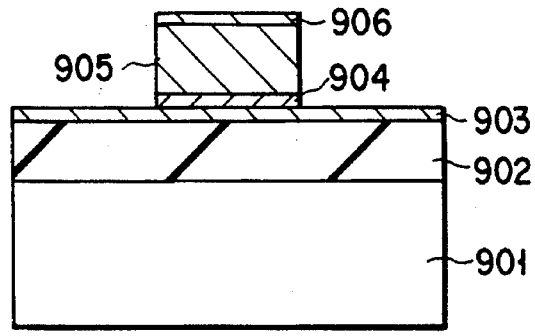
FIGS. 37A to 37D are cross-sectional views showing steps of a buried wiring forming process according to a 20th embodiment of the present invention.

At first, as shown in FIG. 37A, an interlayer insulating film 902 is deposited on a semiconductor substrate 901. A barrier layer 903 made of an insulating film is formed on the interlayer insulating film 902. The barrier layer 903 can be obtained by plasma-nitriding the surface of the interlayer insulating film 902. Then, a metal film which will become a barrier layer 904, a metal film which will become a wiring material film 905 and a metal film which will become a barrier layer 906 are deposited successively. These metal films are patterned to form wiring consisting of the metal barrier layer 904, wiring layer 905 and metal barrier layer 906.

Figure 37B:
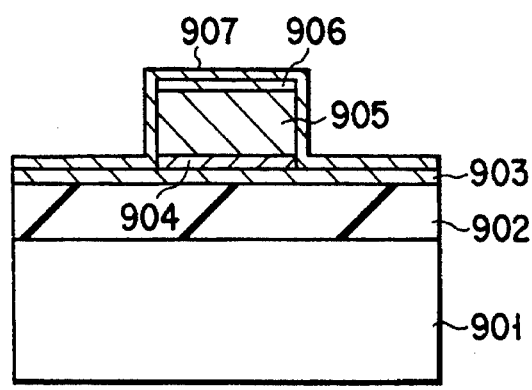
Figure 37C:
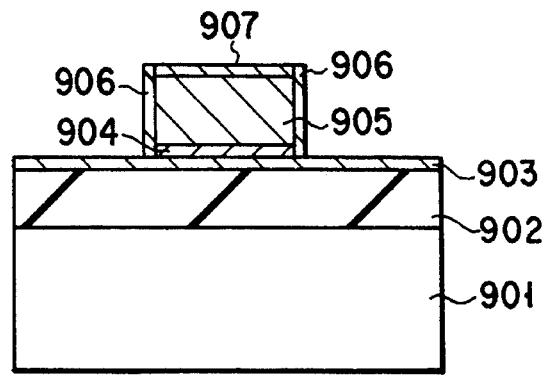
Figure 37D:
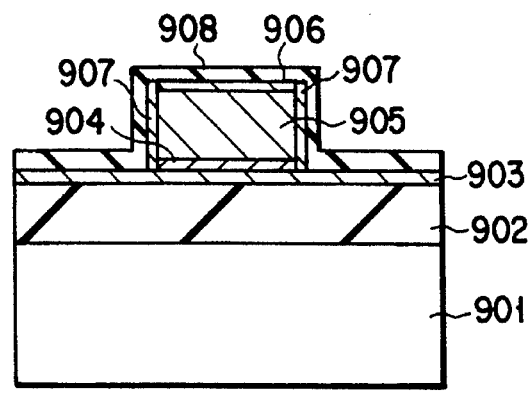

Subsequently, as shown in FIG. 37B, a metal barrier layer 907 is formed on the entire surface of the resultant structure such that side walls of the wiring can be coated with the metal barrier layer 907. Thereafter, as shown in FIG. 37C, the barrier layer 907 excluding the portion on the side walls of the wiring is removed by RIE. As a result, wiring having its bottom, top and sides coated with the metal barrier layers 904, 906 and 907 is formed. Lastly, as shown in FIG. 37D, the entire surface of the resultant structure is coated with a barrier layer 908 made of an insulating film. The barrier layer 908 may be made of an insulating film of $Si_xN_y$, $Si_xN_yO_z$, $Al_2O_3$, $MgO$, $ZrO_2$, $BeO$, $CaO$, etc.

According to this embodiment, wiring with a projection on its top surface can be coated with a plurality of barrier layers. However, if the barrier layer 903 is formed by plasma-nitriding, the metal barrier layer may be omitted. In this case, the step can be lowered, or the wiring can be thickened.

EXAMPLE 21

A plasma nitride layer can be used as an etching stopper for forming a through-hole even when normal projection-type wiring is formed. This embodiment (21th embodiment of the invention) will now be described with reference to FIGS. 38A to 38D or cross-sectional views illustrating manufacturing steps.

Figure 38A:
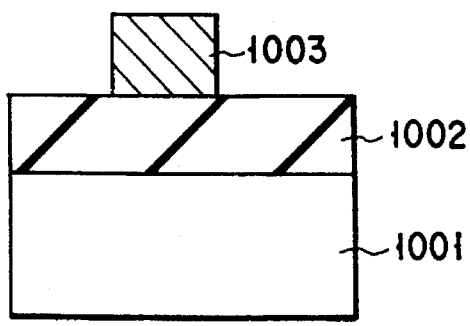
FIGS. 38A to 38D are cross-sectional views showing steps of a buried wiring forming process according to a 21st embodiment of the present invention.
Figure 38B:
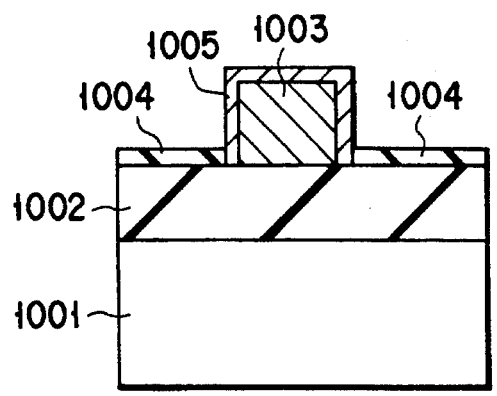

At first, as shown in FIG. 38A, an insulating film 1002 is formed on a semiconductor substrate 1001. Wiring 1003 is formed on the insulating film 1002. Subsequently, as shown in FIG. 38B, the entire surface of the wafer is subjected to plasma nitriding treatment, thereby forming plasma nitride layers 1004 and 1005 on the surface of the insulating film 1002 and the exposed surfaces (side and top surfaces) of the wiring 1003. The plasma nitride layer 1004 is an insulating film, while the plasma nitride layer 1005 remains conductive since it consists mainly of metal. In the case where heat treatment is performed in a subsequent step, the plasma nitride layer 1005 functions as a film for preventing occurrence of hillock.

Figure 38C:
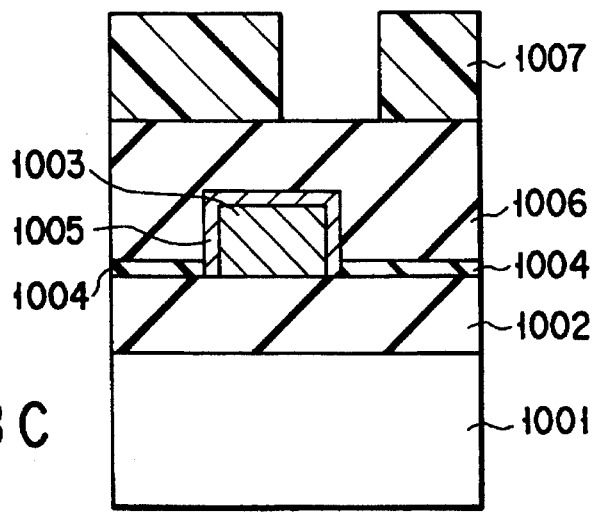

Subsequently, as shown in FIG. 38C, an interlayer insulating film 1006 is deposited on the entire surface of the resultant structure, and a resist pattern 1007 for forming a through-hole is formed on the interlayer insulating film 1006. At this time, as shown in FIG. 38C, the resist pattern 1007 is misaligned.

Figure 38D:
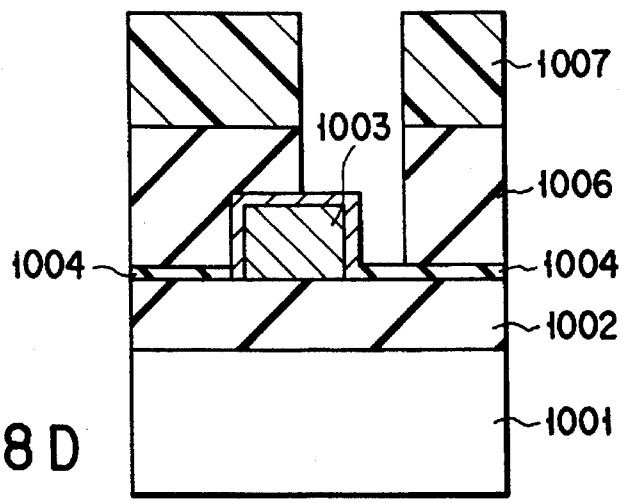

Lastly, as shown in FIG. 38D, with the resist pattern 1007 used as a mask, the interlayer insulating film 1006 is etched. Since the plasma nitride layer 1004 is present on the insulating film 1002, the insulating film 1002 is not etched despite the misalignment of the resist pattern 1007. Accordingly, a problem such as interlayer leakage can be prevented.

Furthermore, the present invention has the following modes:

1. A process of fabricating a semiconductor device, comprising the steps of:

forming a wiring groove in a surface portion of an insulating film; selectively depositing a wiring material on the bottom surface of said wiring groove and a surface portion of the insulating film excluding said wiring groove, thereby forming a wiring material film having a thickness less than the depth of the wiring groove; forming a protection film on the entire surface of the resultant structure; and selectively removing said wiring material film formed on the surface of the insulating film excluding the wiring groove and said protection film.

According to this process, a wiring material is deposited selectively on bottom surface of the wiring groove and the surface of the insulating film excluding the wiring groove (hereinafter, such selective deposition is referred to as anisotropic deposition), thereby forming a wiring material film having a thickness less than the depth of the wiring groove. Thus, the wiring material film is completely divided into a portion located within the wiring groove and a portion located outside the wiring groove. For example, if polishing is performed to remove the wiring material film and the protection film, the wiring material film located outside the wiring groove and the protection film are first removed. By a single removing step, buried wiring having the surface coated with the protection film can be formed, and highly reliable wiring can be obtained without increasing the number of steps.

2. A process of fabricating a semiconductor device, comprising the steps of:

forming a wiring groove in a surface portion of an insulating film; denaturing said insulating film at a side wall portion and a bottom of said wiring groove, thereby forming a first protection film; selectively depositing a wiring material on the bottom surface of said wiring groove and a surface portion of the insulating film excluding said wiring groove, thereby forming a wiring material film having a thickness less than the depth of the wiring groove; forming a second protection film on the entire surface of the resultant structure; and selectively removing said wiring material film formed on the surface of the insulating film excluding the wiring groove and said second protection film.

According to this process, in addition to the advantageous effects of the above process 1, the following advantages can be obtained. In this process, the protection film (first protection film) is formed on the side wall and bottom of the wiring groove. Thus, the protection for the wiring material film is ensured. In addition, the protection films are formed by denaturing the side wall and bottom of the wiring groove. Thus, as compared to the formation of a film by CVD or sputtering, the degree of narrowing of the wiring groove is smaller and an increase in wiring resistance can be prevented.

Moreover, for example, if an etching-proof film, which is less easily polished than the wiring material film and the second protection film, is used, a decrease in thickness of the insulating film can be prevented when the wiring material film and the second protection film are selectively removed.

3. A process of fabricating a semiconductor device, comprising the steps of:

forming on a first insulating film a second insulating film; forming an etching-proof film on said second insulating film; etching said etching-proof film and said second insulating film, thereby forming a wiring groove in said second insulating film; forming on a region of the wiring groove a resist pattern for forming a through-hole having an opening dimension in the width direction of the wiring groove which is greater than the width of the wiring groove; etching said first insulating film with said resist pattern and said etching-proof film as masks, thereby forming the through-hole; and burying a wiring material in said wiring groove and in said through-hole.

According to this process, in addition to the operational effects obtained by the process 1, the following effects can be obtained. In this process, the resist pattern used for forming the through-hole has an opening dimension in the width direction of the wiring groove which is greater than the width of the wiring groove. Thus, it is possible to prevent the resist pattern from covering the wiring groove. Even if the resist pattern having a large opening width is used, a stopper film is also used as a mask along with the resist pattern and therefore a through-hole having the same width as the wiring groove, and not a wider through-hole corresponding to the width of the resist pattern, can be obtained. Accordingly, there is no such prior-art problem that a part of a through-hole forms outside the wiring groove and the reliability deteriorates.

4. A semiconductor device comprising: an insulating film formed on an underlayer with a stepped portion, having a flat surface and having a wiring groove in a surface portion thereof; a plurality of openings with different depths, formed in said insulating film so as to extend from said wiring groove to said underlayer; a plurality of contact layers buried in said openings with an equal thickness; and a wiring layer having a resistance lower than that of the contact layers, formed on the contact layers in said openings, and buried in said wiring groove.

5. A semiconductor device comprising: an insulating film formed on an underlayer with a stepped portion, having a flat surface and having a wiring groove in a surface portion thereof; a plurality of openings with different depths, formed in said insulating film so as to extend from said wiring groove to said underlayer; a plurality of contact layers buried in said openings with an equal thickness; wiring layer having a resistance lower than that of the contact layers, formed on the contact layers in said openings, and buried in said wiring groove; and diffusion prevention layers for preventing diffusion of constituent substance of said wiring layer, the diffusion prevention layers being formed between said insulating film and said wiring layer and between each contact layer and said wiring layer.

According to the semiconductor devices 4 and 5, after the contact layer is formed to a midpoint of the opening, a wiring layer which will become wiring is formed on the entire surface of the resultant structure and the entire surface of the wiring layer is etched (or polished). Thereby, buried wiring with a flat surface is obtained. Accordingly, an interlayer insulating film to be formed in a subsequent step can be easily flattened. Furthermore, in the case of these semiconductor devices, the height of all contact layers is the same and the resistance of the wiring is lower than that of the contact layers. Thus, the same resistance within the openings and the same reliability can be obtained.

6. A semiconductor device comprising: a first insulating film having a through-hole and a conductive layer in said through-hole; a second insulating film formed on said first insulating film, having a wiring groove reaching the surface of said conductive layer, and having a wiring-layer in said wiring groove; a nitride film of a material constituting said conductor layer formed on the surface of the conductive layer at the bottom of said wiring groove; and an insulating film including nitrogen and formed on a side surface of said wiring groove.

7. A process of fabricating a semiconductor device, comprising the steps of:

forming a through-hole in a first insulating film; forming a conductive layer in said through-hole; forming a second insulating film on said first insulating film; forming a wiring groove in said second insulating film so as to reach the surface of the conductive-layer; nitriding the surface of the conductive layer at the bottom of said wiring groove and the side surface of said wiring groove in a plasma atmosphere including nitrogen; and forming a wiring layer in said wiring groove.

According to the semiconductor device 6 and the process 7, since the insulating film including nitrogen is formed on the side portion of the wiring groove, the plasma nitride film can prevent the second insulating film from absorbing water. In addition, it is better to form the insulating film including nitrogen by denaturing the insulating film and the surface of the conductive layer (in the plasma atmosphere including nitrogen). In this case, there is no such problem that the width of the wiring groove decreases, which occurs when a nitride film is formed by CVD or sputtering. Furthermore, since the nitrogen-containing insulating film prevents the insulating film from absorbing water, there is no need to adopt a "sandwich" structure using a non-doped insulating film, as in the prior art. The capacitance of the entire insulating film does not increase.

Furthermore, since the nitrogen-containing insulating film functions as a diffusion barrier, it is possible to prevent the constituent atoms of the wiring layer from diffusing into the conductive layer or second insulating film. Therefore, according to these structures, the water absorption of the insulating film can be prevented without increasing capacitance. Besides, diffusion of constituent atoms of the wiring layer can be prevented, and the reliability can be enhanced.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising:

a semiconductor substrate in which a semiconductor element is formed, an interlayer insulating film formed on said semiconductor substrate;

an insulating barrier layer, formed on said interlayer insulating film and having a thickness of 1 to 100 nm, for preventing diffusion of a metal contained in a wiring layer;

a conductive barrier layer, formed on said insulating barrier layer, for preventing diffusion of said metal; and a wiring layer containing said metal on said conductive barrier layer, said conductive barrier layer extending to cover a side surface of said wiring layer, and said insulating barrier layer extending to cover that portion of said conductive barrier layer which covers the side surface of said wiring layer.

2. The semiconductor device according to claim 1, wherein said insulating barrier layer is a denatured layer obtained by plasma-nitriding a surface of said interlayer insulating film.

3. The semiconductor device according to claim 2, wherein said denatured layer contains $Si_xN_yO_z$ (x, y, and z are positive numbers).

4. The semiconductor device according to claim 1, wherein said conductive barrier layer contains a member selected from the group consisting of Al, Ti, TiN, Nb, W, a lamination of layers of at least two of these members, and an alloy of at least two of these members.

5. A semiconductor device comprising:

a semiconductor substrate in which a semiconductor element is formed;

an interlayer insulating film formed on said semiconductor substrate;

a first insulating barrier layer, formed on said interlayer insulating film, for preventing diffusion of a metal contained in a wiring layer;

a first conductive barrier layer, formed on said insulating barrier layer, for preventing diffusion of said metal;

a wiring layer containing said metal on said conductive barrier layer;

a second conductive barrier layer, formed on side and top surfaces of said wiring layer, for preventing diffusion of said metal; and a second insulating barrier layer, formed on said second conductive barrier layer, for preventing diffusion of said metal.

* * * * *